(12) United States Patent
Nakagawa et al.

(10) Patent No.: US 7,730,610 B2
(45) Date of Patent: Jun. 8, 2010

(54) METHOD OF MOUNTING ELECTRONIC CIRCUIT CONSTITUTING MEMBER AND RELEVANT MOUNTING APPARATUS

(75) Inventors: Tohru Nakagawa, Shiga (JP); Hideo Torii, Osaka (JP)

(73) Assignee: Panasonic Corporation, Osaka (JP)

( * ) Notice: Subject to any disclaimer, the term of this patent is extended or adjusted under 35 U.S.C. 154(b) by 133 days.

(21) Appl. No.: 12/088,194

(22) PCT Filed: Sep. 29, 2006

(86) PCT No.: PCT/JP2006/319486

§ 371 (c)(1),
(2), (4) Date: Mar. 26, 2008

(87) PCT Pub. No.: WO2007/037381

PCT Pub. Date: May 4, 2007

(65) Prior Publication Data

US 2009/0265929 A1   Oct. 29, 2009

(30) Foreign Application Priority Data

Sep. 29, 2005  (JP)  ............................. 2005-284329
Feb. 27, 2006  (JP)  ............................. 2006-051066

(51) Int. Cl.
  *H05K 3/20*  (2006.01)
  *H05K 3/30*  (2006.01)
(52) U.S. Cl. ............................. 29/831; 29/832; 29/834
(58) Field of Classification Search .................. 29/832, 29/831, 834; 438/106, 107, 125, 126
See application file for complete search history.

(56) References Cited

U.S. PATENT DOCUMENTS

| 6,266,872 B1 * | 7/2001 | Fjelstad ........................ 29/832 |
| 6,417,025 B1 * | 7/2002 | Gengel ........................ 438/107 |
| 6,507,989 B1 * | 1/2003 | Bowden et al. ............. 29/592.1 |

(Continued)

FOREIGN PATENT DOCUMENTS

CN   1639841 A   7/2005

(Continued)

OTHER PUBLICATIONS

Drobac, S. "Fluidic Self-Assembly Could Change the Way FPDs Are Made", Information Display, 1999, pp. 12-16.

(Continued)

*Primary Examiner*—Derris H Banks
*Assistant Examiner*—David P Angwin
(74) *Attorney, Agent, or Firm*—Hamre, Schumann, Mueller & Larson, P.C.

(57) ABSTRACT

A mounting method comprising the steps of (A) disposing first liquid (2) on first region (11) provided on one principal surface of substrate (1); (B) bringing member-containing liquid (5) containing second liquid (3) and at least one member (4) into contact with the first liquid (2) disposed on the first region (11); and (C) removing the first liquid (2) and the second liquid (3) from the one principal surface to thereby dispose the member (4) on the first region (11). The first liquid (2) is substantially not dissolved in the second liquid (3). The wettability of the first liquid (2) with respect to the surface of the member (4) is higher than that of the second liquid (3).

4 Claims, 39 Drawing Sheets

U.S. PATENT DOCUMENTS

| | | | |
|---|---|---|---|
| 6,872,645 B2* | 3/2005 | Duan et al. | 438/584 |
| 6,969,690 B2* | 11/2005 | Zhou et al. | 438/787 |
| 2002/0073536 A1* | 6/2002 | Okuda et al. | 29/740 |
| 2002/0151111 A1* | 10/2002 | DiStefano et al. | 438/123 |
| 2004/0009683 A1* | 1/2004 | Hiraoka et al. | 439/75 |
| 2004/0217003 A1* | 11/2004 | Haba et al. | 204/471 |
| 2004/0240109 A1* | 12/2004 | Hamann et al. | 360/126 |
| 2005/0070092 A1* | 3/2005 | Kirby | 438/637 |
| 2005/0164485 A1* | 7/2005 | Onozawa | 438/616 |
| 2006/0011712 A1* | 1/2006 | Oggioni | 228/254 |

FOREIGN PATENT DOCUMENTS

| | | |
|---|---|---|
| JP | 2003-005212 A | 1/2003 |
| JP | 2005-209939 A | 8/2005 |
| JP | 2005-229042 A | 8/2005 |
| JP | 2006-113258 A | 4/2006 |
| WO | WO 03/081974 A | 10/2003 |

OTHER PUBLICATIONS

Wang, D. et al. "Germanium nanowire field-effect transistors with $SiO_2$ and high-κ $HfO_2$ gate dielectrics", Applied Physics Letters, vol. 83, No. 12, Sep. 22, 2003, pp. 2432-2434.

Huang, Y. et al. "Directed Assembly of One-Dimensional Nanostructures into Functional Networks", Science, vol. 291, Jan. 26, 2001, pp. 630-633.

Lienemann, J. et al. "Modeling, Simulation, and Experimentation of a Promising New Packaging Technology: Parallel Fluidic Self-Assembly of Microdevices", Sensor Update, vol. 13, 2004, pp. 3-43.

Srinivasan et al., "Microstructure to Substrate Self-Assembly Using Capillary Forces", Journal of Microelectromechanical Systems, vol. 10, No. 1, Mar. 2001, pp. 17-24.

Scott et al., "High-Performance Inductors Using Capillary Based Fluidic Self-Assembly", Joural of Microelectromechanical Systems, vol. 13, No. 2, Apr. 2004, pp. 300-309.

* cited by examiner (c)

(d)

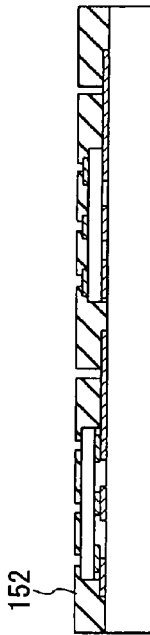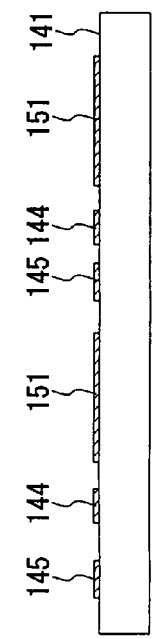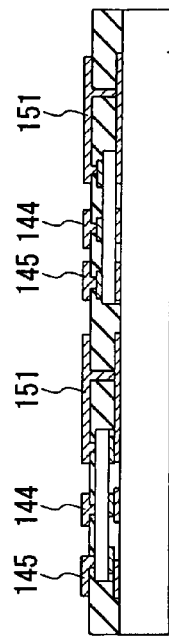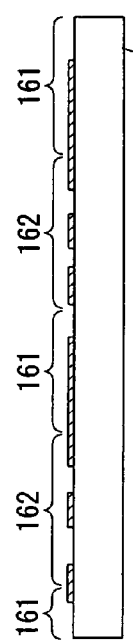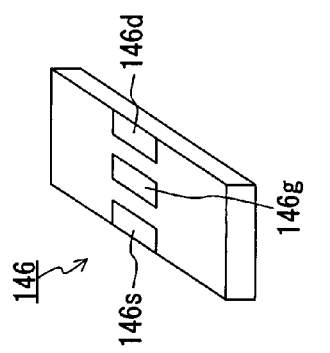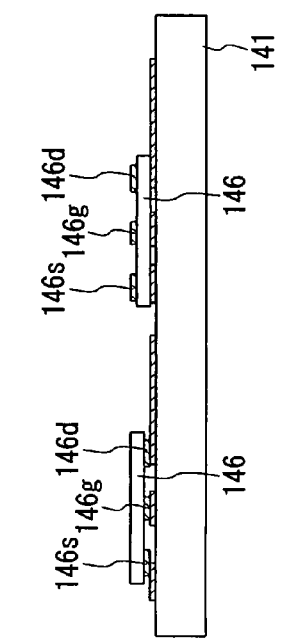

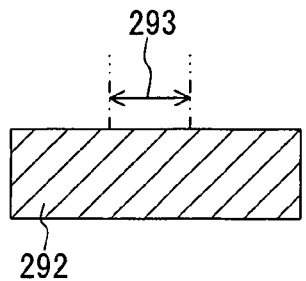 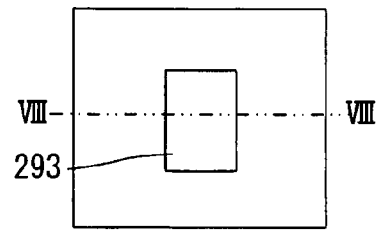
FIG. 31A
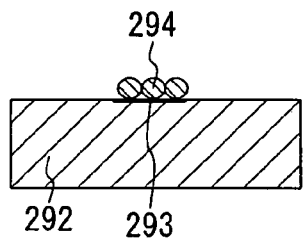 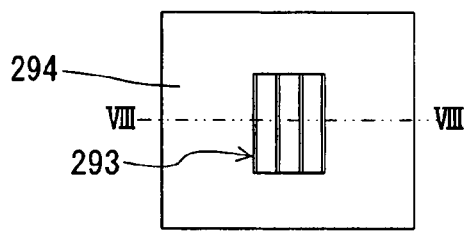
FIG. 31B
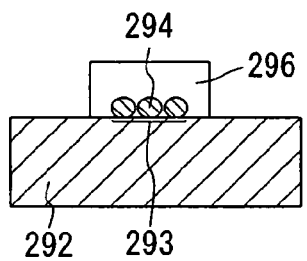 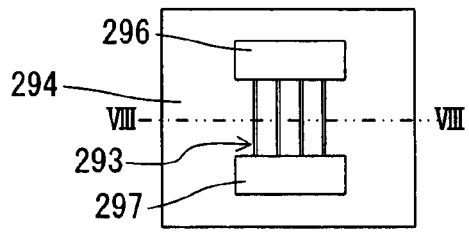
FIG. 31C
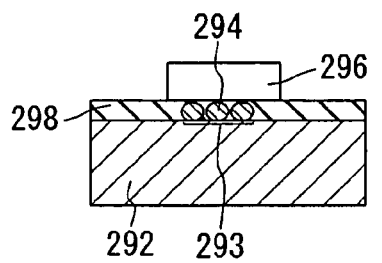 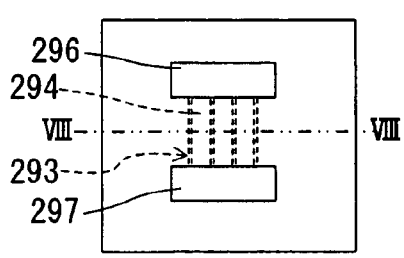
FIG. 31D
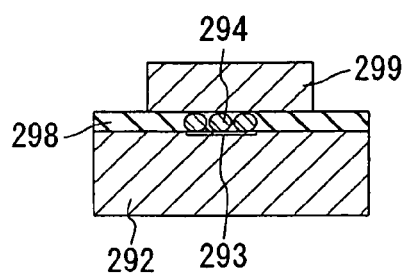 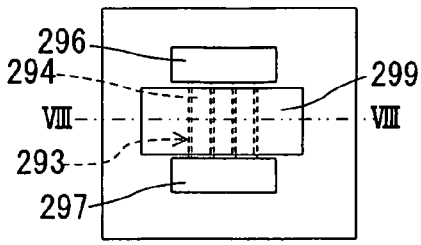
FIG. 31E

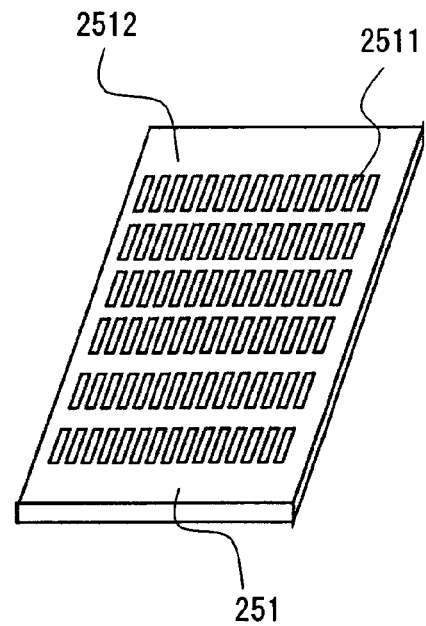
FIG. 36A
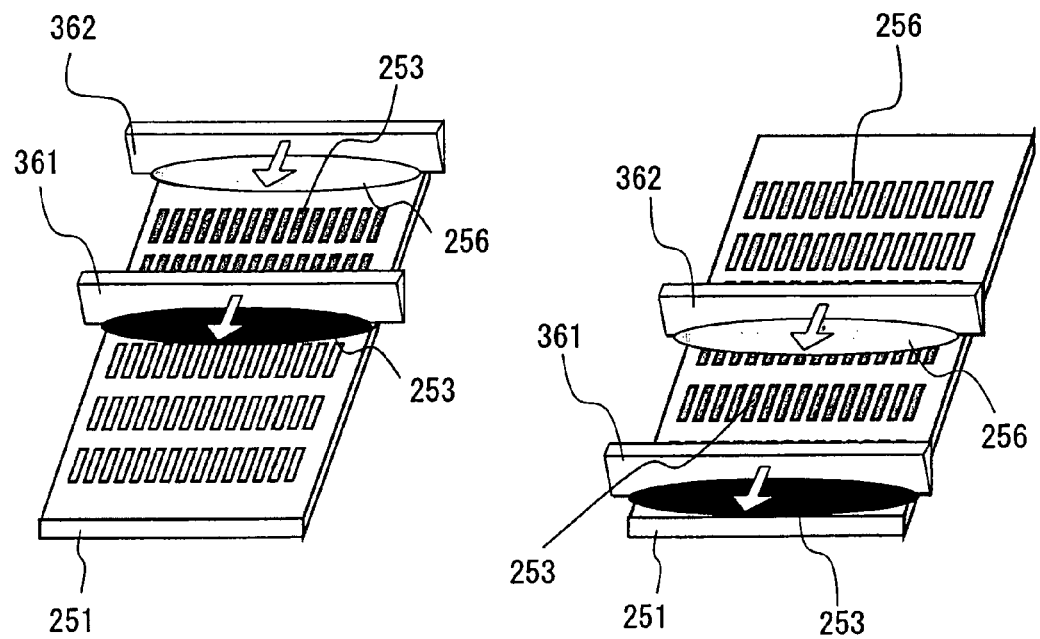
FIG. 36B
FIG. 36C

METHOD OF MOUNTING ELECTRONIC CIRCUIT CONSTITUTING MEMBER AND RELEVANT MOUNTING APPARATUS

TECHNICAL FIELD

The present invention relates to a method and apparatus for mounting electronic circuit-constituting members.

BACKGROUND ART

Active-matrix liquid crystal display elements and organic electroluminescence display elements are formed on a glass substrate. The pixels disposed in a matrix on the substrate are controlled by the transistors provided in the vicinity of the pixels. With current technology, however, crystalline semiconductor transistors cannot be formed on the glass substrate, and for this reason thin film transistors formed of an amorphous silicon or polysilicon thin film have been used for the control of the pixels. The thin film transistor has the advantage that it can be formed on a large-area substrate at low cost; however, its smaller mobility compared with crystalline silicon has prevented them from operating at high speed. To overcome such a problem, there have been proposed techniques in which the transistors first are fabricated on a silicon wafer in a large quantity and then cut into individual pieces to be disposed on a substrate.

For example, there has been proposed a technique in which openings for accepting the transistors are formed through a substrate, which then is exposed to a liquid containing monocrystalline silicon transistors dispersed therein so that the transistors are disposed in the openings (see U.S. Pat. No. 6,417,025, Information Display, p. 12-16, 1999). By forming the openings in the shape that matches that of the transistors, the transistors are disposed in a predetermined orientation at predetermined positions on the substrate. As taught in these publications, this technique allows 10,000 transistors, having a size of ten to several hundred micrometers, to be disposed on a substrate measuring 3 inch$^2$.

Further, a fabrication method of a liquid crystal display element in which large numbers of monocrystalline silicon transistors are disposed on a glass substrate has been disclosed (see JP2003-5212A). In this method, a rubber polymer thin film with openings that fit the monocrystalline silicon transistors is formed on a glass substrate, and the glass substrate is exposed to a liquid in which the monocrystalline silicon transistors are dispersed, so that the transistors are disposed on the glass substrate. Providing the openings in the glass substrate requires expensive equipment such as a laser processing device. With this method, however, the openings are not formed directly through the substrate and the transistors can be placed with simple equipment.

There also has been proposed a method in which a substrate having a first mating surface is dispersed in a liquid together with members having a second mating surface of the shape that substantially matches the shape of the first mating surface. By system design, the free energy of the dispersion liquid is minimized in the state where these two mating surfaces are mated to each other, so as to dispose the members on the substrate (see U.S. Pat. No. 6,507,989). For example, a region in a substrate surface is rendered water-repellent to provide the first mating surface, and the other regions in a substrate surface are rendered hydrophilic. In the same manner, one of the surfaces of each member to be disposed on the substrate is rendered water-repellent to provide the second mating surface, and the remaining surfaces of the member, other than the second mating surface, are rendered hydrophilic. Thereafter, an appropriate amount of water-repellent ultraviolet (UV) curable resin is applied to both the first and second mating surfaces, and the substrate and the members are placed in water. By agitation, the first mating surface of the substrate and the second mating surface of the member are joined together via the UV curable resin. By irradiation of the substrate with UV light in water, the resin is cured to fasten the first mating surface of the substrate firmly to the second mating surface of the member. A method also is disclosed in which hexadecane is applied instead of the UV curable resin to the first and second mating surfaces, and the substrate on which the members have been disposed is taken out of water and heated to remove the hexadecane and thereby fasten the first mating surface of the substrate to the second mating surface of each member (Journal of Microelectromechanical Systems, Vol. 10, No 1, 2001).

Meanwhile, with the recent advance in nanotechnology, various ideas have been put forth and research and development has been active on electronic devices using pillar-like members having a diameter smaller than several hundred nanometers (may be referred to as "nanomembers" hereinafter). The pillar-like nanomembers include needle-like nanoparticles, for example, such as carbon nanotubes and semiconductor nanowires. An application of such nanomembers as the constituting members of an electronic circuit (may be referred to simply as "members" hereinafter) is described, for example, by D. Wang, et al., "Germanium nanowire field-effect transistors with $SiO_2$ and high-k $HfO_2$ gate dielectric", Appl. Phys. Lett. Vol. 83, pp. 2432, 2003, which describes operations of field-effect transistors (FETs) with semiconductor nanowires at ordinary temperature. The field-effect transistors using such nanomembers are fabricated by a coating technique, and as such the fabrication does not require techniques using various kinds of large-scale vacuum equipment as required in conventional thin film techniques. Conceivably, the technique disclosed in this publication has many advantages, including cost reduction.

In order to realize transistor characteristics using nanomembers, the nanomembers need to be disposed in predetermined microscopic regions in a uniaxial orientation. This is necessary because field-effect transistors can be realized by forming a source electrode and a drain electrode at both ends of each pillar-like nanomember respectively. The nanomember has been disposed in a uniaxial orientation. Therefore, one of the big challenges, in order to fabricate the field-effect transistors of a coating type using nanomembers, is the precise control of the orientation and position of the nanomembers in mounting the nanomembers on the substrate. For example, as a method of controlling the orientation and position of the nanomembers, there has been reported a method in which a mold made of polydimethylsiloxane (PDMS) with large numbers of grooves is brought into contact with a substrate surface to form channels for flowing a liquid, and a liquid in which the nanomembers are dispersed flows through the channels to coat the substrate with pillar-like nanomembers in a particular orientation (referred to as "flow method" hereinafter) (see U.S. Pat. No. 6,872,645, Y. Huang, et al., "Directed Assembly of One-Dimensional Nanostructures into Functional Networks," Science vol. 291, pp. 630, 2001). Further, for example, there has been a report in which a suspension of nanomembers whose surfaces have been rendered hydrophilic by chemical modification is prepared and a substrate whose surface partially has been rendered hydrophilic is brought into contact with the suspension and then separated therefrom to dispose the nanomembers in a certain but limited orientation on the hydrophilic portion of the substrate, by utilizing the liquid/solid/gas interfaces between the substrate, suspension, and atmosphere (see U.S. Pat. No. 6,969,690). As a method of removing the suspension from the substrate, a method has been proposed in which the substrate partially is immersed in the suspension and the solvent of the suspension gradually is evaporated.

The conventional technique in which the substrate is exposed to a transistor-dispersed liquid to set the transistors in the openings of the substrate works under the principle that the transistors that have approached the openings fall therein by the force of gravity when the transistors have the shape that fit the openings. As such, the probability that the transistors in the vicinity of the openings fall into the openings is not 100%. This probability becomes even smaller as the size of the transistors is reduced, because the surface tension that acts on the element surface or the force of liquid flow will increase to be more than the gravitational force acting on the elements. This necessitates that the transistors in the dispersion liquid be provided in greater numbers than the numbers needed for the substrate. Thus, fabrication of a single display element conventionally required greater numbers of transistors than the numbers of transistors actually needed. This has posed the problem of high manufacturing cost. Further, because whether the transistors will fall in the openings is a question of probability, the probability of having an opening with no transistor will not be zero even when the substrate is exposed to the dispersion solution for extended time periods. This necessitated checking for empty openings, requiring additional fabrication steps.

As to the conventional method in which a liquid is disposed on the respective predetermined surfaces (mating surfaces) of the substrate and the member to join the substrate and member at these predetermined mating surfaces in a dispersion liquid (dispersion medium), the method provides an excellent way to dispose the members on the substrate. However, it has difficulties in controlling the amount of liquid disposed on the mating surfaces (Sensor Update, Vol. 13, P3, 2004). Specifically, when the amount of liquid is too small, the contact surface between the substrate and the member will not be completely covered with the liquid and the adhesion is weak. On the other hand, when the amount of liquid is too large, the members will float on the liquid surface and move around, causing a problem that the members will detach from the liquid even with little stirring. Another drawback of this method is the low dispersibility of the members to the dispersion medium due to the two kinds of member surfaces with dissimilar properties (water-repellent mating surface and the hydrophilic surface in the remaining portion). This causes a problem that the members will adhere to the air/liquid interface of the dispersion medium, or agglomerate. This tendency is more pronounced when the members are small. Further, with nano-scale members, it is technically difficult to provide different wettability to different portions of the surface. This has made the placement of the nano-scale members on a substrate difficult. Further, in the conventional examples, the liquids placed on the mating surfaces are all hydrophobic. The adhesion between the substrate and the member is determined by the surface tension of the liquid placed on these surfaces. However, hydrophobic liquids have lower surface tensions compared with hydrophilic liquids such as water and there is only a weak force that binds the substrate and the member together. For this reason, when the substrate with the disposed members is taken out of the dispersion liquid, there are cases where the members come off the substrate (Journal of Microelectromechanical Systems, Vol 10, No 1, 2001).

When the conventional flow method is used to control the orientation and position of the pillar-like nanomembers in mounting these members on a substrate, there are difficulties in stably orienting and positioning the members. Further, since this method uses a mold that regulates the direction of a liquid flow, it requires complicated fabrication steps and therefore complex equipment. Because of this, the method has the problem of high manufacturing cost and poor reproducibility. Further, accurate orientation of the nanomembers is difficult to achieve with the conventional method utilizing the liquid/solid/gas interface. The method also requires strict control in the step of removing the suspension from the substrate. The method therefore requires complex equipment, which poses the problem of high manufacturing cost and poor reproducibility.

DISCLOSURE OF THE INVENTION

Under these circumstances, an object of the present invention is to provide a novel method and apparatus for accurately mounting electronic circuit-constituting members on a predetermined position of a substrate with good reproducibility, when these members, such as component chips and nanomembers are mounted on the substrate.

A mounting method of electronic circuit-constituting members according to the present invention is a method for mounting constituting members of an electronic circuit on a substrate, and includes the steps of:

(A) disposing a first liquid in a first region provided on one principal surface of the substrate;

(B) bringing a member-containing liquid including a second liquid and at least one of the electronic circuit-constituting members into contact with the first liquid disposed in the first region; and (C) removing the first liquid and the second liquid from the one principal surface so as to dispose the at least one of the electronic circuit-constituting members in the first region, wherein the first liquid is substantially undissolvable in the second liquid, and has better wettability than the second liquid with respect to surfaces of the electronic circuit-constituting members.

A mounting apparatus for mounting an electronic circuit-constituting member on a substrate according to the present invention is an apparatus for mounting a constituting member of an electronic circuit on a substrate, and includes:

(I) means for supplying a vapor of a first liquid to one principal surface of the substrate;

(II) means for supplying a member-containing liquid including a second liquid and the electronic circuit-constituting member to the one principal surface of the substrate; and (III) means for removing the first liquid and the second liquid from the one principal surface of the substrate.

In this specification, the term "mount" is intended to encompass "packaging," and the meaning of the term includes disposing electronic components as well as members on a substrate.

With a method and apparatus for mounting electronic circuit-constituting members according to the present invention, the members constituting an electronic circuit can be mounted in a predetermined region with a high probability. For example, when the mounted members are component chips including electronic devices, a mounting method of the present invention can be used to mount the component chips without using excess numbers of component chips as conventionally required, and the step of inspecting whether the component chips have been mounted can be simplified or omitted. Further, when a mounting method of the present invention is used to mount the component chips, the component chips can be mounted without the conventional step of forming openings in the substrate to place the component chips. When the members are micro scale pillar-like members, the members can be mounted without resorting to a liquid flow or requiring strict control of the liquid/solid/gas interface created between the liquid and the substrate on which the members are disposed. This reduces the number of steps and simplifies the equipment, thereby reducing the manufacturing cost. Further, since a mounting method and mounting apparatus of the present invention can mount the members in a predetermined region with good reproducibility, fewer members are needed for the mount procedure.

Further, according to a mounting method of the present invention, the surfaces of the member do not have notably dissimilar properties to each other, for example, such as water-repellent and hydrophilic properties. Thus, even when the members are small, it is unlikely that the members will adhere to the air/liquid interface of the second liquid or agglomerate. This enables the members to be desirably dispersed in the second liquid used as a dispersion medium. Further, according to a mounting method of the present invention, the first liquid has better wettability than the second liquid with respect to the member surface. This enables the members to stay more stably in a region of the first liquid than in the second liquid, making it possible to fasten the members to the first region of the substrate without strictly controlling the amount of the first liquid, which would otherwise be necessary to avoid problems such as poor adhesion between the members and the substrate, and the members coming off the substrate. Further, with a mounting method of the present invention, the properties of the members need not be controlled for each member surface. The method is therefore applicable to members of a small size (for example, members with the longest side having a length of 100 µm or less).

Further, without being limited to the component chips and pillar-like members, a mounting method and mounting apparatus of the present invention can be used to dispose a micro object of 1 mm or less in a predetermined position of the substrate. For example, a mounting method and mounting apparatus of the present invention can be used to mount an IC (Integrated Circuit) tag in a predetermined position.

BRIEF DESCRIPTION OF THE DRAWINGS

FIG. 16A to FIG. 16E are cross sectional views showing respective steps of a fabrication method of a liquid crystal display as one embodiment of a display device of the present invention, and FIG. 16F is a perspective view of a component chip.

FIG. 31A to FIG. 31E are cross sectional views and plan views showing fabrication steps of the top-gate field-effect transistor shown in FIG. 30.

FIG. 36A to FIG. 36C are schematic diagrams showing still another embodiment of a mounting method and mounting apparatus of the present invention.

BEST MODE FOR CARRYING OUT THE INVENTION

Figure 1A:
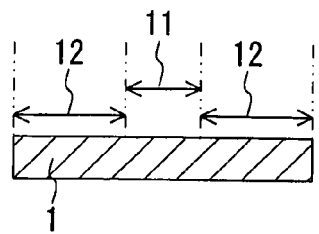
FIG. 1A to FIG. 1G are cross sectional views schematically showing respective steps according to one embodiment of a mounting method of the present invention.

The following will describe embodiments of the present invention. In the drawings used in the description below, hatching may be omitted for clarity. Further, in the following, like elements may be indicated with the same reference numerals and explanations for the like elements may be omitted.

<Mounting Method>

A mounting method of the present invention is a method for mounting constituting members of an electronic circuit on a substrate, and the method includes:

(A) a step of disposing a first liquid in a first region provided on one principal surface of the substrate;

(B) a step of bringing a member-containing liquid including a second liquid and at least one of the members into contact with the first liquid disposed in the first region; and (C) a step of removing the first liquid and the second liquid from the one principal surface to dispose the at least one of the members in the first region.

The first liquid is substantially undissolvable in the second liquid, and has greater wettability than the second liquid with respect to a member surface.

In another aspect, a mounting method of an electronic circuit-constituting member according to the present invention may be a method for mounting constituting members of an electronic circuit on a substrate, including:

(a) a step of disposing a first liquid in a first region provided on one principal surface of the substrate;

(b) a step of bringing a member-containing liquid into contact with the first liquid disposed in the first region, the member-containing liquid including a second liquid in which the first liquid is substantially undissolvable and at least one of the members, so as to move the at least one of the members to a region of the first liquid; and (c) a step of removing the first liquid and the second liquid from the one principal surface to dispose the at least one of the members in the first region.

According to this method, the first region is provided in a predetermined region where the member is to be mounted, and the member-containing liquid is brought into contact with the first liquid disposed in the first region, enabling the member to move from the member-containing liquid to a region of the first liquid to be disposed in the first region. By subsequently removing the first liquid and the second liquid contained in the member-containing liquid from the one principal surface of the substrate, the member can be mounted in the predetermined region without fail. In this specification, the "region of the first liquid" includes both inside of the first liquid and the surface of the first liquid (including the interface between the first liquid and the member-containing liquid). In the case where the member needs to be mounted in more than one region, the members may be mounted by providing a plurality of first regions on a substrate and bringing the member-containing liquid into contact with the first liquid that has been disposed in each region. This enables the members to be simultaneously mounted on more than one region. In this case, the member-containing liquid may contain a plurality of members dispersed in the second liquid. As used herein, the term "dispersed" refers to a state in which the members do not agglomerate in the second liquid. The member-containing liquid may be stirred to disperse the members therein.

The following describes each step of a mounting method of the present invention in more detail.

[Step (A)]

In order to mount the member accurately in a predetermined region, it preferable that the first liquid disposed in the first region do not spread from the first region. To prevent the first liquid from spreading outward from the first region, it is preferable to surround the first region by a second region that is less wettable than the first region with respect to the first liquid. More specifically, the first region and the second region surrounding the first region are provided on one principal surface of the substrate, and the second region is rendered less wettable than the first region with respect to the first liquid. In this way, the first liquid disposed in the first region does not easily spread outward from the first region, making it possible to dispose the first liquid stably in the first region. The first region and the second region with such different degrees of wettability may be realized by forming these regions such that the first region has a greater surface energy than the second region. Further, in order to dispose the first liquid more stably in the first region, it is preferable that the wettability of the first liquid differ greatly between the first region and the second region. Since the degree of wettability is also related to the surface tension of the first liquid, the values of the surface energies of the first region and the second region are not limited. However, the first liquid can be disposed stably in the first region when, for example, the surface energy of the second region is 5 $mJ/m^2$ or greater to less than 40 $mJ/m^2$ (preferably, 5 to 25 $mJ/m^2$), and when the surface energy of the first region is 40 $mJ/m^2$ (preferably 60 to 1000 $mJ/m^2$). Note that, in the following, the wettability of the first liquid may be referred to as "liquid-attracting" when it is large, and "liquid-repelling" when it is small. The wettability of the first liquid with respect to a solid surface is related to both the surface energy of the solid and the surface tension of the first liquid, and as such the value of the surface energy of the solid, characterized as either "liquid-attracting" or "liquid-repelling," is not particularly limited. However, the surface energy is preferably 40 mJ/m² or greater (preferably 60 to 1000 mJ/m²) when the surface is "liquid-attracting," and 5 mJ/m² or greater to less than 40 mJ/m² (preferably 5 to 25 mJ/m²) when the surface is "liquid-repelling."

As an example, the second region may be formed by providing at least a portion of the second region with an organic film having smaller wettability of the first liquid than that of the first region. In this way, the first region and the second region can be formed easily.

[Step (B)]

The member-containing liquid may be brought into contact with the first liquid disposed on the substrate, for example, according to the following methods: Immersing the entire substrate in the member-containing liquid; bring the substrate into contact with the member-containing liquid only on the surface on which the first liquid has been disposed; spraying the member-containing liquid onto the substrate surface on which the first liquid has been disposed; applying the member-containing liquid onto the substrate surface on which the first liquid has been disposed, among others. Since the first liquid is substantially undissolvable in the second liquid, the first liquid stably can stay in the first region even when in contact with the member-containing liquid. In this specification, the first liquid being "substantially undissolvable in the second liquid" means that the degree of dissolution of the first liquid in the second liquid (the weight of the first liquid dissolved in 100 ml of the second liquid) is no greater than 10 g, more preferably no greater than 1 g.

The following describes the movement of the member from the member-containing liquid to the region of the first liquid. Conceivably, the member moves to the region of the first liquid because the member surface is more wettable by the first liquid than by the second liquid. In the present invention, the amount of the first liquid disposed in the first region may be increased. By adjusting the amount of first liquid, trapping of the member by the first liquid may be facilitated. Further, in the case of the member moving into the first liquid, the movement of the member from the member-containing liquid to the first liquid appears to involve the interface tension acting on the boundary surface between the first liquid and the member-containing liquid (second liquid). It is therefore possible to move the member to the region of the first liquid efficiently by appropriately adjusting the surface tensions of the first and second liquids, and the wettability of the first and second liquids with respect to the member surface. Further, by adjusting the volume of the first liquid disposed in the first region, the number of members moved to the region of the first liquid can be regulated to control the number of members to be disposed in a single first region. For example, when the member is a component chip including electronic devices, only one component chip can be introduced to the first liquid by adjusting the volume of the first liquid disposed in the first region. For example, by adjusting the volume of the first liquid by a factor of less than 100 with respect to the volume of the component chip, only one component chip can be introduced to the first liquid.

The following describes the movement of the member into the first liquid in more detail. In order to move the member into the first liquid efficiently, it is preferable that the first liquid in contact with the member-containing liquid have the property of drawing the member thereinto. With such a property, the first liquid enables the member to move readily into the first liquid when the member contained in the member-containing liquid approaches the first liquid and contacts therewith. For example, in order for the interface tension to act on the member to draw it into the first liquid, the static contact angle of the first liquid with respect to the member surface in the member-containing liquid preferably should be less than 90°. Further, the first liquid desirably should have greater wettability than the second liquid with respect to the member surface. Here, the members are micro scale in size, and as such the wettability of the liquid with respect to the member surface can be regarded as dispersibility of the members in the liquid. To put it differently, the member desirably should be more dispersive in the first liquid than in the second liquid. This is because, under such wettability conditions, the member will be energetically more stable in the first liquid than in the second liquid. Therefore, a mounting method of the present invention preferably includes a step of surface-treating the member so that the member has the property of being drawn into the first liquid, prior to Step (B). As used herein, the "static contact angle" refers to the contact angle made by a liquid droplet on a solid surface when the liquid droplet is gently placed thereon.

In a mounting method of the present invention, the first liquid and the second liquid may be selected such that, for example, the second liquid is less polar than the first liquid, causing the member in the member-containing liquid to be drawn to the first liquid. For example, a water-containing liquid may be used as the first liquid, and a water-free liquid may be used as the second liquid. Preferably, water is used as the first liquid. Water has a high surface tension, and therefore it enables the member to be held firmly to the first region. As the second liquid, a chlorinated solvent is preferably used. Examples of a chlorinated solvent include chloromethane, dichloromethane, chloroform, carbon tetrachloride, monochlorobutane, dichlorobutane, monochloropentane, dichloropentane, and the like. Among these examples, chloroform or dichlorobutane is preferably used when the first liquid is water. In this case, the member surface preferably should be hydrophilic. When the member surface is water-repellent, the surface may be rendered hydrophilic by performing a surface treatment in advance. Further, the first liquid may be an organic solvent containing hydrocarbon chains, and the second liquid may be an organic solvent containing fluorocarbon chains. As the first liquid, alkanes with 5 to 16 carbon atoms may be used, for example. In this case, it is preferable that the member surface be covered with an organic film including hydrocarbon chains to provide improved wettability for the first liquid. As used herein, the "organic solvent containing hydrocarbon chains" means that the molecules making up the organic solvent contain the hydrocarbon chains. Likewise, the "organic solvent containing fluorocarbon chains" means that the molecules making up the organic solvent contain the fluorocarbon chains.

As described above, whether the members dispersed in the second liquid efficiently can move to the region of the first liquid depends on the combination of the respective properties of the first liquid, the second liquid, and the members. The method of selecting the first liquid and the second liquid, and the method of treating the members described above are merely examples by which a mounting method of the present invention is realized, and they do not limit the present invention in any ways. That is, any combinations of different liquids, and various treatment methods may be used as long as the members can be moved to the region of the first liquid when the second liquid containing the members dispersed therein (member-containing liquid) is brought into contact with the first liquid. For example, the first liquid and the second liquid may be selected as follows. First, the first liquid is placed in a test tube containing substantially the same volume of the second liquid in which the members are dispersed. Here, the first liquid is substantially undissolvable in the second liquid and therefore the first and second liquids are separated from each other. It can be said that the combination of the two liquids is appropriate when some of, or most of the members have moved into the first liquid or to the interface of the two liquids upon shaking the test tube.

Further, a usable combination of the first liquid and the second liquid may be found by the following method, for example. First, the inner surface of a test tube is modified chemically to have the same surface energy as the member surface. Then, the first and second liquids are placed in the test tube, and the shape of the boundary surface between these two liquids is observed. When the first liquid forms the upper layer and the second liquid forms the lower layer, and when the boundary is convex upward, it can be said that the members will be acted upon by the force that moves the members toward the first liquid. It then can be assumed that the members will move to the first liquid. When the first liquid forms the lower layer and the second liquid forms the upper layer, and when the boundary between the two liquids is convex downward, it can be assumed that the members also will move to the first liquid.

In a mounting method of the present invention, the method of disposing the first liquid in the first region is not particularly limited. For example, the first liquid may be disposed in the first region by spraying a mist of the first liquid onto the substrate, or by spraying a vapor-phase first liquid onto the substrate and causing it to condense into liquid in the first region of the substrate. The first liquid also may be disposed in the first region, for example, by exposing one principal surface of the substrate to an atmosphere with a large proportion of the vapor pressure of the first liquid with respect to the saturation vapor pressure of the first liquid. Placing the substrate in such an atmosphere enables the first liquid to be disposed in the first region. Hence, when the member-containing liquid is brought into contact with the first liquid in such an atmosphere, Step (A) and Step (B) can be performed almost simultaneously and the number of steps can be reduced. As used herein, the "atmosphere with a large proportion of the vapor pressure of the first liquid with respect to the saturation vapor pressure of the first liquid" refers to an atmosphere in which, for example, the percentage of the vapor pressure of the first liquid with respect to the saturation vapor pressure of the first liquid (relative humidity when the first liquid is water) is 60% to 100%, and desirably 80% to 100%. The vapor pressure of the first liquid with respect to the saturation vapor pressure of the first liquid also can be said as high when the temperature of the substrate surface on which the first liquid is disposed is at or below the dew point of the first liquid vapor. Thus, the first liquid also can be disposed in the first region by exposing one principal surface of the substrate to an atmosphere in the presence of a first liquid vapor, and by decreasing the temperature of the one principal surface at or below the dew point of the first liquid vapor.

[Step (C)]

In Step (C), the first liquid and the second liquid are removed from the one principal surface of the substrate. Specifically, for example, the second liquid is removed first, leaving the first liquid disposed in the first region, and the first liquid is removed to dispose the member in a predetermined position. Alternatively, for example, the first liquid is removed first, and the second liquid is then removed from the one principal surface of the substrate to dispose the member in a predetermined position. Even when the first liquid is substantially undissolvable in the second liquid, the first liquid can be removed by exposing it to the second liquid over extended time periods and thereby causing the first liquid to dissolve gradually in the second liquid. That is, the one principal surface of the substrate is brought into contact with the second liquid over extended time periods with the members dispersed in the second liquid. This causes the first liquid to dissolve gradually in the second liquid and is removed from the one principal surface of the substrate. The second liquid then is removed from the one principal surface of the substrate to dispose the member in a predetermined position. Further, the first liquid and the second liquid also may be removed as follows, for example. First, the first liquid is removed partially from the one principal surface of the substrate being exposed to the second liquid, and the second liquid is removed from the one principal surface of the substrate. The remaining portion of the first liquid then is removed to dispose the member in a predetermined position. The order of removing the first liquid and the second liquid depends on factors such as solubility of the two liquids, contact time, and contact method. The member can be disposed in a predetermined position irrespective of the order in which the first liquid and the second liquid are removed.

The following describes an exemplary method of removing the first liquid and the second liquid.

First, an exemplary method of removing the second liquid is described. When the second liquid has small wettability with respect to regions on one principal surface of the substrate other than the first region, the second liquid easily can be removed from the principal surface. In the case where the entire substrate is immersed in the member-containing liquid, or where only the one principal surface of the substrate is brought into contact with the member-containing liquid, the second liquid can be removed by taking out or separating the substrate from the member-containing liquid. In the case where the second liquid is applied by sprinkling it over the one principal surface, the second liquid can be removed simply by stopping sprinkling. Alternatively, the second liquid may be removed by washing with a third liquid. Specifically, Step (C) may include the additional steps of removing the second liquid from the one principal surface by bringing a third liquid into contact with the second liquid, wherein the third liquid is a liquid in which the first liquid is substantially undissolvable and the second liquid is substantially dissolvable, and removing the first liquid and the third liquid from the one principal surface of the substrate. Note that, in this case, the third liquid may be the same liquid as the second liquid. The washing may be performed, for example, by immersing the entire substrate in the third liquid, or by spraying the third liquid onto the washed surface of the substrate. Because the first liquid is substantially undissolvable in the third liquid, the first liquid can remain stably in the first region even when it remains therein at the time of the washing with the third liquid. The third liquid is removed from the substrate after washing. The removal method is not particularly limited. For example, the third liquid may be removed by natural drying, or under heat and/or reduced pressure. The third liquid readily can be removed when its wettability with respect to the region other than the first region is small. In the case where the entire substrate is immersed in the third liquid, or when only the one principal surface of the substrate is brought into contact with the third liquid, the third liquid can be removed by taking out or separating the substrate from the third liquid and drying the substrate. In the case where the third liquid is applied by sprinkling it over the substrate, the third liquid can be removed by stopping sprinkling, followed by drying.

When the second liquid is removed before removing the first liquid disposed in the first region, the member is disposed in a predetermined region by removing the first liquid after the second liquid has been removed in the manner described above. The method of removing the first liquid is not particularly limited. For example, the first liquid may be removed by natural drying, or under heat and/or reduced pressure.

The member is disposed in the first region by the step that removes the first liquid from the first region. In order for the member to be efficiently disposed in the first region, the first liquid desirably should have the property of drawing the member thereinto when the first liquid is in contact with the atmosphere or the second liquid. With such a property of the first liquid, the member accurately can be disposed in the first region when the first liquid is removed in Step (C). For example, the static contact angle of the first liquid with respect to the member surface in the atmosphere or the second liquid desirably should be less than 90°. It is also desirable that the first liquid has large wettability with respect to the member surface in the atmosphere or the second liquid. The principle by which the member is disposed in a predetermined position by the removal of the first liquid will be described later.

By the foregoing steps, the member can be mounted in a predetermined region of the substrate without fail.

With a mounting method of the present invention, a plurality of members can be mounted at once. Specifically, a plurality of members accurately can be disposed in a predetermined region by the foregoing method when a plurality of first regions is provided on one principal surface of the substrate and by disposing the first liquid in each first region. In this way, for example, a plurality of component chips (for example, field-effect transistors) used for driving a display device can be mounted at once. This mounting method also can be used to repair electronic instruments. For example, when the component chips that have been mounted on an electronic instrument include a defect component chip, a mounting method of the present invention can be used to remove the defect chip and mount a normal chip. Further, a mounting method of the present invention can be used to mount the component chips selectively in regions where they could not be mounted by other methods.

The substrate used to mount the members is not limited. For example, a substrate may be used that is formed of an inorganic material, a high-molecular resin material, or a composite material of inorganic material and high-molecular resin material. The inorganic material may be ceramics (such as alumina), silicon, glass, or the like. The high-molecular resin material may be polyimide resin, polyamide resin, epoxy resin, polycarbonate resin, or the like. An example of the composite material of inorganic material and high-molecular resin material is a composite material including a fiber made of glass, ceramic, or metal, and a high-molecular resin material. A SOI substrate or a compound semiconductor substrate also may be used because the substrate material may be conductive as long as the substrate surface is insulated.

In the following, the description is directed to the members and the shape of the first region, by considering cases where the mounted members are component chips including electronic devices, and the mounted members are pillar-like members, particularly micro pillar-like members such as nanowires. As used herein, the "micro pillar-like members" refers to, for example, pillar-like members having a maximum diameter of at most 1 μm, and preferably at most 500 nm. In the following, such members may be referred to as "nanomembers."

When the members are component chips including electronic devices, the shape of the first region provided on the substrate used in Step (A) may be decided according to the shape of the component chip to be mounted on the first region. In this case, the shape of the first region preferably should correspond to the shape of a predetermined surface of the mounted component chip (the surface that meets the substrate face to face when mounted on the substrate). Examples of such a shape include polygonal such as triangle, quadrangle, and pentagonal, and circular and elliptical, etc.

The mounted component chip may be rectangular in shape, with a pair of surfaces (P1), a pair of surfaces (P2), and a pair of surfaces (P3). The surface (P2) has an area equal to or larger than (P1), and the surface (P3) has a larger area than (P2). In this case, the shape of the surface (P3) providing the largest area for the component chip preferably resembles, as closely as possible, the shape of the first region where the component chip is to be mounted, and more preferably the surface (P3) substantially corresponds to the first region. Here, when a shape of an area obtained by multiplying the length and width of the surface (P3) respectively by 0.8 (decrease in area by a factor of 0.64) is represented by P3$x$, and an shape of an area obtained by multiplying the length and width of the surface (P3) respectively by 1.2 (increase in area by a factor of 1.44) is represented by P3$y$, the "surface (P3) substantially corresponds to the first region" refers to, for example, the surface (P3) having a shape such that P3$x$ is confined in the first region, and the first region is confined in P3$y$.

One of the two surfaces (P3) is disposed face to face with the one principal surface of the substrate. In order for the component chip to be accurately mounted on the substrate, the surface (P3) preferably should have an area at least twice as large as that of the surface (P2), and preferably 3 to 50 times greater, for example.

Preferably, the surface (P3) is rectangular in shape. In the case where the surface (P3) is substantially equal in shape to the first region, and the shapes of the surface (P3) and the first region are both rectangular, the component chips can be mounted by being oriented in a particular direction. This allows for easy interconnection between the wiring on the substrate and the electrode terminals of the component chip. Preferably, the longer side of the rectangle is about 1.5 to 50 times greater than the shorter side, and more preferably 2 to 10 times greater. Note that, by properly designing the layout of the electrode terminals of the component chip, the electrode terminals reliably can be interconnected to the wiring on the substrate where the component chip is to be mounted, even when the planar shape of the component chip is not rectangular. For example, the surface of the component chip mated with the substrate when mounted thereon may be a square or a circle when a plurality of electrodes is disposed at varying distances from the center of the component chip (for example, when concentrically disposing the electrodes).

The substrate of the component chip may be made of monocrystalline silicon. In this case, a mounting method of the present invention includes an additional step of forming a component chip prior to Step (B). A mounting method of the present invention further may include a step of forming a plurality of electronic devices on a monocrystalline silicon substrate and cutting the monocrystalline silicon substrate to obtain a component chip. When the component chip includes only one electronic device, the silicon substrate is cut so that each piece includes a single electronic device. In this method, after the electronic device is formed, the back side of the monocrystalline silicon substrate may be ground to reduce the thickness of the substrate. The monocrystalline silicon substrate may be cut by ordinary method, for example, with the use of a dicer.

In a mounting method of the present invention, the electronic device may be a transistor (for example, field-effect transistor). The field-effect transistor is an important element for driving a display device. The electronic device included in the component chip is not limited to the transistor, and may be a resistor, a capacitor, an inductor, and the like. The component chip may include only one electronic device or more than one electronic device. The component chip may include a circuit made up of a plurality of electronic devices. The electronic device included in the component chip may be a monocrystalline silicon transistor, or a circuit element with integrated monocrystalline silicon transistors. The longest side of the component chip is 1000 µm or less, for example.

When the electronic device of the component chip is a field-effect transistor, the substrate on which the component chip is to be mounted may be provided beforehand with an electrode pattern that corresponds to the source electrode, drain electrode, and gate electrode of the transistor, and the component chip may be disposed on this pattern by a mounting method of the present invention. Such transistors may be used as transistors for controlling the pixels of an active-matrix display device.

The following describes the case where the mounted members are pillar-like members.

As in the case of the component chip, the shape of the first region may be decided according to the shape of the mounted member when the mounted member is a pillar-like member. In this case, the first region desirably should have a shape that allows the member to be uniaxially oriented in the first region, for example. Specifically, assuming a rectangle of the smallest area circumscribed about the first region, the shape of the first region desirably should be decided so that the length of the shorter side of the rectangle is shorter than the length of the long axis of the member. For example, assuming a rectangle of the smallest area circumscribed about an ellipsoidal first region, the shape of the first region desirably should be decided so that the length of the shorter side of the rectangle is shorter than the length of the long axis of the member. From a different perspective, when the first region is rectangle, the length along the width direction (shorter side) of the first region preferably should be shorter than the length along the long axis of the member. With such a shape of the first region, the pillar-like member is disposed by orienting its long axis along the longitudinal direction of the first region. This enables the member to be disposed stably in the first region in a predetermined orientation even when it is micro scale in size. As used herein, the "width direction" means the direction orthogonal to the longitudinal direction of the first region when it is rectangular in shape.

Examples of the pillar-like member, especially nanomembers with the maximum diameter of 1 µm or less include nanotubes, nanowires, nanorods, nanoribbons, whiskers, and the like. Members with semiconductor characteristics are used when, for example, such nanomembers are disposed in a uniaxial orientation and a first electrode and a second electrode are provided on the both ends thereof to provide an electronic device such as a transistor. Examples of such members include silicon nanowires and the like.

<Fabrication Method of Electronic Instrument>

A fabrication method of an electronic instrument of the present invention is a method for fabricating an electronic instrument including a substrate and component chips which include electronic devices and are mounted on the substrate, wherein the fabrication method includes a step of mounting the component chips on one principal surface of the substrate using a mounting method of the present invention.

The electronic instrument fabricated by the fabrication method is not particularly limited, and it may be a display device. Examples of the display device include a liquid crystal display, an organic electroluminescence display, a plasma display, a display employing electrophoresis, a display employing magnetic powder, and the like. Other examples of the electronic instruments fabricated by the fabrication method include a mount circuit, an antenna-equipped IC tag, and the like.

<Fabrication Method of Electronic Device>

A fabrication method of an electronic device of the present invention is a method for fabricating an electronic device including a substrate, pillar-like members having semiconductor characteristics and mounted on the substrate, and a first electrode and a second electrode respectively connected to the pillar-like members, wherein the fabrication method includes a step of mounting the pillar-like members on one principal surface of the substrate using a mounting method of the present invention.

The electronic device fabricated by the fabrication method is not particularly limited, and may be a transistor. Examples of the transistor include a back-gate field-effect transistor, a top-gate field-effect transistor, and the like.

<Display Device>

A display device of the present invention is a display device fabricated by a fabrication method of an electronic instrument of the present invention, or a display device including transistors fabricated by a fabrication method of an electronic device of the present invention. An example of the display device of the present invention is a display device including a substrate, a plurality of component chips (component chips including transistors as electronic devices) mounted on the substrate, and first and second wirings for controlling the component chips. Each component chip including a transistor includes an electrode terminal formed, for example, only on its principal surface. Each of the component chips is connected electrically to one of the first wiring and the second wiring via the electrode terminal.

Examples of a display device of the present invention include a liquid crystal display, an organic electroluminescence display, a plasma display, a display employing electrophoresis, a display employing magnetic powder, and the like.

<Mounting Apparatus>

A mounting apparatus of the present invention is an apparatus for mounting an electronic circuit-constituting member on a substrate, and includes:

(I) means for supplying a vapor of a first liquid onto one principal surface of the substrate;

(II) means for supplying a member-containing liquid including a second liquid and the member to the one principal surface of the substrate; and (III) means for removing the first liquid and the second liquid from the one principal surface of the substrate.

Note that, the first liquid and the second liquid are related to each other concerning their wettability to the member surface, as described above.

The means (I) for supplying a vapor of the first liquid onto the one principal surface of the substrate may be, for example, a mechanism capable of spraying a gaseous first liquid onto the substrate, a device capable of keeping the internal atmosphere at an atmosphere in which a vapor of the first liquid is present, or a device capable of adjusting the internal temperature so that the vapor pressure of the first liquid falls within a predetermined range, among others. Any mechanism or device can be used as long as it can supply a vapor of the first liquid to a first substrate. The means (II) for supplying the member-containing liquid to the one principal surface of the substrate may be, for example, a mechanism for immersing the substrate in the member-containing liquid, a mechanism capable of sprinkling the member-containing liquid over the substrate surface, or a mechanism for applying the member-containing liquid onto the substrate, among others. The means (III) for removing the first liquid and the second liquid includes conventional mechanisms that can be used to remove liquid by heating or by creating a reduced pressure, for example.

In another aspect, a mounting apparatus of the present invention may include:

(i) a liquid disposing section for disposing the first liquid in the first region provided on one principal surface of the substrate; and (ii) a member contacting section for bringing the member-containing liquid including a second liquid and the member into contact with the first liquid disposed in the first region.

The liquid disposing section is not limited as long as it includes a mechanism capable of disposing the first liquid on the substrate, i.e., any conventional mechanism used in, for example, an ink-jet method, a method using a dispenser, a screen printing method, and the like. Further, the liquid disposing section may include a mechanism for spraying a mist of the first liquid, or a mechanism for spraying a gaseous first liquid onto the substrate to cause it to condense on the first region of the substrate. An injector used in the ink-jet method is particularly preferable for its ability to dispose a micro liquid droplet in a predetermined position with an accurately controlled volume. The member contacting section may include, for example, a mechanism for immersing the substrate in the member-containing liquid, a mechanism capable of sprinkling the member-containing liquid over the substrate surface, or a mechanism for applying the member-containing liquid onto the substrate, among others.

A mounting apparatus of the present invention further may include a liquid removing section for removing the first liquid and the second liquid from the one principal surface of the substrate. The liquid removing section may include conventional mechanisms that can be used to remove liquid by heating or by creating a reduced pressure, for example.

First Embodiment

In the First Embodiment, a mounting method of the present invention will be described in detail with reference to the drawings. In the present embodiment, the description will be directed to the case where the electronic circuit-constituting member is a component chip including an electronic device, and the component chip is mounted on a substrate.

Figure 3A:
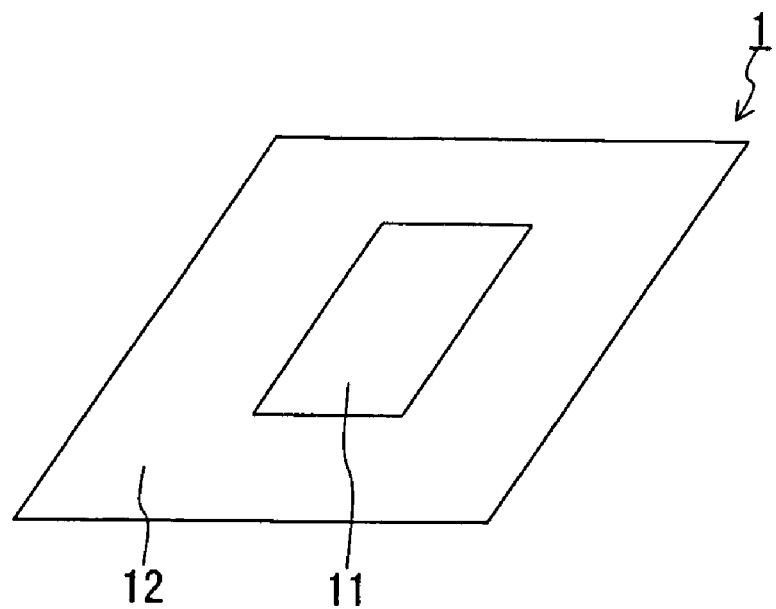
FIG. 3A is a perspective view showing an example of a first region and a second region in a mounting method of the present invention.

FIG. 1A to FIG. 1G, and FIG. 3A and FIG. 3B schematically illustrate respective steps of a mounting method of the present embodiment. First, a substrate 1 as shown in FIG. 1A and FIG. 3A is prepared. On one principal surface of the substrate 1 are provided a first region 11 and a second region 12 surrounding the first region 11. The first region 11 and the second region 12 are formed such that the first region 11 is more wettable than the second region 12 with respect to the first liquid described later. As shown in FIG. 3A, the first region 11 is rectangular in shape. In the following, the surface of the substrate 1 provided with the first region 11 may be referred to as a "first principal surface."

Figure 1B:
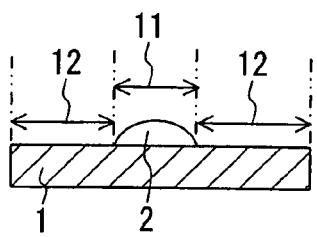
Figure 3B:
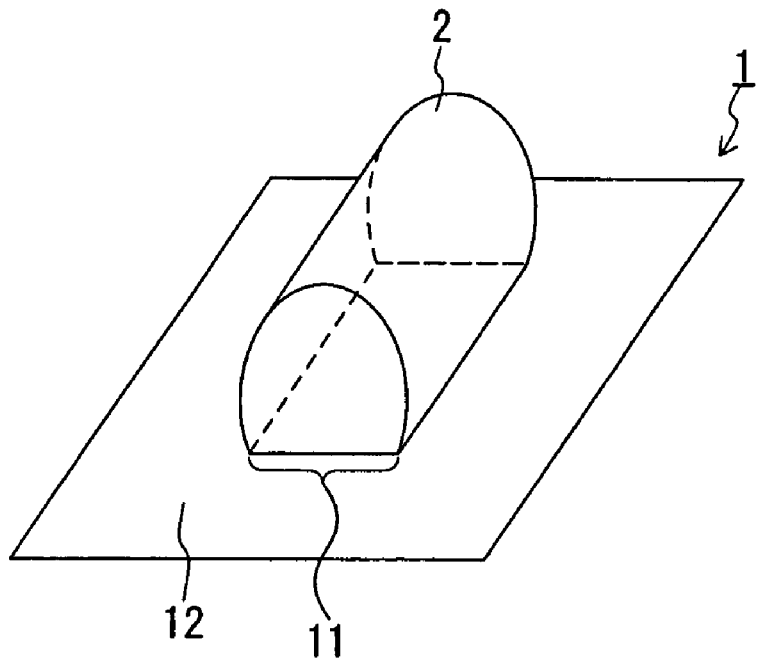
FIG. 3B is a perspective view showing how a first liquid is disposed in the first region.

Then, as shown in FIG. 1B and FIG. 3B, a first liquid 2 is disposed only in the first region 11. The first liquid 2 may be disposed by a method such as an ink-jet method, a method using a dispenser, or a screen printing method. Alternatively, a mist of the first liquid may be sprayed onto the substrate, or a gaseous first liquid may be sprayed onto the substrate to cause it to condense in the first region of the substrate. Further, the first liquid 2 may be disposed by exposing the substrate to an atmosphere in which there is a large proportion of first liquid vapor pressure with respect to the saturation vapor pressure of the first liquid.

Further, a dipping method may be used when the second region 12 having smaller wettability is provided in all regions of the substrate 1 other than the first region 11. Specifically, the first liquid 2 may be disposed only in the first region 11 by immersing the substrate 1 in the first liquid 2 and then taking out the substrate 1 from the first liquid 2. Further, the first liquid 2 may be disposed only in the first region 11 by applying the first liquid 2 onto the first principal surface using a spin coating method. Of these liquid placement methods, the ink-jet method is particularly effective when the first region 11 is microscopic in size or when the number of component chips disposed in the first region 11 needs to be accurately controlled, because the ink-jet method allows a micro liquid droplet, measuring several ten micrometers in diameter, to be disposed in a predetermined position with an accurately controlled volume. In the case where only a single component chip is disposed in the first region 11, the volume of the first liquid 2 disposed in this region desirably should be less than 100 times than that of the component chip.

Because the first region 11 is surrounded by the second liquid 12 which is less wettable to the first liquid 2, the first liquid 2 does not easily spread out from the first region 11. Thus, the contact face of the first liquid 2 and the substrate 1 takes substantially the same shape as the shape of the first region 11.

Figure 1C:
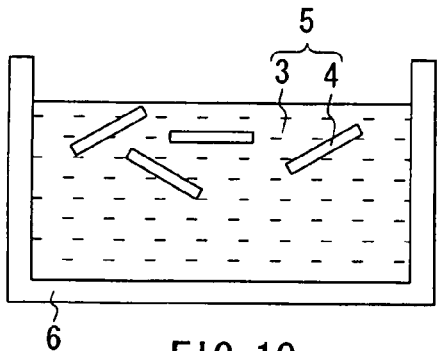

FIG. 1C illustrates a member-containing liquid 5 in a container 6. The member-containing liquid 5 includes a second liquid 3 and component chips 4 dispersed in the second liquid 3. The first liquid 2 is substantially undissolvable in the second liquid 3.

Figure 1D:
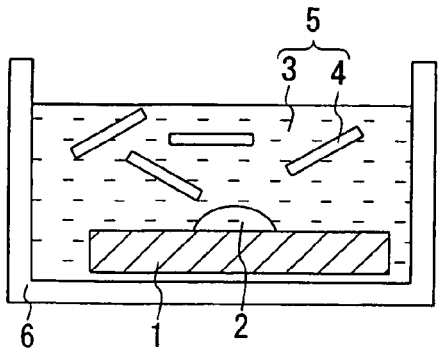

As shown in FIG. 1D, the substrate 1 is immersed in the member-containing liquid 5 in which the component chips 4 are dispersed. The first liquid 2 disposed on the first principal surface stably stays in the first region because it is substantially undissolve in the second liquid 3. In the case where the first liquid 2 is a highly polar liquid and the second liquid 3 is less polar than the first liquid 2, the first liquid 2 is energetically more stable in the first region in the member-containing liquid 5. Similarly, in the case where the first liquid 2 is an organic solution including hydrocarbon chains and the second liquid 3 is an organic solution including fluorocarbon chains, the first liquid 2 is energetically more stable in the first region in the member-containing liquid 5.

After the substrate 1 is immersed in the member-containing liquid 5, any of the component chips 4 eventually approaches the first liquid 2 and contacts therewith. Because the surface of the member 4 is more wettable to the first liquid 2 than to the second liquid 3, by the interface tension (of between the first liquid 2 and the second liquid 3) that acts on the contact face of the first liquid 2 and the member-containing liquid 5, the component chip 4 conceivably is drawn into the first liquid 2 or stays at the interface between the first liquid 2 and the member-containing liquid 5. In the case where the component chip 4 is drawn entirely into the liquid, the component chip 4 can be disposed on the substrate 1 with good reproducibility by increasing the disposed volume of the first liquid 2 to at least the volume that can enclose the entire component chip. Once the component chip 4 has moved to the first liquid 2, it stably stays there and does not easily detach itself therefrom. The component chip 4 therefore is mounted on the substrate 1 without fail. In this manner, a method of the present invention does not require strict control of the first liquid volume, and the member, once it is disposed on the substrate, does not easily detach itself from the substrate.

Figure 1E:
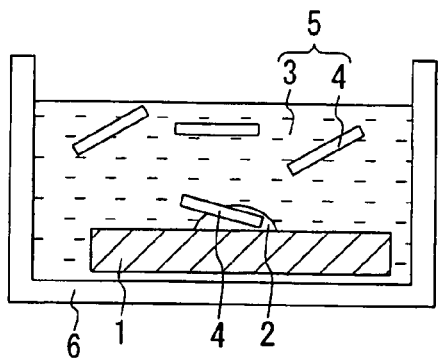
Figure 4A:
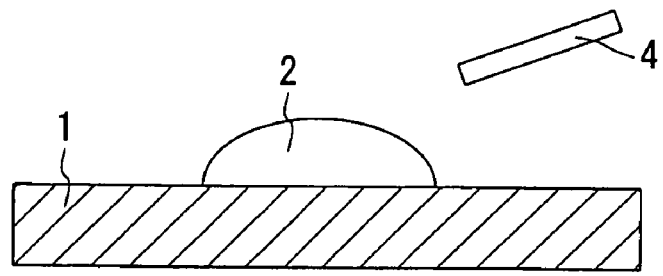
FIG. 4A to FIG. 4D are diagrams schematically showing how a component chip moves into the first liquid according to one embodiment of a mounting method of the present invention.
Figure 4B:
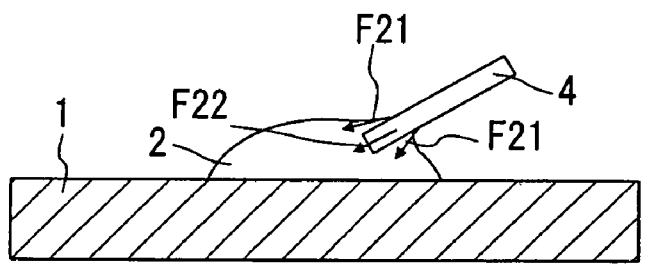
Figure 4C:
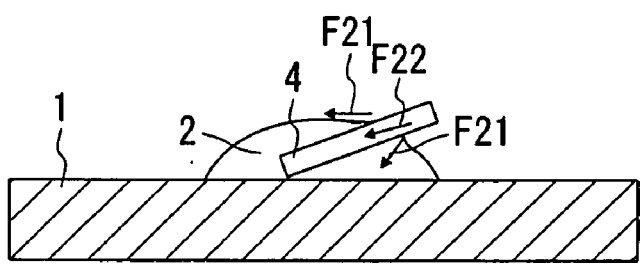
Figure 4D:
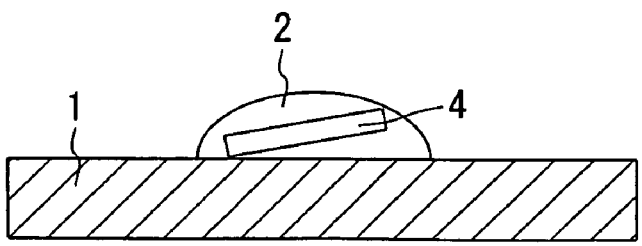

FIG. 1E shows the component chip 4 moving entirely into the first liquid 2. However, instead of the component chip 4 completely entering the first liquid 2, the component chip 4 partially may stay at the interface between the first liquid 2 and the member-containing liquid 5. FIG. 4A to FIG. 4D are cross sectional views illustrating how the component chip 4 is drawn into the first liquid 2. The following describes the principle by which the component chip 4 is drawn into the first liquid 2. As shown in FIG. 4A and FIG. 4B, when the component chip 4 approaches the first liquid 2 and contacts therewith, interface tensions F21 at the interface between the first liquid 2 and the member-containing liquid act on the component chip 4. A resultant force F22 of the interface tensions F21 acts on the surfaces of the component chip 4 and draws the component chip 4 into the first liquid 2. As a result, the component chip 4 in drawn into the first liquid 2 in the manner illustrated in FIG. 4C and FIG. 4D. In order for the component chip 4 to be drawn into the first liquid 2 as shown in FIG. 4A to FIG. 4D, there must be a force that draws the component chip 4 into the first liquid 2 when the component chip 4 contacts the first liquid 2. The directions in which the interface tensions act on the component chip 4 are influenced by the static contact angle of the first liquid 2 with respect to the surfaces of the component chip 4 in the member-containing liquid.

Figure 5A:
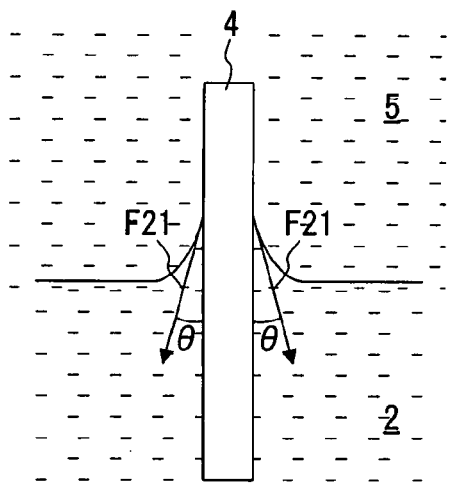
FIG. 5A and FIG. 5B are diagrams depicting the action of interface tension in a mounting method of the present invention.
Figure 5B:
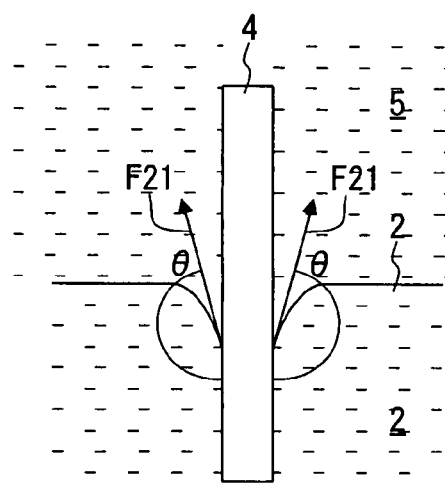

FIG. 5A illustrates a case where the contact angle θ of the first liquid 2 with respect to the surfaces of the component chip 4 in the member-containing liquid 5 is less than 90°. In this case, the component chip 4 in contact with the first liquid 2 is acted upon by the interface tensions F21 that draw the component chip 4 into the first liquid 2. FIG. 5B illustrates a case where the contact angle θ of the first liquid 2 with respect to the surfaces of the component chip 4 in the member-containing liquid 5 is greater than 90°. In this case, the component chip 4 in contact with the first liquid 2 is acted upon by the interface tensions F21 that pull the component chip 4 away from the first liquid 2. It is therefore preferable that the static contact angle of the first liquid 2 with respect to the surfaces of the component chip 4 in the member-containing liquid 5 be less than 90°, and more preferably no greater than 80°.

The force that draws the component chip 4 into the first liquid 2 will be greater as the static contact angle of the first liquid 2 with respect to the surfaces of the component chip 4 in the member-containing liquid 5 becomes smaller, or as the interface tension F21 becomes greater. Further, because the surfaces of the component chip 4 are more wettable to the first liquid 2 than to the second liquid 3, the component chip 4 can stay stably in the first liquid 2 and easily can enter the first liquid 2.

Thus, in order to allow the component chip 4 to enter the first liquid 2 in the member-containing liquid 5, it is important to select appropriately a type of liquid and conditions of the member surface, taking into consideration the interface tension at the interface between the first liquid 2 and the second liquid 3, and the wettability of the surfaces of the component chip 4 with respect to the first liquid 2 and the second liquid 3.

For example, a high-polarity liquid may be used as the first liquid, and a liquid less polar than the first liquid may be used as the second liquid. Examples of the first liquid include an organic solvent, water, and a mixture of organic solvent and water. Some of the examples are alcohols such as methanol, ethanol, ethylene glycol, and glycerine; water; a mixture of such alcohol and water; and the like. Examples of the second liquid 3 include alkanes such as hexane, octane, nonane, decane, undecane, dodecane, tridecane, tetradecane, pentadecane, hexadecane, toluene, and xylene; chlorinated solvents such as chloromethane, dichloromethane, chloroform, carbon tetrachloride, monochlorobutane, dichlorobutane, monochloropentane, and dichloropentane; diethyl ether; petroleum ether; ethyl acetate; benzene; silicone oil; perfluorooctane; perfluorononane; and mixtures of these.

When the first liquid is a high-polar liquid such as water, there will be a large interface tension that draws and anchors the component chip in the first liquid as compared with using a non-polar organic solvent such as hexadecane as the first liquid. This enables the member to be disposed on the substrate efficiently and reliably.

The first liquid may be an organic solvent including hydrocarbon chains, and the second liquid may be an organic solvent including fluorocarbon chains. In this case, alkanes such as hexane, octane, nonane, decane, undecane, dodecane, tridecane, tetradecane, pentadecane, hexadecane, toluene, and xylene may be used as the first liquid. As the second liquid, perfluorooctane, perfluorononane, and the like may be used.

When the first liquid is an organic solvent including hydrocarbon chains, an organic solvent including fluorocarbon chains, having a lower surface tension than the organic solvent used for the first liquid, may be used as the second liquid. When this combination of liquids is used, the interface tension that draws and anchors the component chip in the first liquid can be increased, making it possible to dispose the component chip on the substrate efficiently and reliably.

When a high-polarity liquid is used as the first liquid, the component chip should have a largest possible surface energy, preferably 40 mJ/m$^2$ or greater. The surface of a material with a large surface energy has high polarity and is readily wetted by a high-polarity liquid. Further, in this case, there will be a large interface tension that draws the component chip into the first liquid. When the surface energy of the component chip is small, it is preferable to treat the surfaces of the component chip to increase the surface energy. When the component chip has silicon on the surface, the surface energy can be increased by irradiation of ultraviolet light in an ozone atmosphere. This method also is effective for electrode materials such as platinum, gold, copper, and nickel. The surface energy of the component chip also can be increased by forming a thin film, having the property to attract the first liquid, on the surfaces of the component chip (for example, a hydrophilic film when water is used as the first liquid). For example, a thin film of silicon oxide, nitrogen oxide, titanium oxide, or the like may be formed on the surfaces of the component chip by a vacuum sputtering method or a thermal CVD method. Irradiation of ultraviolet light in an ozone atmosphere after forming the thin film is also effective. The surface energy of the component chip also can be increased by modifying the surfaces of the component chip with a silane coupling agent having an amino group, a carboxyl group, or a hydroxy group at a terminal. When the surface treatment is performed only on metals, a thiol having an amino group, a carboxyl group, or a hydroxy group at a terminal may be used for the surface modification.

When the first liquid is an organic solvent including hydrocarbon chains, a thin film having hydrocarbon chains is preferably formed on the surfaces of the component chip. Such an organic film can be formed by treating the component chip, for example, with a silane coupling agent having hydrocarbon chains. This renders the surfaces of the component chip non-polar, providing better wettability for the organic solvent including hydrocarbon chains and making the component chip to be drawn readily into the first liquid.

By the experiment conducted by the inventors of the present invention, the component chip was found to enter the first liquid efficiently by the interface tension when the longest side of the component chip is 1 mm or less in length. Considering ease of formation and handling of the component chip, the length of the longest side of the component chip preferably should be 100 nm or greater.

According to a mounting method of the present invention, the component chip moves to the region of first liquid. Thus, the component chip is disposed on the substrate more efficiently compared with conventional methods.

Figure 1F:
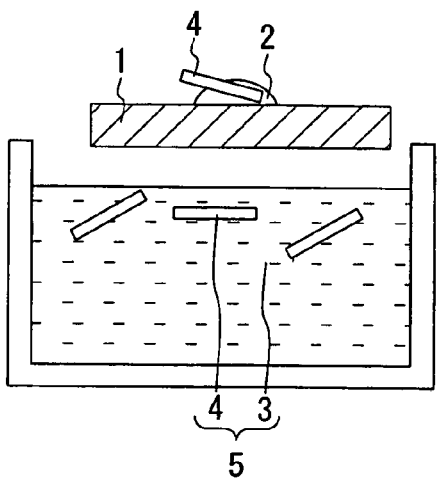

Next, as shown in FIG. 1F, the substrate 1 is taken out of the member-containing liquid 5. When the wettability of the second liquid 3 with respect to the second region 12 is considerably small (when the second region 12 is repellent to the second liquid 3), the second liquid 3 on the first principal surface can be removed completely merely by taking the substrate 1 out of the member-containing liquid 5. When the removal is difficult, the substrate 1 may be washed with the third liquid. Here, it is required that the second liquid 3 dissolves in the third liquid but the first liquid 2 is substantially undissolvable in the third liquid. In this case, the second liquid 3 also can be removed by immersing the substrate 1 in the third liquid. When the third liquid has a higher boiling point than the second liquid 3, or when the surface tension of the third liquid is higher than that of the second liquid 3, the third liquid readily can be removed from the first principal surface by taking the substrate 1 out from the third liquid and drying it in air. When taking the substrate 1 out from the member-containing liquid 5, the component chip 4 may adhere to regions other than the first region 11. In this case, such component chips can be removed by washing with the third liquid. In this case, the same liquid used for the second liquid 3 may be used as the third liquid.

Figure 1G:
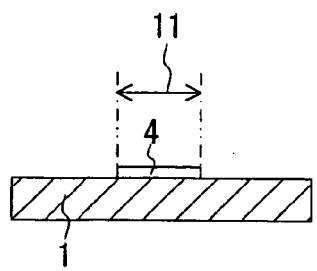
Figures 6A, 6B:
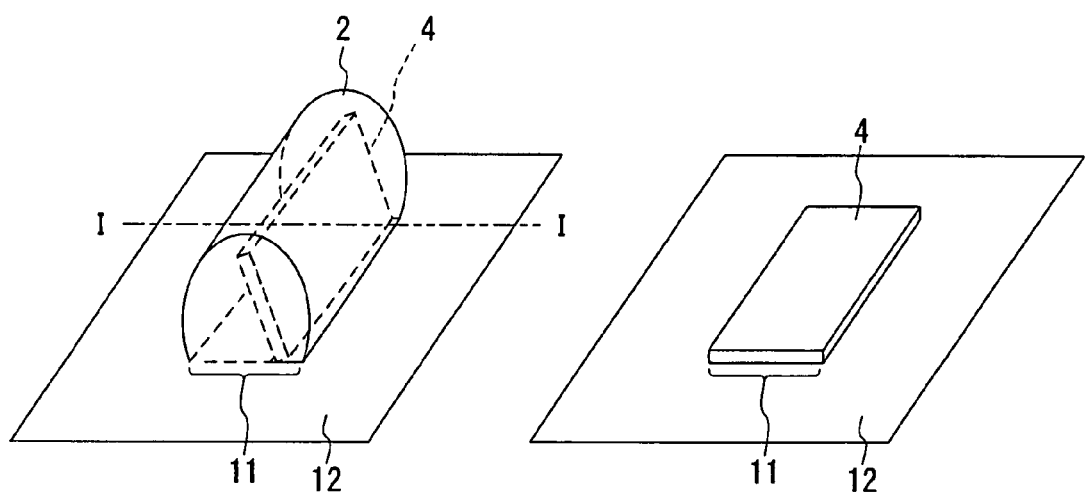
FIG. 6A and FIG. 6B are perspective views showing how the component chip is mounted according to one embodiment of a mounting method of the present invention.

Thereafter, the first liquid 2 on the first principal surface is removed to dispose the component chip 4 in the first region 11, as shown in FIG. 1G. FIG. 6A illustrates a state before removal of the first liquid 2. Upon removal of the first liquid 2, the component chip 4 is accurately disposed in the first region 11, as shown in FIG. 6B. When the component chip 4 is rectangular in shape with a pair of surfaces (P1), a pair of surfaces (P2) having an area equal to or larger than P1, and a pair of surfaces (P3) having a larger area than P2, and when the first region is substantially equal in shape to the surface (P3), the component chip 4 is disposed such that one of the surfaces (P3) faces the substrate surface having the first region 11. The component chip 4 is mounted on the substrate in this manner. Note that, FIG. 6A shows the state in which the component chip 4 has moved into the first liquid 2. However, the component chip 4 can be disposed in the first region 11 in a similar fashion as shown in FIG. 6B by removing the first liquid 2, even when the component chip 4 has been drawn into the first liquid 2 only partially, or when the component chip 4 is at the surface of the first liquid 2 (at the interface between the first liquid and the member-containing liquid).

Figure 7A:
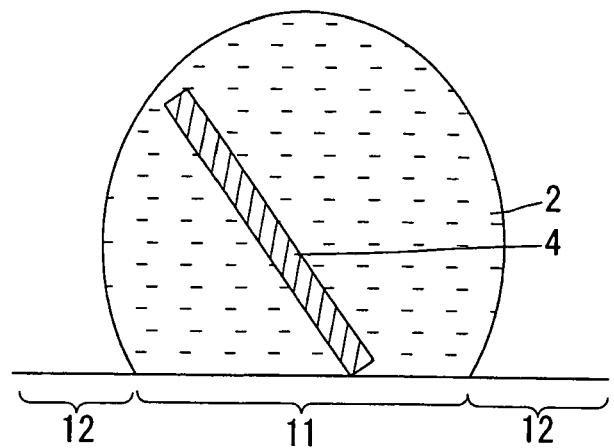
FIG. 7A to FIG. 7D are cross sectional views showing how the component chip is mounted according to one embodiment of a mounting method of the present invention.
Figure 7B:
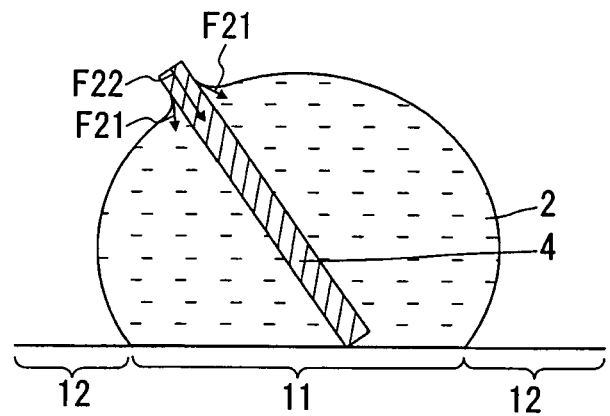
Figure 7C:
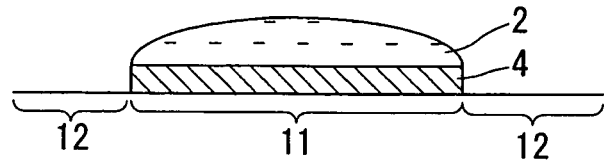
Figure 7D:
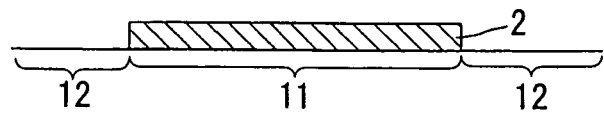
Figure 8A:
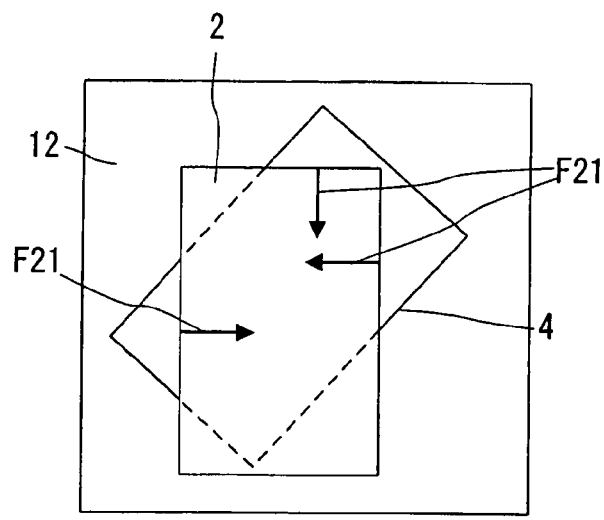
FIG. 8A to FIG. 8C are diagrams depicting the action of surface tension in a mounting method of the present invention.
Figure 8B:
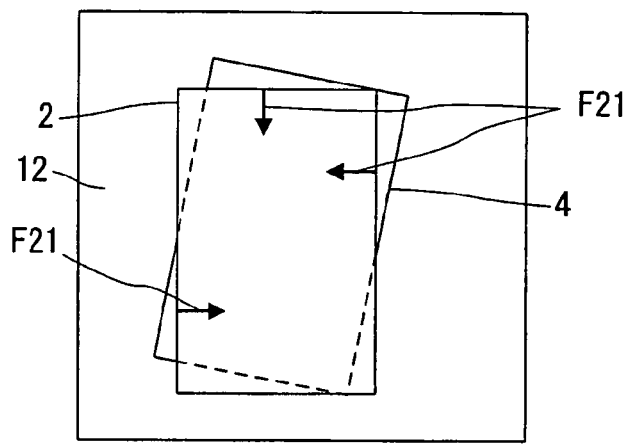
Figure 8C:
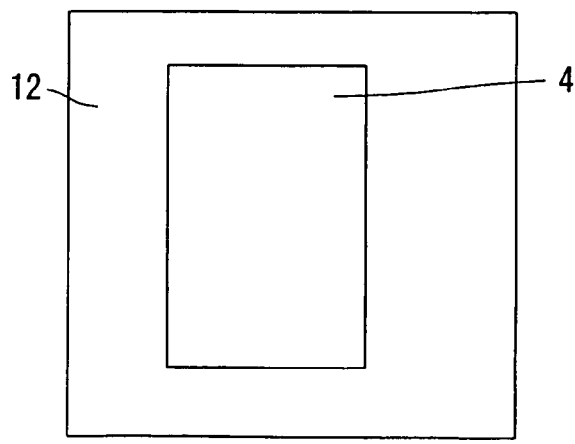

With reference to FIG. 7 and FIG. 8, the following will describe the principle by which the component chip is disposed accurately in the first region of the substrate by evaporation of the first liquid. FIG. 7A to FIG. 7D are schematic cross sectional views taken along the line I-I of FIG. 6A and perpendicular to the component chip. As shown in FIG. 7A, the first liquid 2 on the first region 11 does not spread over to the second region 12. As the first liquid 2 evaporates, the first liquid 2 shrinks within the first region 11. As a result, as shown in FIG. 7B, the component chip 4 protrudes from the first liquid 2. The surfaces of the component chip 4 sticking out of the first liquid 2 are acted upon by the surface tensions F21 (surface tension of the first liquid) in the manner shown in FIG. 7B. The resultant force F22 of the surface tensions F21 acts on the component chip 4 to draw it into the first liquid 2. As the component chip 4 is drawn into the first liquid 2, the first liquid 2 is reduced. As a result, the component chip 4 is disposed accurately in the first region 11, as shown in FIG. 7C and FIG. 7D. FIG. 8A to FIG. 8C are plan views illustrating how this takes place, as viewed from the side of the first principal surface of the substrate. In FIG. 8A, the region where the first liquid 2 is seen is the first region 11. Even with the component chip 4 sticking out of the first liquid 2, the component chip 4 is acted upon by the surface tensions F21 (the surface tension of the first liquid) that draw the component chip 4 into the first liquid 2. The component chip 4 therefore stays in the first liquid 2 and is disposed accurately in the first region 11 as the first liquid 2 is reduced, as shown in FIG. 8B and FIG. 8C. When the longest side of the component chip is 1 mm or less in length, the component chip firmly is fastened to the substrate in the state shown in FIG. 7D or FIG. 8C. Presumably, the force that fastens the component chip to the substrate is the van der Waals force, hydrogen bonding, electrostatic bonding, and the like. It also is presumed that a residual portion of the first liquid may form a liquid film between the component chip and the substrate and the surface tension of this residual liquid may provide the force that fastens the component chip to the substrate.

Figure 9A:
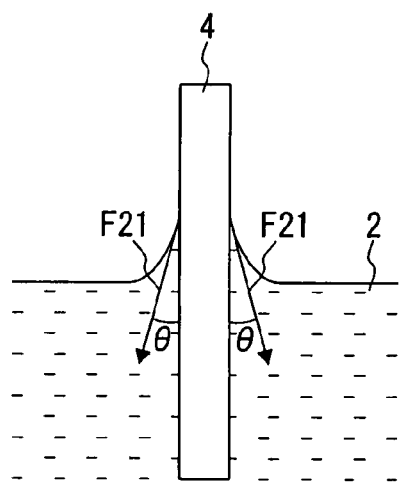
FIG. 9A and FIG. 9B are diagrams depicting the action of surface tension in a mounting method of the present invention.
Figure 9B:
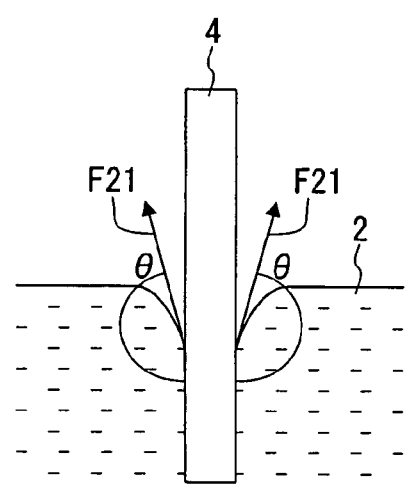
Figure 10A:
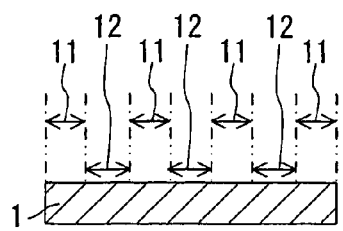
FIG. 10A to FIG. 10G are cross sectional views schematically showing respective steps according to one embodiment of a mounting method of the present invention.
Figure 10B:
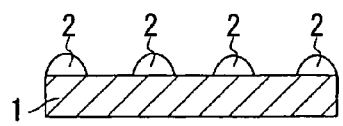
Figure 10C:
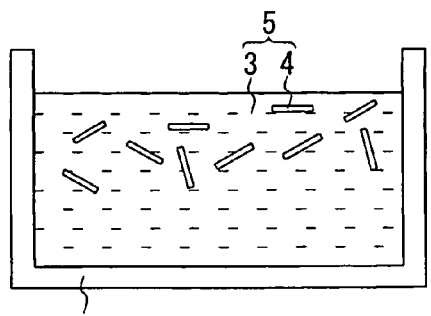
Figure 10D:
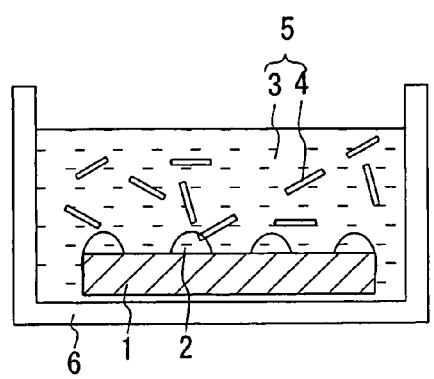
Figure 10E:
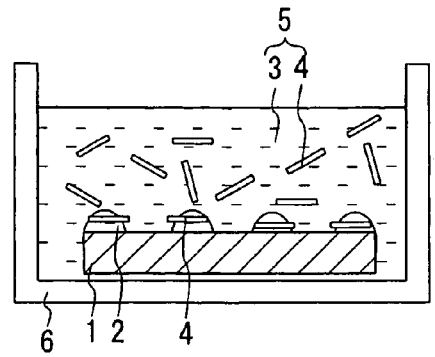
Figure 10F:
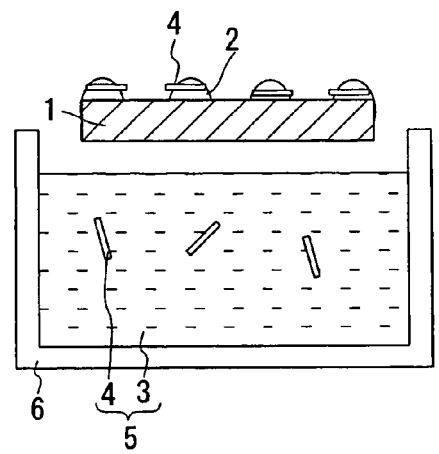
Figure 10G:
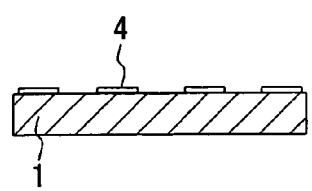

As shown in FIG. 7D and FIG. 8C, accurate placement of the component chip 4 in the first region 11 requires the surface tension that draws the component chip 4 into the first liquid 2 when the component chip 4 protrudes from the first liquid 2. The direction of the surface tension that acts on the component chip 4 sticking out of the first liquid 2 depends on the static contact angle θ of the first liquid with respect to the surface of the component chip 4. The force that acts on the component chip 4 sticking out of the first liquid 2 is described below with reference to FIG. 9A and FIG. 9B. FIG. 9A and FIG. 9B are schematic diagrams illustrating the directions of the surface tensions that act on the component chip 4 sticking out of the first liquid 2 in the atmosphere. When the static contact angle θ of the first liquid 2 with respect to the surface of the component chip 4 is less than 90°, the component chip 4 sticking out of the first liquid 2 in the atmosphere is acted upon by the surface tensions F21 that draw the component chip 4 into the liquid (see FIG. 9A). On the other hand, when the static contact angle θ of the first liquid 2 with respect to the surface of the component chip 4 is greater than 90°, the component chip 4 sticking out of the first liquid 2 is acted upon by the surface tensions F21 that pull the component chip 4 away from the first liquid 2 (see FIG. 9B). It is therefore preferable that the static contact angle of the first liquid 2 with respect to the surface of the component chip 4 be less than 90°, and more preferably no greater than 80°.

The force that draws the component chip into the first liquid will be greater as the static contact angle of the first liquid with respect to the surface of the component chip becomes smaller, or as the surface tension of the first liquid becomes greater. In order to allow the component chip to be accurately disposed in a predetermined position on the substrate, it is important to appropriately select a first liquid, taking into consideration the surface tension of the first liquid and the surface energy of the component chip.

The component chip can be disposed accurately in the first region in this manner. The component chip can be disposed on the substrate according to the foregoing method even when more than one first region is formed on the first principal surface of the substrate. That is, a plurality of component chips simultaneously can be disposed on the substrate. FIG. 10A to FIG. 10G illustrate how a plurality of component chips are simultaneously mounted on a substrate having more than one first region, using the mounting method of the present embodiment. Note that, the steps of FIG. 10A to FIG. 10G respectively correspond to the steps of FIG. 1A to FIG. 1G, and no specific explanation will be given below for these steps because these steps were already described with reference to FIG. 1A to FIG. 1G. Note that, the foregoing description concerning FIG. 7A to FIG. 7D and FIG. 8A to FIG. 8C has been directed to the case where the component chip exists inside the first liquid. However, conceivably, the component chip also will be disposed in the first region in a similar fashion by the action of the surface tension of the first liquid, even when the component chip exists, for example, at the surface of the first liquid.

Figure 2A:
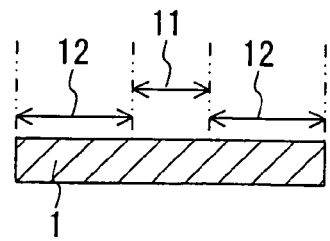
FIG. 2A to FIG. 2G are cross sectional views schematically showing respective steps according to one embodiment of a mounting method of the present invention.
Figure 2B:
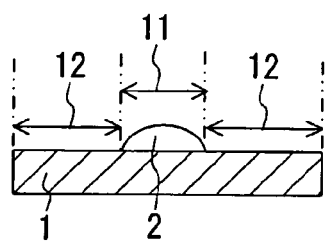
Figure 2C:
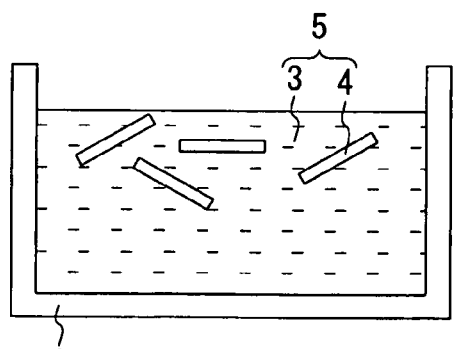
Figure 2D:
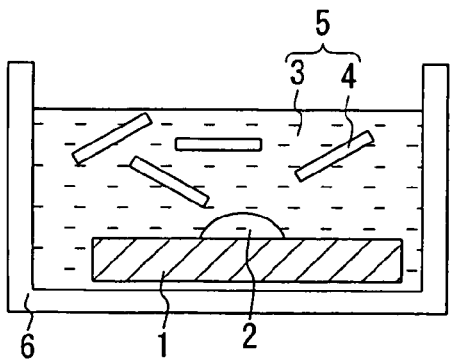
Figure 2E:
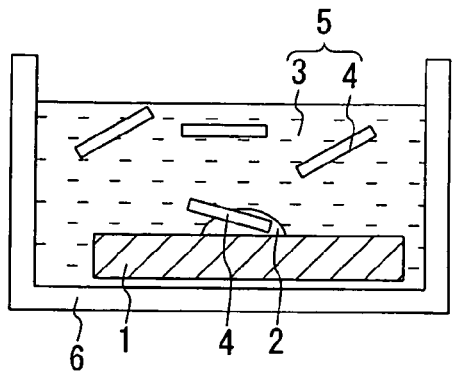
Figure 2F:
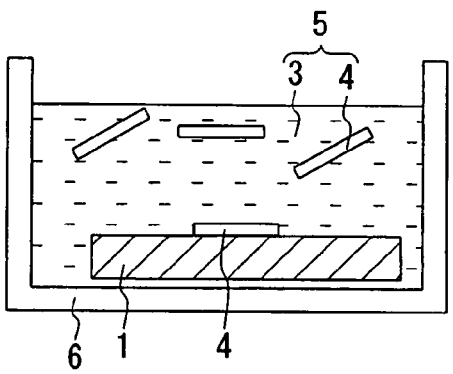
Figure 2G:
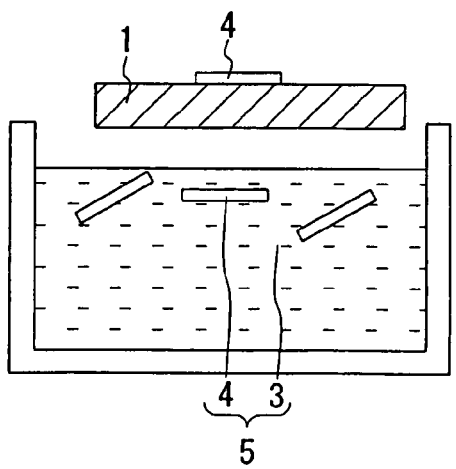

In addition to the method described with reference to FIG. 1A to FIG. 1G, the method depicted in FIG. 2A to FIG. 2G also can be used to dispose the component chip on the substrate. This method proceeds in the same way as the method shown in FIG. 1A to FIG. 1E up to the entry of the component chip into the first liquid. However, these methods differ in the order of removing the first liquid and the second liquid in the subsequent steps. Specifically, after the component chip 4 has entered the first liquid 2 as shown in FIG. 2A to FIG. 2E, the first liquid 2 is removed in the member-containing liquid 5 to dispose the component chip 4 on the substrate 1 as shown in FIG. 2F. Thereafter, as shown in FIG. 2G, the substrate 1 is taken out of the member-containing liquid 5 to remove the second liquid 3 from the first principal surface of the substrate 1. Even when the first liquid is substantially undissolvable in the second liquid, the first liquid may gradually dissolve into the second liquid when these liquids are in contact with each other for an extended time period. Though the first liquid is removed in the member-containing liquid, the component chip can be disposed in a predetermined position of the substrate by the same principle as when the first liquid is removed in the atmosphere. FIGS. 6A and 6B, FIGS. 7A to 7D, FIGS. 8A to 8C, and FIGS. 9A and 9B all depict the placement of the component chip on the substrate that takes place by the evaporation of the first liquid into the atmosphere. These figures can be seen as diagrams that depict the placement of the component chip on the substrate in the member-containing liquid, when the atmosphere is regarded as the member-containing liquid, and when the surface tension of the first liquid is regarded as the interface tension that acts on the contact face of the first liquid and the member-containing liquid. Upon removal of the first liquid, the component chip is fastened to the substrate in the member-containing liquid. When the longest side of the component chip is 1 mm or less in length, the component chip can be fastened firmly to the substrate. The force that fastens the component chip and the substrate together is assumed to be the van der Waals force, hydrogen bonding, electrostatic bonding, and the like. When a residual portion of the first liquid forms a liquid film between the component chip and the substrate, the surface tension of this residual liquid may provide the force that fastens the component chip to the substrate. In this case, the first liquid is removed gradually after the component chip has moved to the first liquid, until an appropriate amount of first liquid necessary to fasten the component chip to the substrate finally remains at the contact face of the component chip and the substrate. As a result, the component chip is fastened to the substrate with good reproducibility.

The component chip also can be disposed on the substrate in a similar fashion when more than one first region is formed on the first principal surface of the substrate. That is, a plurality of component chips simultaneously can be disposed on the substrate.

The first liquid also may be removed by first removing only a part of the first liquid in the member-containing liquid, and then removing the second liquid before finally removing the remaining part of the first liquid. The component chip also can be disposed in a predetermined position of the substrate in this manner. As in the foregoing case, the component chip can be disposed on the substrate in a similar fashion even when more than one first region is formed on the first principal surface of the substrate. That is, a plurality of component chips simultaneously can be disposed on the substrate.

Which of the first liquid and the second liquid to remove first after the component chip has entered the first liquid is decided by the combination of the first liquid and the second liquid, or by the duration or manner in which the first liquid is exposed to the second liquid. In either case, the component chip is disposed on the substrate.

The following will describe a fabrication method of the component chip.

Figure 11A:
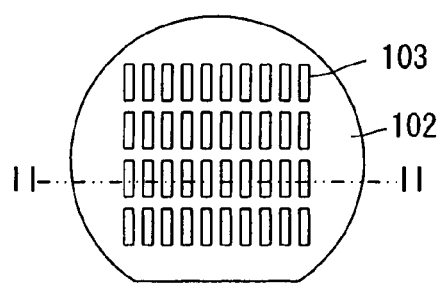
FIG. 11A to FIG. 11D are diagrams showing fabrication steps of a component chip.
Figure 11C:
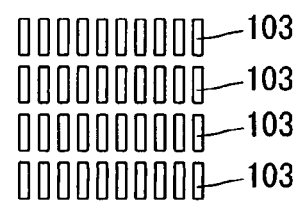
Figure 11B:
Figure 11D:
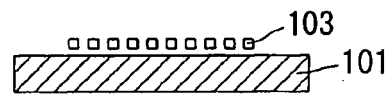

The fabrication method of the component chip is not particularly limited, and conventional methods may be used. The following describes examples of the fabrication method of the component chip with reference to FIG. 11A to FIG. 11D, and FIG. 12A to FIG. 12C. FIG. 11A and FIG. 11C are top views. FIG. 11B and FIG. 11D are cross sectional views.

First, as shown in FIG. 11A and FIG. 11B which is a cross sectional view taken along the line II-II of FIG. 11A, a plurality of electronic devices 103 are formed on a substrate 101 provided with a layer 102 on one of its surfaces. The layer 102 is selectively removable. Then, as shown in FIG. 11C and FIG. 11D, the layer 102 is removed to separate the electronic devices 103 into individual elements. As a result, a plurality of component chips is formed, each including a single electronic device 103. The component chips so obtained are dispersed in the second liquid to obtain the member-containing liquid.

Figure 12A:
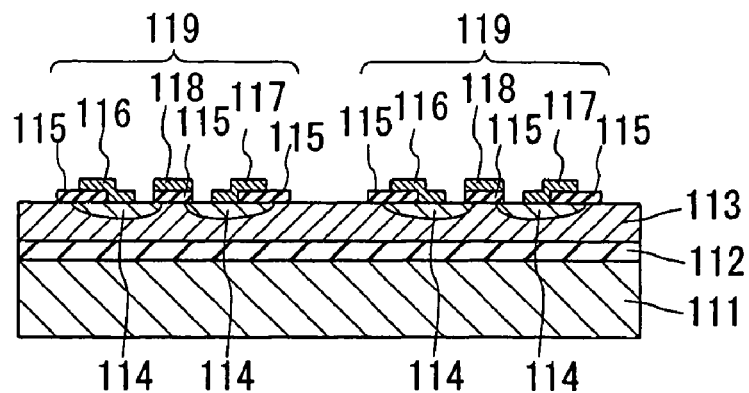
FIG. 12A to FIG. 12C are cross sectional views showing fabrication steps of a silicon monocrystalline transistor.
Figure 12B:
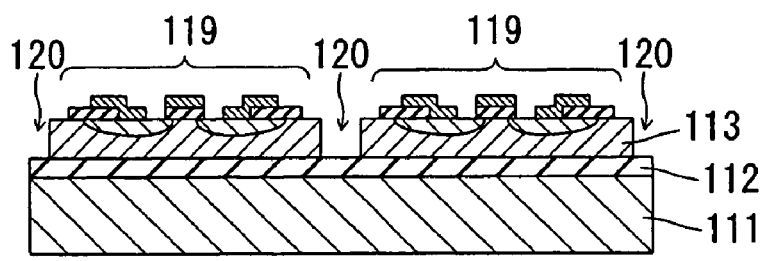
Figure 12C:
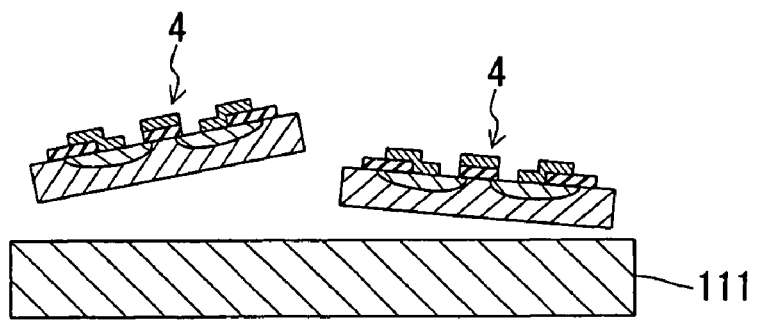

The cross sectional views of FIG. 12A to FIG. 12C illustrate a case where the electronic device is a MOS field-effect transistor (FET). FIG. 12A to FIG. 12C show only a portion of a wafer. First, a monocrystalline silicon substrate 111 is prepared that has been provided with an oxide film 112 in regions of a certain depth in the vicinity of the surface. Then, a plurality of FETs 119 are formed on a surface of an n-type silicon 113 provided over the surface of the substrate 111 (see FIG. 12A). Specifically, there are formed a boron-doped p-type region 114, a thermally-oxidized film 115, a source electrode 116, a drain electrode 117, and a gate electrode 118.

Next, a trench 120 is formed that separates the FETs 119. The trench 120 is formed so that it reaches the oxidized film 112 (see FIG. 12B). The trench 120 may be formed by a photolithography/etching process.

Finally, as shown in FIG. 12C, the oxidized film 112 is etched selectively, for example, with hydrofluoric acid to separate the FETs into individual transistors. As a result, the component chips 4 are obtained, each including the FET.

The method of forming the component chip including an electronic device such as the monocrystalline silicon transistor is not particularly limited and other methods may be used as well. For example, after the transistors are formed on the monocrystalline silicon wafer, the back side of the wafer partially may be removed away to reduce the thickness, and the wafer subsequently may be cut with a dicer. The partial removal on the back side of the wafer may be performed by grinding and/or etching.

The following describes the first region and the second region in more detail.

In the present embodiment, as shown in FIG. 3A, the first region 11, more wettable to the first liquid than the second region 12, is surrounded by the second region 12 on the substrate 1. By the provision of the first region 11 and the second region 12 in the above mentioned manner, the first liquid 2 disposed in the first region 11 does not spread out from the first region 11 and occupies only the region where the first region 11 is provided, as shown in FIG. 3B. Thus, the contact face of the first liquid 2 and the substrate 1 generally matches the planar shape of the first region 11.

The second region 12 may be formed, for example, by forming an organic film having small wettability to the first liquid (may be referred to as "liquid-repelling film" hereinafter) on the substrate. For example, such an organic film may be a polymer film having fluoroalkyl chains, a film formed from a silane coupling agent or thiol molecules having fluoroalkyl chains, an organic-inorganic hybrid film that has been prepared to include fluoroalkyl chains using a sol-gel method, or the like. These films have a surface energy of about 20 $mJ/m^2$, and the property of repelling the liquid used as the first liquid.

Figure 13A:
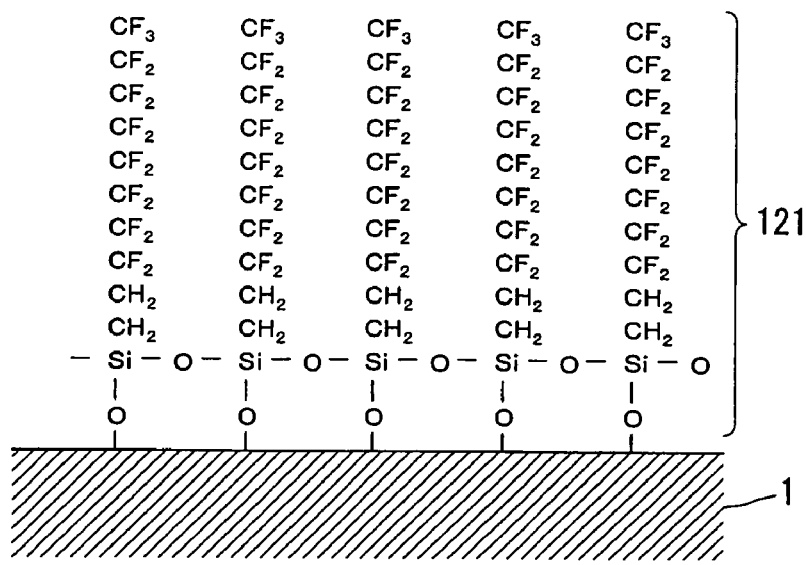
FIG. 13A and FIG. 13B are diagrams schematically showing a configuration of a liquid-repelling organic thin film provided on a substrate in mounting method of the present invention.

Examples of a polymer film having fluoroalkyl chains include polytetrafluoroethylene, polydifluoroethylene, and derivatives thereof. When the silane coupling agent is used to form the liquid-repelling film (water-repellant film when water is used as the first liquid), the substrate may be immersed for a certain time period in a solution of chloroform, alkane, alcohol, or silicone oil in which the silane coupling agent having fluoroalkyl chains is dissolved at a concentration of several vol %. In this case, the substrate that has been immersed in the solution subsequently may be washed with a solvent to form a monomolecular film. The substrate that allows for the formation of the liquid-repelling film is preferably a substrate that includes active hydrogen on its surface. Examples of such a substrate include substrates made of silicon oxide, silicon nitride, stainless steel, copper, nickel, surface-activated resin, and the like. FIG. 13A schematically illustrates an exemplary structure of a liquid-repelling monomolecular film that has been formed with a silane coupling agent. A monomolecular film 121 shown in FIG. 13A is bonded to the substrate 1 via siloxane bonds (Si—O).

Figure 13B:
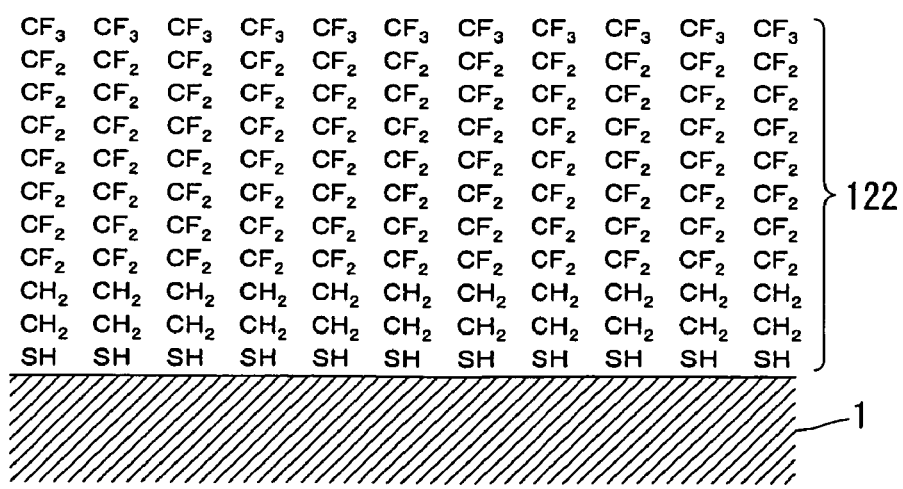

When thiol molecules are used to form the liquid-repelling film, the substrate may be immersed for a certain time period in an ethanol or propanol solution in which thiol molecules having fluoroalkyl chains are dissolved at a concentration of several vol %, followed by washing with an alcohol. As a result, a liquid-repelling monomolecular film is formed. The substrate that allows for the formation of such monomolecular films may be, for example, a substrate made from a metal such as gold, silver, or copper. FIG. 13B schematically illustrates an exemplary structure of a liquid-repelling monomolecular film that has been formed using thiol molecules. A monomolecular film 122 shown in FIG. 13B is bonded to the substrate 1 via the SH group.

When the liquid-repelling film is formed by a sol-gel method, an alcohol solution of tetraethoxysilane (a precursor of silicon oxide), alkoxide having fluoroalkyl chains, acid catalyst, and water may be applied over the substrate by a spin coating method or a dipping method, followed by a heat treatment at or above 100° C. The liquid-repelling film formed this way can be formed on nearly all kinds of substrates.

The first region surrounded by the second region may be formed from a liquid-attracting substrate or a substrate that has been rendered liquid-attractive, by forming a liquid-repelling film in a region that forms the second region. For example, a portion of the substrate where liquid-attraction is required is covered with a protective film such as a resist. Then, a liquid-repelling film is applied over the entire surface of the substrate. By subsequently removing the protective film, the liquid-repelling film formed over the first region is removed. This method is applicable when the film is formed using a silane coupling agent or a sol-gel method. Alternatively, a portion of the substrate to be the second region may be provided as a surface that specifically adheres only to the liquid-repelling film, and the liquid-repelling film may be formed only on this portion of the substrate to be the second region. For example, a metal pattern that reacts with only thiols is formed only on a portion of the substrate where liquid repellency is required, and the substrate is immersed in an organic solvent dissolving thiols therein. In this way, only the metal region can be rendered liquid-repellent.

Further, the liquid-repelling film may be formed directly in the predetermined region using methods such as an ink-jet method, a screen printing method, relief printing, intaglio printing, and microcontact printing.

The liquid-attracting first region also may be formed using inorganic materials. For example, because the silicon substrate is more liquid-repelling than silicon oxide, patterns of a silicon oxide film may be formed on the surface of the silicon substrate to provide this portion of silicon oxide film as the first region. According to this configuration, the first liquid can be disposed only on the patterns of a silicon oxide film. The silicon oxide film may be formed, for example, by depositing a film of silicon oxide by a plasma CVD method, or by oxidizing the surface of the silicon substrate by a corona discharge or plasma process in the atmosphere of oxygen. Silicon oxide has a surface energy of 100 $mJ/m^2$ or greater, and silicon has a surface energy of about 38 $mJ/m^2$.

With the liquid-attracting first region surrounded by the liquid-repelling second region, the first liquid accurately can be disposed in the first region. This allows for accurate placement of the component chip in the first region. According to this method, the component chip accurately can be disposed on the substrate without forming openings in the substrate.

Second Embodiment

In the Second Embodiment below, the description is directed to a fabrication method of an electronic instrument of the present invention, and a display device fabricated by the fabrication method, with reference to the drawings. The following description of the present embodiment will be given based on a fabrication method of a display device, or more specifically a liquid crystal display, as an example of the electronic instrument. It should be noted that the present invention is not limited by the following description.

Figure 14:
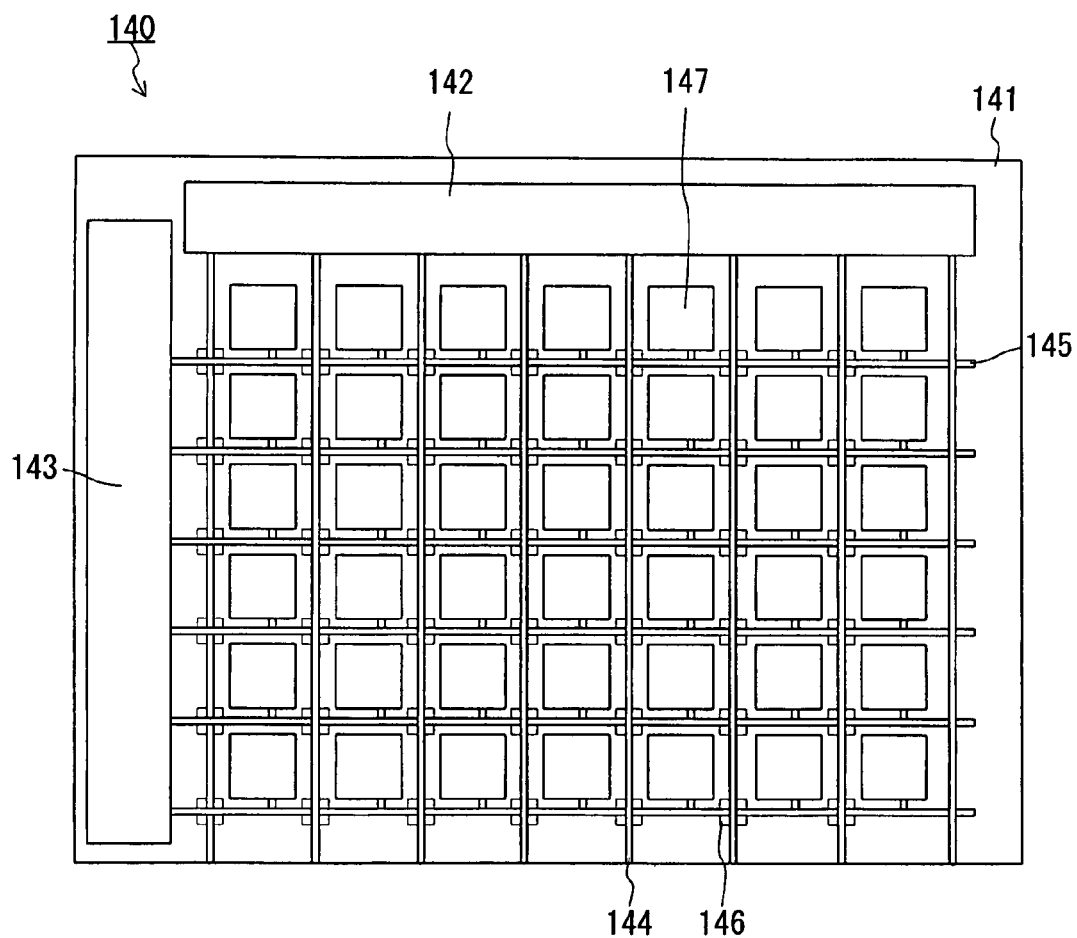
FIG. 14 is a plan view schematically showing a liquid crystal display as one embodiment of a display device of the present invention.

FIG. 14 schematically illustrates a partial configuration of a liquid crystal display 140 as an electronic instrument of the present embodiment.

The liquid crystal display 140 includes a glass substrate 141, an X driver 142, a Y driver 143, X scanning electrodes 144, Y scanning electrodes 145, transistor chips (component chips) 146, and pixel portions 147. The transistor chips 146 are monocrystalline silicon transistors.

The pixel portions 147 are controlled by the transistor chips 146 provided in the vicinity. A voltage for driving the pixel portions 147 is applied to the source or drain electrodes of the transistors, from the Y driver 143 via the Y scanning electrodes 145. To the gate electrodes, a video signal voltage is applied from the X driver 142 via the X scanning electrodes 144. The transistors that have received the video signal voltage apply a voltage to pixel electrodes (not shown) provided below the pixels. Though not shown, transparent electrodes are provided above the pixel electrodes via a liquid crystal layer and alignment films. The applied voltage to the pixel electrodes is sent to the liquid crystal layer to vary the transmissivity of the light passing through the liquid crystal layer.

Figure 15:
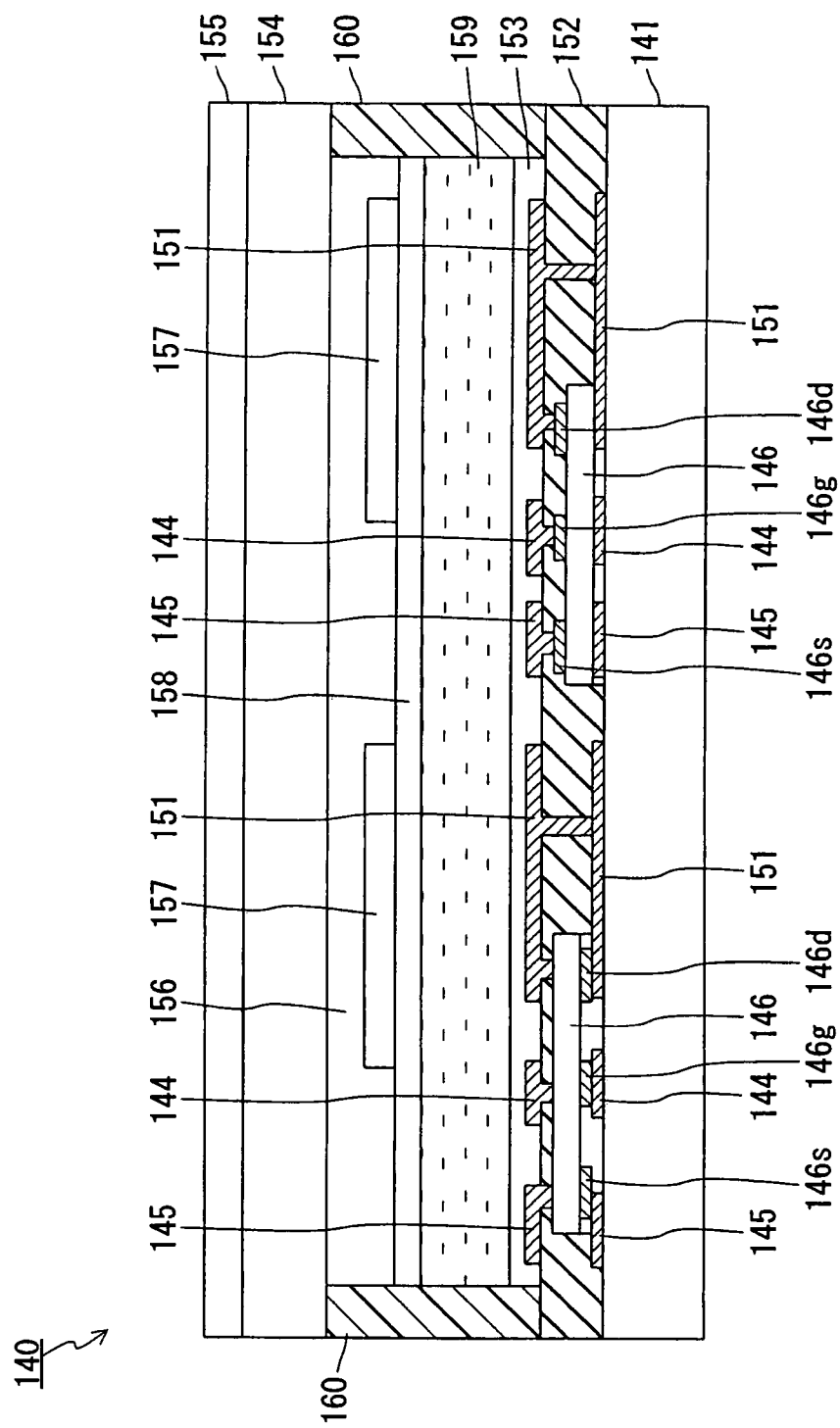
FIG. 15 is a cross sectional view schematically showing a liquid crystal display as one embodiment of a display device of the present invention.

An example of a fabrication method of the liquid crystal display 140 is described below. FIG. 15 is a schematic cross sectional view showing the liquid crystal display 140 in portions in the vicinity of two pixels. The steps other than disposing the transistor chips on the substrate can be performed by common methods. The liquid crystal display 140 fabricated by the method below is merely an example, and the size and other properties of each component are not just limited to the ones described below.

First, the X scanning electrodes 144, the Y scanning electrodes 145, and pixel electrodes 151 are formed by a photolithography method on the glass substrate 141 measuring 50 cm×50 cm in size and 1 mm in thickness. Copper is used as the electrode material, and the electrodes have a thickness of 50 nm. The X scanning electrodes 144 and the Y scanning electrodes 145 each have a line width of 2 µm. Each pixel electrode 151 is 100 µm×100 µm in size.

The X scanning electrodes 144 and the Y scanning electrodes 145 are formed in a grid pattern as shown in FIG. 14. An insulating film (not shown) is formed at each intersection of the X scanning electrodes 144 and the Y scanning electrodes 145. The insulating film is provided to insulate these electrodes from each other. The insulating film may be made from silicon nitride or silicon oxide. Then, the transistor chips 146 are disposed. Each transistor chip 146 has the structure shown in FIG. 12C. In the present embodiment, the source electrode and the drain electrode are described as though they are distinct members; however, these two kinds of electrodes may function as either a source electrode or a drain electrode, depending on whether the other is a source electrode or a drain electrode.

FIG. 16F schematically illustrates positions of the electrodes on the transistor chip 146. The transistor chip 146 is a plate-like member, measuring 20 µm×50 µm in size and 5 µm in thickness. The transistor has a channel length of 10 µm and a channel width of 40 µm. A source electrode 146s, a drain electrode 146d, and a gate electrode 146g are formed on one surface of the transistor.

As shown in FIG. 15, the electrodes are formed so that the gate electrode 146g of the transistor corresponds to the X scanning electrodes 144, and the source electrode 146s and the drain electrode 146d correspond to the Y scanning electrodes 145 and the pixel electrodes 151, respectively.

When a mounting method of the present invention is used to mount the transistor chip 146, the surface with the electrode terminals may be facing downward or upward with respect to the glass substrate 141. For example, referring to FIG. 15, the transistor chip 146 on the left-hand side has the electrode terminals on the surface facing the glass substrate 141, whereas the transistor chip 146 shown on the right-hand side is upside down. Thus, at the time when the transistor chip 146 is disposed on the glass substrate 141, no interconnections are made to the transistor chip 146 shown on the right-hand side. The transistor chips 146 with such an orientation are wired after they are positioned.

After the transistor chips 146 have been disposed, a planarizing layer 152 is formed over the entire surface of the substrate. Then, to provide interconnections to the electrodes of the transistor chips 146, through-holes are formed in the planarizing layer 152. The planarizing layer 152 is required to provide interconnections to the transistor chips 146 having a thickness of 5 µm. The planarizing layer 152 also serves to anchor the transistor chips 146 on the substrate 141. As the material of the planarizing layer 152, a heat-curable polymer material, an ultraviolet-curable polymer material and a sol-gel film that is formed of metal alkoxide may be used, for example. Polymer materials that can be processed by photolithography, for example, such as light-curable polyimide, are particularly preferable. Because of the poor adhesion between the transistor chips 146 and the glass substrate 141 prior to the formation of the planarizing layer 152, the planarizing layer 152 desirably should be formed by spray coating, for example.

Next, the X scanning electrodes 144, the Y scanning electrodes 145, and the pixel electrodes 151 are formed on the planarizing layer 152. The electrode patterns of these electrodes on the planarizing layer 152 match the copper electrode patterns formed on the glass substrate 141, and these electrode patterns are connected to each other electrically at the sides of the glass.

The electrodes on the planarizing layer 152 are connected, via the through-holes, to the source electrodes 146s, the drain electrodes 146d, and the gate electrodes 146g of the transistor chips whose electrode terminals are facing up. As described above, according to the fabrication method of this embodiment, the transistor chip 146 can be interconnected regardless of whether the electrode terminal side of the transistor chip 146 is facing upward or downward with respect to the glass substrate 141.

Next, an alignment film 153 is formed. Separately, a polarizing plate 155, transparent electrodes 156, a color filter 157, and an alignment film 158 are formed on a glass substrate 154. The glass substrate 141 and the glass substrate 154 are mated together with a spacer therebetween. Then, the space between the glass substrate 141 and the glass substrate 154 is filled with a liquid crystal 159 and sealed with a sealant 160. As a result, the liquid crystal display 140 is obtained.

In the following, description is made as to an example of a mounting method in which the transistor 146 shown in FIG. 16F is mounted on the glass substrate 141. FIG. 16A to FIG. 16E schematically show steps of mounting the transistor chip 146.

First, as shown in FIG. 16A, the X scanning electrodes 144, the Y scanning electrodes 145, and the pixel electrodes 151 are formed on the glass substrate 141 by a photolithography method. These electrodes are formed into such shapes as to be connectable to the source electrode 146s, the drain electrode 146d, and the gate electrode 146g formed on the surface of the transistor chip 146 to be disposed on the glass substrate 141.

Next, a liquid-attracting region (first region) 162 and a liquid-repelling region (second region) 161 are formed, the former being provided as a region where the transistor chip 146 is disposed, and the latter surrounding the region 162. The regions 161 and 162 may be formed according to the following method.

First, the entire portion of the glass substrate 141 that has been provided with the electrodes is irradiated with ultraviolet light in an ozone atmosphere to render the surface of the glass substrate 141 and the surfaces of the electrodes liquid-attractive. This process increases the surface energy of the glass surface to 100 mJ/m² or greater. Then, the portion of the substrate other than the region where liquid repellency is required is covered with a positive resist film. The glass substrate is then immersed in a perfluorooctane solution, dissolving 1 vol % $CF_3(CF_2)_7C_2H_4SiCl_3$ therein, for 20 minutes in a dry atmosphere. Thereafter, the glass substrate is washed with pure perfluorooctane and the solvent is removed. This is followed by removal of the positive resist film. As a result, the region that was not covered with the resist film is obtained as the liquid-repelling region 161. The liquid-repelling region 161 has a surface energy of 19 mJ/m², for example.

Figure 20:
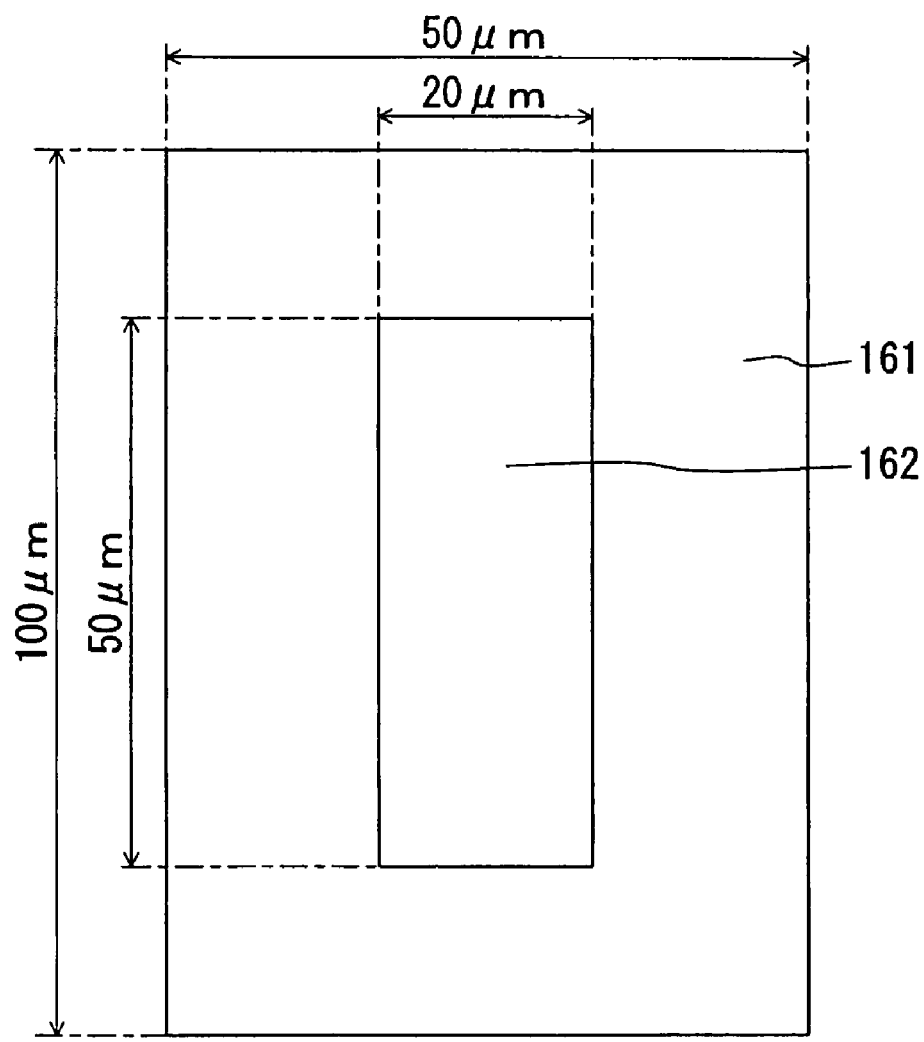
FIG. 20 is a plan view schematically showing a first region surrounded by a second region in a mounting method of the present invention.

FIG. 20 illustrates exemplary shapes of the liquid-repelling region 161 and the liquid-attracting region 162. The region 161 has been formed to surround the region 162. In FIG. 20, the electrodes on the substrate are omitted. However, the electrodes on the substrate corresponding to the source electrode and drain electrode of the transistor chip are provided over the region 161 and the region 162. That is, the surfaces of these electrodes have both liquid-attracting and liquid-repelling portions. The surfaces of the copper electrodes are liquid-attracting when clean. However, these liquid-attracting surfaces can be rendered liquid-repellent by causing the surfaces to react with a silane coupling agent and forming a liquid-repelling monomolecular film. Thus, by causing a silane coupling agent to react with only a predetermined region of the copper electrode surfaces, the copper electrodes can have both a liquid-repelling region and a liquid-attracting region.

Next, purified water is disposed as the first liquid in the liquid-attracting region 162. The purified water is disposed using an injector (ink-jet device). As the injector, those used as an ink-jet printer for printing may be used. The injector includes a head for injecting a micro liquid droplet, a mechanism for controlling relative positions of the head and the substrate, and a mechanism for controlling the timing of injecting a liquid droplet according to the relative motions of the head and the substrate, so that the liquid droplet is injected on a predetermined position of the substrate. The head has large numbers of nozzle holes each with a diameter of several ten micrometers. A micro liquid droplet, several ten micrometers in diameter, is injected onto the substrate through these nozzle holes. The distance between the nozzle holes and the substrate is 1 mm or less. In this embodiment, the head has nozzle holes with a diameter of 20 µm, and a droplet of purified water having a diameter of 17 µm is disposed on the region 162 of the substrate by moving the substrate and the head relative to each other with a maintained gap of 0.5 mm therebetween. The liquid droplet is disposed in an atmosphere with a relative humidity of 95% or greater to less than 100%. In such an atmosphere, the liquid droplet that has been disposed on the substrate does not easily volatilize and stays on the substrate stably for extended time periods.

Immediately after the liquid droplet has been disposed on the substrate, the substrate is immersed in a member-containing liquid (a liquid with the transistor chips dispersed in toluene (second liquid)) that has been prepared beforehand in a container. Here, the substrate is immersed with the liquid droplet side facing up. This procedure is also performed in an atmosphere with a relative humidity of 95% or greater to less than 100%. In order to disperse the transistor chips uniformly in toluene, the toluene liquid desirably should be stirred.

Thereafter, the substrate 141 is taken out of the toluene and immediately immersed in toluene (third liquid) with no transistor chips. This procedure is also performed in an atmosphere with a relative humidity of 95% or greater to less than 100%. It is desirable to stir the toluene also in this case. As a result of this procedure, the silicon chips that have adhered to regions other than the region of the first liquid are removed.

The substrate is then taken out of the toluene and placed in an atmosphere with a relative humidity of 50% to 80%. This causes the first liquid on the substrate 141 to volatilize and as a result the silicon chip is disposed in the region 162. This is followed by the formation of the planarizing layer 152 and the electrodes (FIG. 16D and FIG. 16E), as described above. The transistor chip is mounted in this manner.

Third Embodiment

In the Third Embodiment below, the description is directed to a fabrication method of an electronic instrument of the present invention, and a display device fabricated by the fabrication method, with reference to the drawings. The description of the present embodiment will be given based on a fabrication method of a display device, or more specifically an organic electroluminescence display (organic EL display) as an example of an electronic instrument. The present invention is not limited by the following description.

Figure 17:
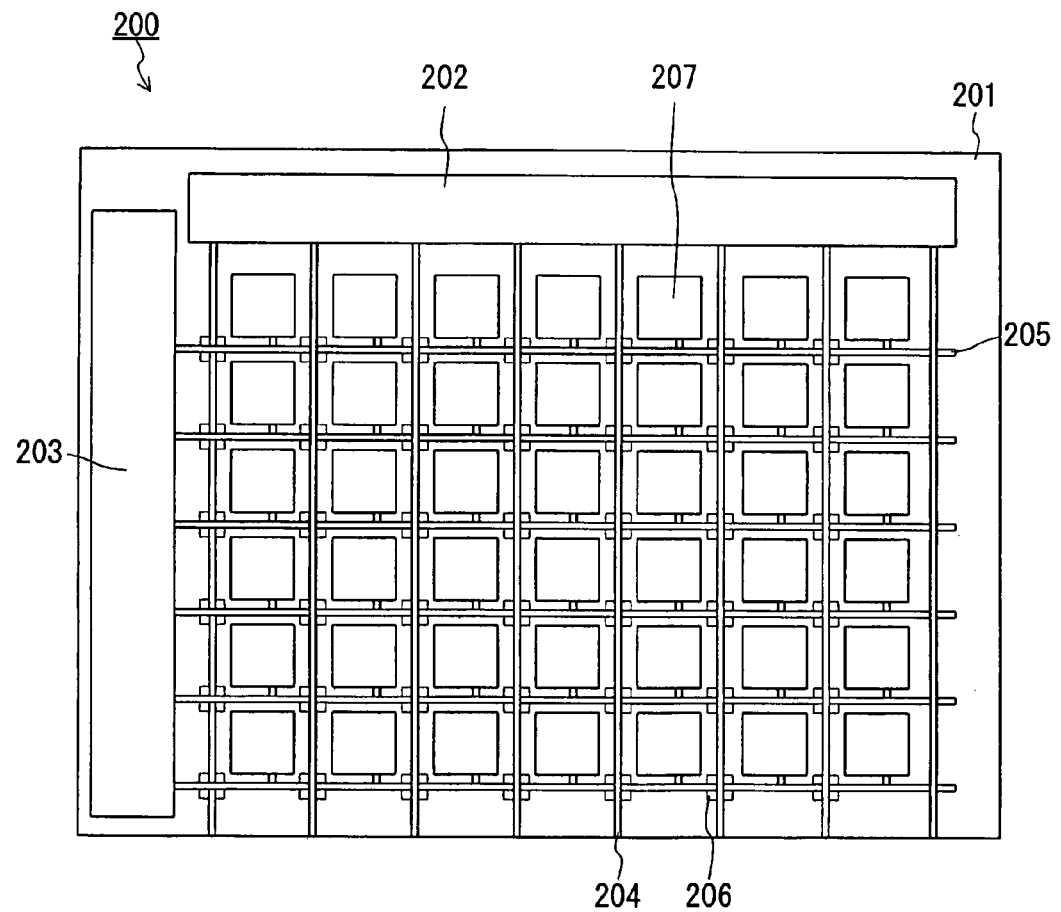
FIG. 17 is a plan view schematically showing an organic EL display as one embodiment of a display device of the present invention.

FIG. 17 schematically illustrates a configuration of an organic EL display 200 of the present embodiment.

The organic EL display 200 includes a substrate 201 made of polycarbonate, an X driver 202, a Y driver 203, X scanning electrodes 204, Y scanning electrodes 205, component chips 206 and pixel portions 207. The component chips 206 each include a crystalline silicon transistor circuit. The pixel portions 207 include organic EL material, and are controlled by the transistor circuits of the component chips 206.

Figure 18A:
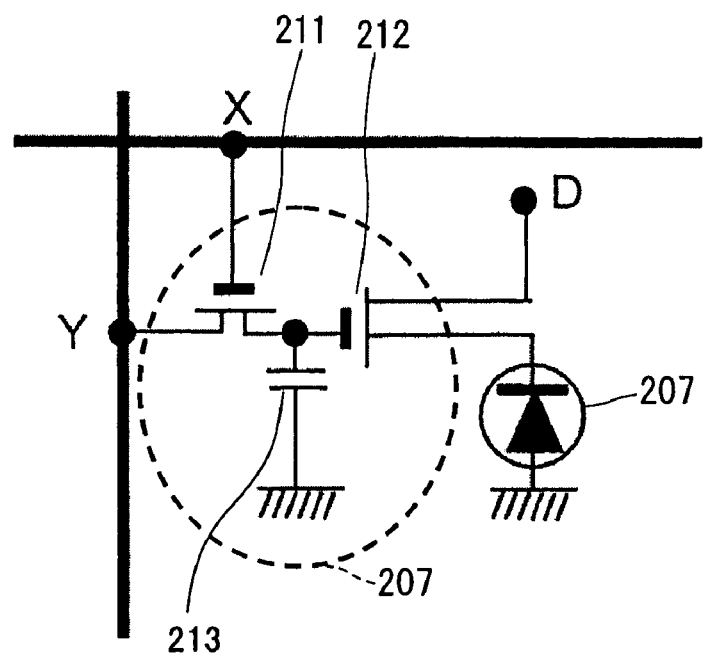
FIG. 18A is a circuit diagram of a pixel driving transistor for an organic EL display as one embodiment of a display device of the present invention.

FIG. 18A is a circuit diagram of the transistor circuit that controls the pixel portion 207. The circuit includes a switching transistor 211, a driver transistor 212, and a capacitor 213. The pixel portion 207 is controlled by the switching transistor 211 and the driver transistor 212. To the source electrode of the switching transistor 211, a voltage is applied from the Y driver 203 via the Y scanning electrodes 205. The drain electrode of the transistor 211 and the gate electrode of the transistor 212 are connected electrically to each other. The drain electrode of the driver transistor 212 is connected electrically to the pixel electrode (not shown in FIG. 17) disposed below the pixel portion 207. To the source electrode of the driver transistor 212, a voltage is applied that causes the pixel to emit light. To the gate electrode of the switching transistor 211, a video signal (voltage) is applied from the X driver 202 via the X scanning electrodes 204.

In response to the video signal voltage applied to the switching transistor 211, the transistor 211 applies a voltage to the gate electrode of the driver transistor 212. The applied voltage to the driver transistor 212 is sent to the pixel electrodes. Though not shown in FIG. 17, transparent electrodes are disposed above the pixel portions 207. Thus, the applied voltage to the pixel electrodes causes the pixel portions 207 to emit light.

Figure 18B:
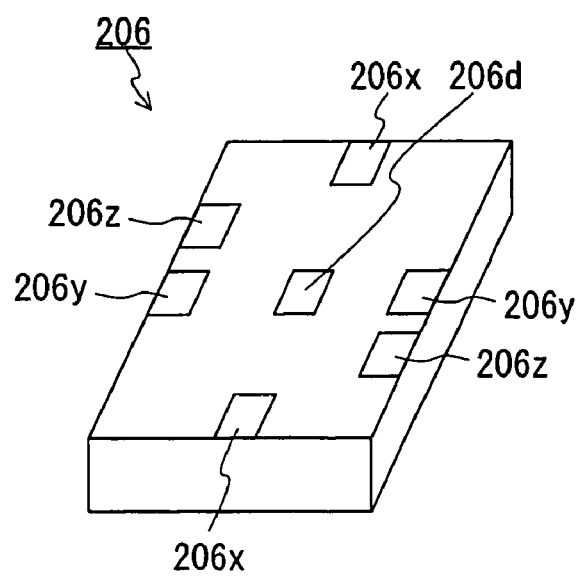
FIG. 18B is a perspective view showing a monocrystalline silicon transistor used for the organic EL display.

FIG. 18B shows a schematic perspective illustration of the component chip 206. The component chip 206 is monocrystalline silicon in the shape of a plate. The component chip 206 measures 50 µm in length, 20 µm in width, and 5 µm in thickness, for example. On one of the surfaces of the component chip 206 are formed two electrode terminals 206x, two electrode terminals 206y, two electrode terminals 206z, and one electrode terminal 206d. The surface with these electrode terminals has half-rotational symmetry. With the component chip 206 disposed on an organic EL display substrate, the electrodes 206x, the electrodes 206y, the electrodes 206z, and the electrode 206d are electrically connected to the X scanning electrodes, the Y scanning electrodes, the pixel electrodes, and driver electrodes, respectively, so as to drive the display.

Figure 19:
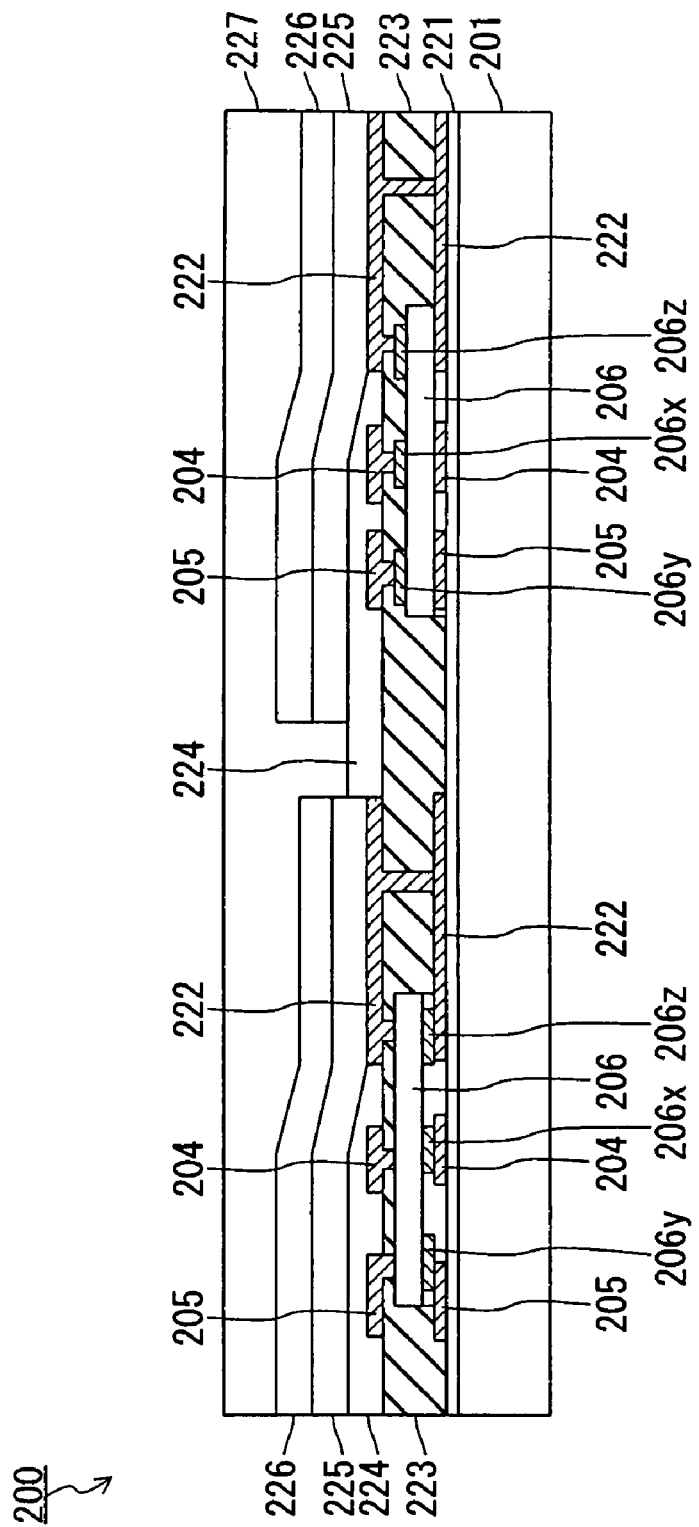
FIG. 19 is a cross sectional view schematically showing an organic EL display as one embodiment of a display device of the present invention.

The following describes an example of a fabrication method of the organic EL display. FIG. 19 is a cross sectional view illustrating the organic EL display 200 of the present invention. FIG. 19 shows only portions of the display in the vicinity of two pixels. The steps other than disposing the component chips on the substrate can be performed by common methods.

First, a silicon oxide film 221 is formed on the polycarbonate substrate 201 measuring 50 cm×50 cm in size and 1 mm in thickness. Next, on the silicon oxide film 221 are formed the X scanning electrodes 204, the Y scanning electrodes 205, pixel electrodes 222, and driver electrodes (not shown) for applying a voltage to the driver transistors. These electrodes are formed by a photolithography method. Copper is used as the electrode material, and the electrodes are formed in a thickness of 50 nm. The X scanning electrodes 204, the Y scanning electrodes 205, and the driver electrodes each have a line width of 2 μm. The pixel electrodes 222 measure 100 μm×100 μm in size. An insulating film (not shown) is formed at each intersection of the X scanning electrodes 204, the Y scanning electrodes 205, and the driver electrodes to insulate the electrodes from each other. The insulating film may be made from silicon nitride or silicon oxide.

Then, according to the method described in the Second Embodiment, the regions of the substrate 201 where the component chips 206 are to be disposed are rendered liquid-attractive, and the regions surrounding these liquid-attracting regions are rendered liquid-repellent. The liquid-repelling regions can have a surface energy of about 20 dyne/cm, and the liquid-attracting regions can have a surface energy of at least 60 dyne/cm. The component chips 206 whose surfaces have been subjected to the liquid-attracting treatment then are disposed in predetermined positions according to the mounting method described in the Second Embodiment.

The surface energy of the component chip 206 can be increased to 50 mJ/m$^2$ or greater by the liquid-attracting treatment. As in the Second Embodiment, the electrode terminal side of the component chip 206 may face downward or upward with respect to the substrate 201. The electrode terminals of the component chip 206 shown on the left-hand side of FIG. 19 are facing the substrate 201, whereas the component chip 206 on the right-hand is upside down. Thus, while the component chip 206 on the left-hand side of FIG. 19 is connected to the electrodes formed on the substrate, the component chip 206 on the right-hand side of FIG. 19 is connected to the electrodes in subsequent steps. Note that, the surface of the component chip 206 with the electrode terminals has half-rotational symmetry, and therefore the electrode terminals can be connected electrically to the electrode pattern of the substrate regardless of whether the component chip 206 is oriented in which symmetrical position.

After the component chips 206 have been disposed, a planarizing layer 223 is formed over the entire surface of the substrate. Then, through-holes are formed through the planarizing layer 223 to the electrode terminals of the component chip 206. The planarizing layer 223 may be formed of the materials mentioned in the Second Embodiment. The planarizing layer 223 is required because the component chips 206 of this embodiment are 5 μm thick. The planarizing layer 223 also serves to anchor the component chips 206 on the substrate 201.

Next, on the planarizing layer 223 are formed the X scanning electrodes 204, the Y scanning electrodes 205, the driver electrodes (not shown), and the pixel electrodes 222. The patterns of these electrodes are basically the same as the electrode patterns directly formed on the substrate 201. However, in the vicinity of the component chips 206, the electrode patterns are formed to be electrically connected to the electrodes 206$x$, 206$y$, 206$z$, and 206$d$ (not shown) of the component chip 206 (shown on the right-hand side of FIG. 19) whose electrode terminal side faces upward with respect to the substrate 201. The electrodes on the planarizing layer 223 and the electrodes formed on the substrate are electrically connected to each other at the sides of the substrate (not shown). Further, the electrodes on the planarizing layer 223 are connected electrically, via the through-holes, to the electrode terminals of the component chip 206 whose electrode terminal side is facing upward with respect to the substrate 201. As described above, according to this embodiment, interconnections to the electrodes can be made regardless of whether the principal surface of the component chip 206 is facing upward or downward with respect to the substrate 201. That is, as shown in FIG. 19, the electrodes 206$x$ (only one is shown), 206$y$ (only one is shown), 206$z$ (only one is shown), and 206$d$ (not shown) of the component chip 206 are connected electrically to the X scanning electrodes 204, the Y scanning electrodes 205, the pixel electrodes 222, and the driver electrodes (not shown), respectively.

After an insulating layer 224 is formed, an organic EL film 225 provided as a light-emitting layer is formed by a vacuum-deposition method, using a shadow mask. Thereafter, transparent electrodes 226 and a silicon oxide film 227 are formed. The organic EL display is fabricated in this manner.

Fourth Embodiment

The transistor chip 146 shown in FIG. 16F also can be mounted on the substrate using methods other than the one described in the Second Embodiment. The present embodiment is basically the same as the Second Embodiment except that chloroform is used as the second liquid. That is, according to the method of the Second Embodiment, purified water is disposed as the first liquid in the liquid-attracting region 162. Immediately after the liquid droplet is disposed, the substrate is immersed in a member-containing liquid (a liquid with the transistor chips dispersed in chloroform (second liquid)) that has been prepared beforehand. Here, the substrate is immersed with the liquid droplet side facing up. In order to uniformly disperse the transistor chips in chloroform, the chloroform liquid desirably should be stirred. The substrate then is taken out of the chloroform, and immediately immersed in chloroform (third liquid) with no transistor chips. It is desirable to stir the chloroform also in this case. With this procedure, the silicon chips that have adhered to regions other than the region of the first liquid can be removed. Thereafter, the substrate is taken out of the chloroform and the chloroform on the substrate is removed. As a result, the transistor chips are mounted on the substrate. The chloroform used as the second liquid in this embodiment is more dissolvable in water compared with the toluene used in the Second Embodiment. As such, conceivably, the purified water disposed in the hydrophilic region is gradually removed in the chloroform, and as a result the transistor chips are disposed on the substrate.

The transistor chips 146 can be mounted on the substrate according to this method. Note that, a liquid crystal display can be fabricated by performing the other steps as in the Second Embodiment.

Fifth Embodiment

An organic EL display also can be fabricated as in the Third Embodiment, using the mounting method of transistor chips according to the Fourth Embodiment.

Sixth Embodiment

The transistor chip 146 shown in FIG. 16F also can be mounted on the substrate by methods other than the one described in the Second Embodiment. In the present embodiment, the description is directed to an example in which n-hexadecane and perfluorooctane are used as the first liquid and the second liquid, respectively.

Hexadecane has a low vapor pressure and stably remains on the substrate without undergoing volatilization. This enables the first liquid to be disposed in an atmosphere with a relative humidity of 40% to 80%, for example. Separately, the surfaces of the transistor chips 146 are treated with octadecyltrichlorosilane and the transistor chips 146 are dispersed in perfluorooctane. The surface treatment of the transistor chips 146 is performed as follows. The transistor chip that has been cut out from the silicon wafer is placed for one hour in an octane solution in which is dissolved 1 vol % octadecyltrichlorosilane ($CH_3(CH_2)_{17}SiCl_3$; hereinafter "OTS"). The octane solution with the OTS dissolved therein is then replaced with octane to remove OTS from the solution. This procedure is performed in a dry nitrogen atmosphere. The octane with the transistor chips dispersed therein is then placed in a pear-shaped flask, and the octane is removed using an evaporator. Then, the pear-shaped flask is charged with perfluorooctane to disperse the transistor chips. In this manner, a perfluorooctane solution (member-containing liquid) is prepared in which the transistor chips surface-modified with OTS are dispersed. The solution is then transferred to a separate container, and the substrate with the hexadecane (first liquid) disposed thereon is immersed in this solution. Because the hexadecane has a smaller specific gravity than perfluorooctane, the liquid-disposed side of the substrate is disposed face down so that the hexadecane disposed on the substrate is maintained stably in perfluorooctane. The transistor chips are subsequently disposed on the substrate as in the Second Embodiment. The substrate then is immersed again in perfluorooctane to remove the component chips that have adhered to regions other than the hexadecane region. Thereafter, the substrate is taken out and placed in a 110° C. oven to evaporate the hexadecane.

The transistor chips 146 can be mounted on the substrate according to this method. Note that, a liquid crystal display can be fabricated by performing the other steps as in the Second Embodiment.

Seventh Embodiment

An organic EL display also can be fabricated as in the Third Embodiment, using the mounting method of transistor chips according to the Sixth Embodiment.

Eighth Embodiment

In the Eighth Embodiment, one embodiment of a mounting apparatus of the present invention is described. A mounting apparatus of the present embodiment can be used to mount the component chips on the substrate.

Figure 21:
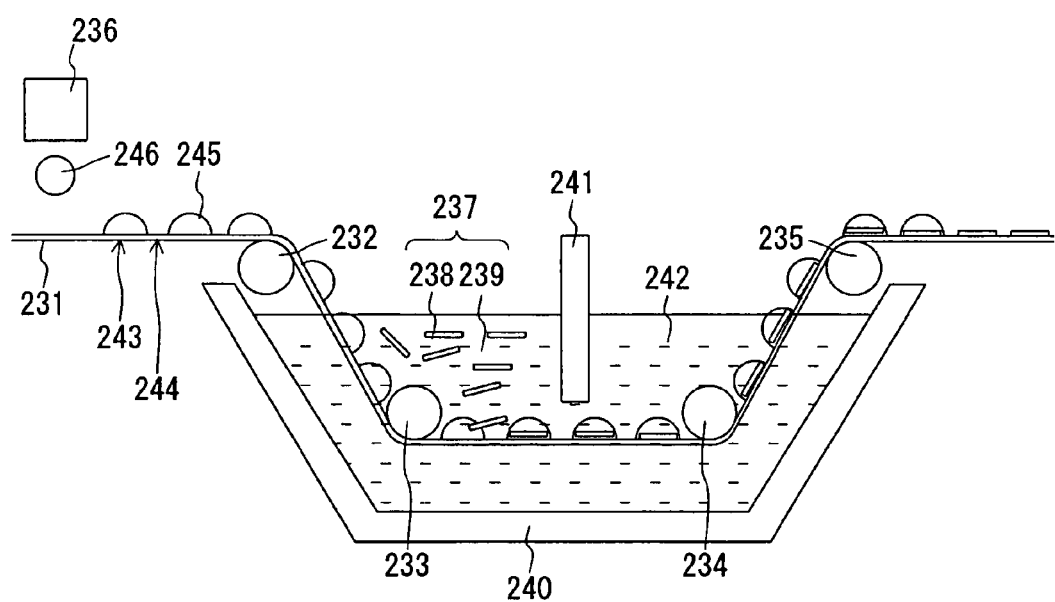
FIG. 21 is a schematic diagram showing one embodiment of a mounting apparatus of the present invention.

FIG. 21 is a schematic diagram illustrating a mounting apparatus for mounting the component chips. A substrate 231 on which the component chips are to be disposed is a long band-like resin sheet. The substrate 231 is carried from the left to right of the figure with rollers 232 to 235. The component chips are mounted on the substrate 231 along with the movement of the substrate 231. The mounting apparatus of the present embodiment includes an injector (liquid disposing section) 236 for disposing the first liquid in the first region of the substrate 231, and a liquid tank (member contacting section) 240 containing a member-containing liquid 237, in which the substrate 231 being carried with the rollers 232 to 235 is brought into contact with the member-containing liquid 237. The liquid tank 240 is separated into two compartments with a partition 241. The compartment on the upstream side in the substrate transport direction is filled with the member-containing liquid 237, and a third liquid 242 fills the compartment on the downstream side. The use of this kind of liquid tank is possible because in this embodiment the same liquid is used for the second liquid contained in the member-containing liquid 237, and the third liquid 242.

Figure 22:
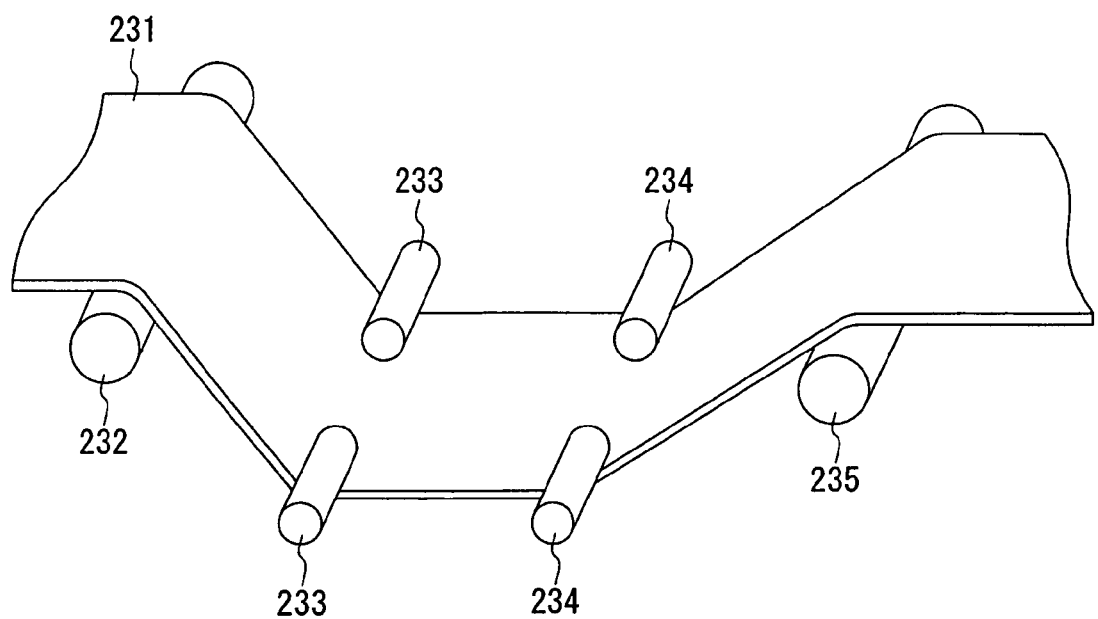
FIG. 22 is a schematic diagram showing a relationship between a substrate and rollers in the mounting apparatus shown in FIG. 21.

FIG. 22 is a schematic diagram illustrating a relationship between the substrate 231 and the roller 232 to 235. The substrate 231 with the component chips mounted thereon is cut at appropriate sites in subsequent steps into pieces of a predetermined planar shape. As shown in FIG. 21, the substrate 231 is provided beforehand with a first region 243 where the first liquid is to be disposed, and a second region 244 surrounding the first region 243. The substrate 231 is carried from the left to right with the rollers 232 to 235. A first liquid 245 is disposed in the first region 243 by injecting a liquid droplet 246 of the first liquid from the head of the injector 236. The substrate 231 with the liquid droplet 246 disposed thereon is introduced into the liquid tank 240 containing the member-containing liquid 237 in which component chips 238 are dispersed in a second liquid 239. In the liquid tank 240, the component chips 238 move to the region of the first liquid 245. The substrate 231 with the component chips 238 in the region of the first liquid 245 is immersed in the third liquid 242 to wash out the component chips 238 adhering to regions other than the region of the first liquid 245. The substrate 231 is then taken out of the third liquid 242, and as a result the third liquid 242 volatilizes, followed by volatilization of the first liquid 245. As a result of this procedure, the component chip 238 is accurately disposed in the first region 243. Note that, FIG. 21 shows the component chip 238 completely incorporated inside the first liquid 245. However, this is not necessarily required and the component chip 238 simply may move to the region of the first liquid 245.

It should be noted that the first liquid is required to be substantially undissolvable in the second liquid and the third liquid. The second liquid is required to be dissolvable in the third liquid because it needs to be washed with the third liquid.

In the mounting apparatus of the present embodiment, the first liquid and the third liquid are removed by natural drying. However, the apparatus optionally may include a dryer or the like as a mechanism (liquid removing section) for removing the liquids.

Further, in the mounting apparatus of the present embodiment, the first liquid 245 is removed by drying after the substrate 231 is taken out of the third liquid 242. However, the first liquid 245 may be removed in the second liquid 239 or the third liquid 242 after the component chip 238 has been incorporated. In this case, the component chip 238 is disposed in a predetermined position of the substrate 231 by taking the substrate 231 out of the third liquid 242 and removing the third liquid 242 from the substrate 231.

Ninth Embodiment

In the Ninth Embodiment, one embodiment of a mounting method of the present invention is described with reference to the drawings. Note that, in the present embodiment, the members constituting the electronic circuit are pillar-like members, and a method of mounting such members is described.

Figure 23A:
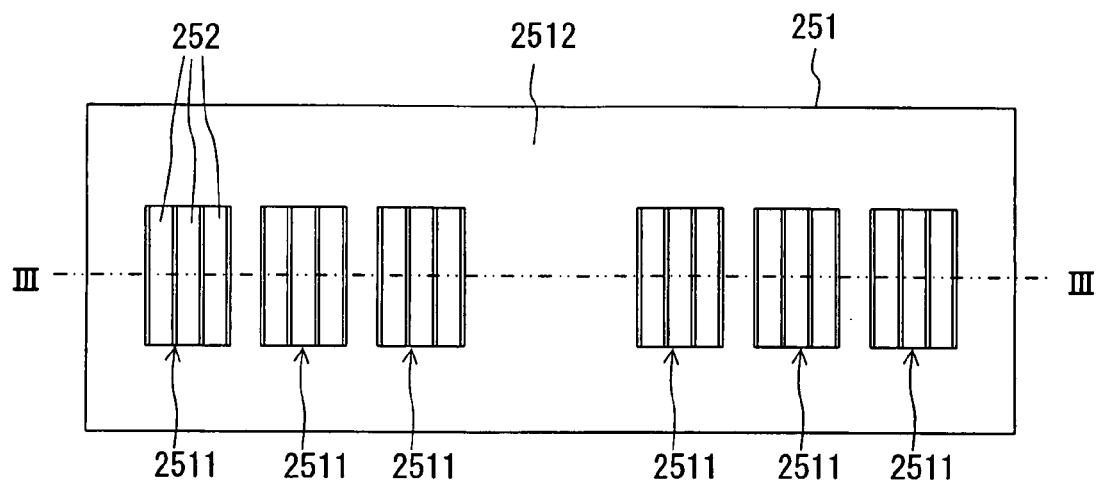
FIG. 23A is a plan view showing pillar-like members mounted by a mounting method of the present invention.
Figure 23B:
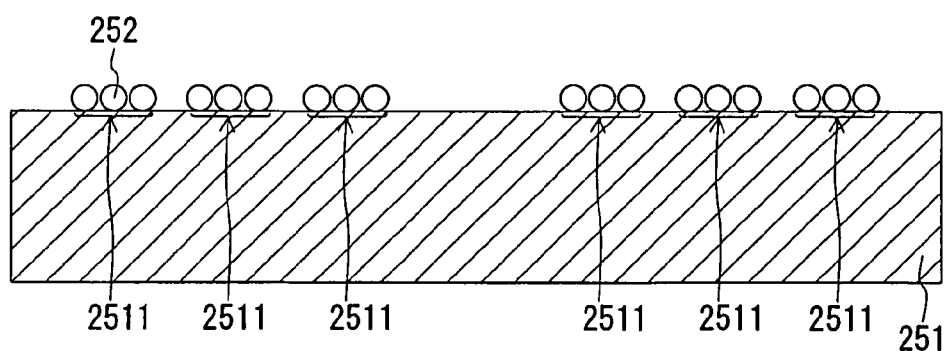
FIG. 23B is a cross sectional view of the pillar-like members shown in FIG. 23A.

FIG. 23A is a plan view illustrating pillar-like members that have been mounted on a substrate using a mounting method of the present embodiment. FIG. 23B is a cross sectional view taken along the line III-III of FIG. 23A and perpendicular to the substrate. In the present embodiment, pillar-like members 252 are disposed in a plurality of first regions 2511 formed on one principal surface of a substrate 251. In the present embodiment, the first regions 2511 on the substrate 251 are formed not in contact with each other. The first regions 2511 are rectangular in shape, and more than one member 252 (three members in the figures) is mounted in each first region 2511. The first region 2511 is formed such that its width direction is shorter in length than the long axis of the member 252. Thus, the members 252 in the first region 2511 are mounted in such an orientation that the long axis of the members 252 substantially coincides with the longitudinal direction of the first region 2511. Further, on the principal surface of the substrate 251, a second region 2512 is provided surrounding the first regions 2511. The second region 2512 is formed such that it is less wettable than the first regions 2511 with respect to the first liquid (described later) used in the mounting method of the present embodiment.

The mounting method of the present embodiment is described below. For convenience, the description will be given based on a method of mounting a pillar-like member on a substrate 251 that includes the first region 2511 and the second region 2512 surrounding the first region 2511 on one principal surface, as shown in FIG. 24.

Figure 24:
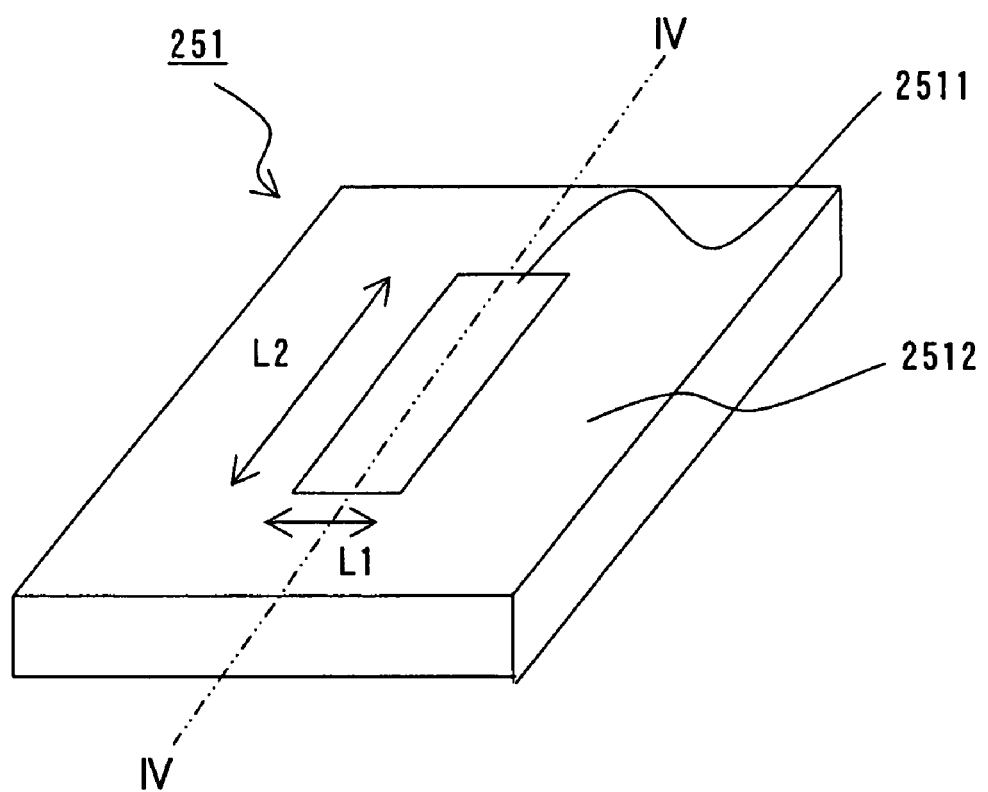
FIG. 24 is a perspective view showing a substrate that has been surface-treated.

FIGS. 25A to 25E are cross sectional views taken along the line IV-IV of FIG. 24 and perpendicular to the substrate, showing steps of mounting the member on the substrate using the mounting method of the present embodiment.

The substrate 251 shown in FIG. 24 includes the first region 2511 and the second region 2512 that have been formed on one principal surface of the substrate 251 by a surface treatment. In the present embodiment, the first region 2511 is formed such that a length L1 in the width direction is sufficiently shorter than the length of the member along its long axis, and that a length L2 in the longitudinal direction substantially matches the length of the member along its long axis. For example, when the member is a cylindrical particulate nanowire with an average length of 10 μm along its long axis and an average diameter of 200 nm, the first region 2511 may be, for example, a rectangle with a length L1=2.5 μm along the width direction and a length L2=10 μm along the longitudinal direction. In this case, one to several tens of nanowires are disposed in each first region 2511. In the present embodiment, the length L2 along the longitudinal direction of the first region 2511 is described to be substantially equal to the length along the long axis of the member. However, the present invention is not just limited to this example and the length L2 may be longer than the length along the long axis of the member.

Figure 25A:
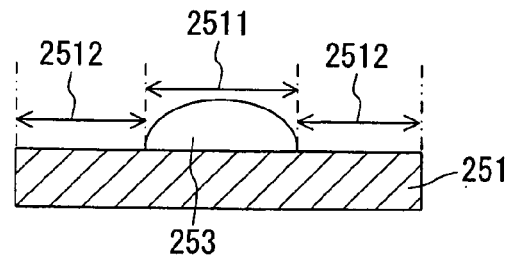
FIG. 25A to FIG. 25E are cross sectional views showing the steps of mounting a pillar-like member.

First, as shown in FIG. 25A, a first liquid 253 is disposed in the first region 2511 of the substrate 251 shown in FIG. 24. The method of disposing the first liquid 253 is not particularly limited, and a method may be used in which a liquid droplet of the first liquid is brought into contact with the surface of the substrate 251 provided with the first region 2511, for example. The first region 2511 is a liquid-attracting region with high wettability to the first liquid, and is surrounded by the second region 2512 that is less wettable to the first liquid. Thus, the first liquid 253 disposed in the first region 2511 can stay stably therein.

Figure 25B:
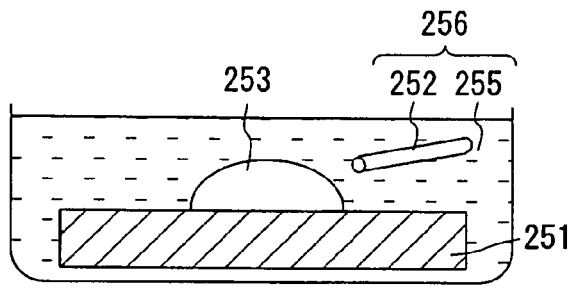

Next, as shown in FIG. 25B, the substrate 251 with the first liquid 253 disposed thereon is immersed in the member-containing liquid 256. The member-containing liquid 256 includes a second liquid 255 in which the first liquid 253 is substantially undissolvable, and the pillar-like member 252. Because the first liquid 253 is substantially undissolvable in the second liquid 255, the first liquid 253 stably can remain in the first region 2511 of the substrate 251 even when the substrate 251 is completely immersed in the member-containing liquid 256.

Figure 25C:
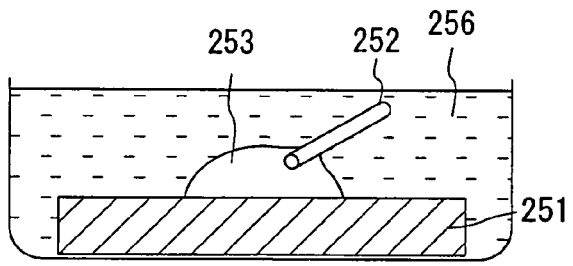
Figure 25D:
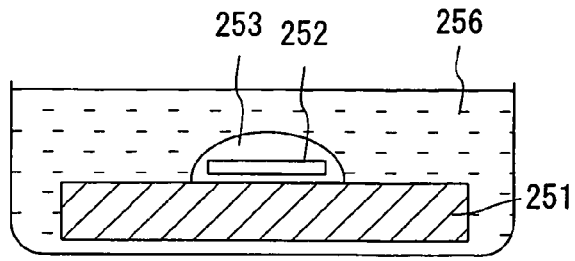

As shown in FIG. 25C, when the member 252 approaches the first liquid 253 contacts therewith, the member 251 is drawn into the first liquid 253 by the interface tension acting on the contact face of the first liquid 253 and the member-containing liquid 256 (second liquid 255). The principle by which the member 252 is drawn into the first liquid 253 will not be described because it is the same as the principle by which the component chip is drawn into the first liquid as described in the First Embodiment. The member 252 continues to move into the first liquid 253 as the first liquid 253 wets the all surfaces of the member 252, until it falls in the first region 253 and is oriented therein as shown in FIG. 25D. Here, the description was directed to the case where the member 252 is completely incorporated inside the first liquid 253. However, this is not necessarily required and the member 252 simply may move to the region of the first liquid 253. For example, the member 252 may be present at the interface between the first liquid 253 and the member-containing liquid 256.

When the member 252 is drawn entirely into the first liquid 253, the volume of the first liquid 253 may be increased more than the volume that can accept the member 252 entirely. In this way, the member 252 can be disposed on the substrate 251 with good reproducibility. Once the member 252 has moved to the first liquid 253, it stays there stably and does not easily detach itself therefrom. This enables the member 252 to be mounted on the substrate 251 without fail. In this manner, a method of the present invention does not require strict control of the first liquid volume, and the member, once it is disposed on the substrate, does not easily detach itself from the substrate.

Figure 25E:
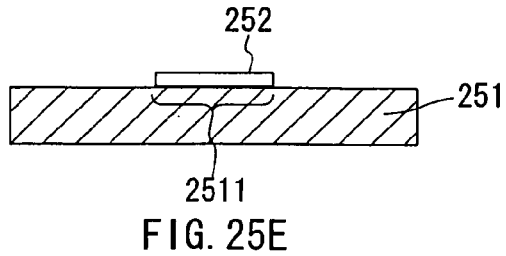

Next, the substrate 251 is taken out of the member-containing liquid 256, and the second liquid 255 and the first liquid 253 are removed from the substrate 251. As a result, the member 252 is disposed and oriented in the first region 2511 of the substrate 251 as shown in FIG. 25E. The method of removing the second liquid 255 and the first liquid 253 from the substrate 251 will not be described because it is the same as that described in the First Embodiment.

After the member has entered the first liquid, the first liquid may be removed before the second liquid to dispose the member on the substrate. Specifically, after the step shown in FIG. 25D, the first liquid 253 is dissolved away gradually in the second liquid 255, and the substrate 251 is taken out of the member-containing liquid 256 to dispose the member 252. Even when the first liquid 253 is substantially undissolvable in the second liquid 255, the first liquid 253 is dissolved away gradually in the second liquid 255 when these liquids are in contact with each other for an extended time period. As the first liquid 253 is removed, the member 252 is disposed in a predetermined position. The substrate 251 then is taken out of the member-containing liquid 256 to dispose the member 252 on the substrate. The principle by which the member 252 is disposed in the member-containing liquid 256 is the same as that described in the First Embodiment.

The member 252 also can be disposed on the substrate 251 by first removing only a part of the first liquid 253 in the second liquid 255, and then removing the second liquid 255 from the substrate 251 before finally removing the remaining part of the first liquid 253.

Which of the first liquid and the second liquid to remove first after the member has entered the first liquid is decided by the combination of the first liquid and the second liquid, or by the duration or manner in which the first liquid is exposed to the second liquid. In either case, the member is disposed in a predetermined region of the substrate.

Figure 26A:
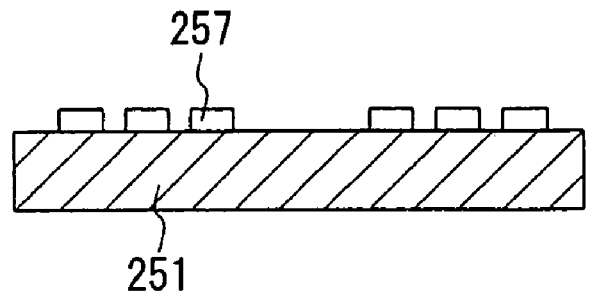
FIG. 26A to FIG. 26C are cross sectional views showing the steps of forming a micro pattern of first regions on a substrate used in a mounting method of the present invention.
Figure 26B:
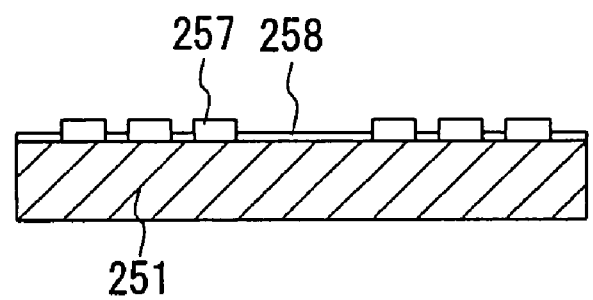
Figure 26C:
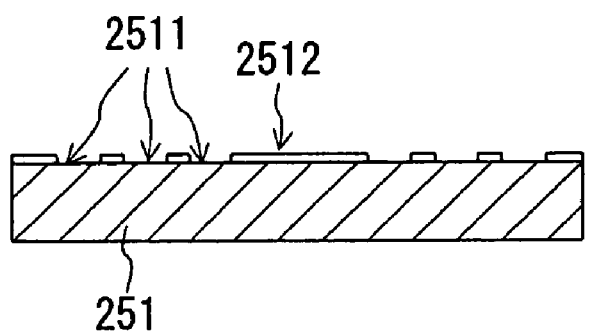

The following will describe an example of a method for forming the first and second regions on the substrate, with reference to FIG. 26A to FIG. 26C. In the present embodiment, the description will be given through the case where the substrate is a silicon substrate, and the mounted member is a nanomember.

The formation of the first region on the silicon substrate proceeds by first rendering the entire surface of the substrate liquid-attractive. This is performed by oxidizing the substrate surface by a plasma process in an atmosphere in the presence of oxygen. Next, as shown in FIG. 26A, a rectangular resist film 257 (for example, a rectangle measuring 10 μm in length and 2.5 μm in width when the mounted nanomember has, for example, an average length of 10 μm along the long axis and an average diameter of 200 nm) is formed by a photolithographic method in a predetermined position where the nanomember is to be mounted.

Then, the substrate 251 with the resist film 257 is immersed in, for example, a perfluorooctane solution dissolving 1 vol % $CF_3(CF_2)_7C_2H_4SiCl_3$ therein, for 20 minutes in a dry atmosphere. The substrate then is washed in pure perfluorooctane and the solvent is removed. As a result, a fluorine-based monomolecular film 258 is formed in a region other than the region of the resist film 257 as shown in FIG. 26B, so as to provide a liquid-repelling second region. The resist film 257 then is removed with acetone to provide the substrate 251 including a liquid-attracting micro pattern (first region 2511) and the second region 2512 surrounding it, as shown in FIG. 26C.

An example of a method for preparing the member-containing liquid is described below.

For example, when the member is a silicon nanowire, the member-containing liquid is prepared as follows. First, silicon nanowires are grown by a CVD method on a silicon substrate or the like that has been prepared to include a catalyst such as gold on its surface. The substrate is immersed in the second liquid and an ultrasonic wave is applied to the liquid to detach the silicon nanowires from the silicon substrate and disperse the silicon nanowires in the second liquid. The application of an ultrasonic wave is performed by placing a second liquid-containing container in an ultrasonic wave wash tank. The surfaces of the member may be modified chemically to improve dispersibility to the second liquid while maintaining wettability to the first liquid. In this way, a member-containing liquid is realized that can remain stable for extended time periods without causing the members to form aggregates. For example, when the member is a silicon nanowire, the member surfaces are chemically modified according to the following method. The substrate with the silicon nanowires formed thereon is exposed to a solution of a silane coupling agent to chemically modify the surfaces of the silicon nanowires. The substrate is then immersed in the second liquid and an ultrasonic wave is applied to obtain a dispersion liquid of the chemically modified silicon nanowires. For example, when the first liquid is water, a chlorinated solvent such as chloromethane, dichloromethane, chloroform, carbon tetrachloride, monochlorobutane, dichlorobutane, monochloropentane, or dichloropentane may be used as the second liquid, and the surfaces of the silicon nanowires may be chemically modified with a silane coupling agent including a group with a C—Cl bond, such as $CCl_3SiCl_3$, $CHCl_2SiCl_3$, $CH_2ClSiCl_3$, $CH_2ClCH_2SiCl_3$, $CH_2ClCHClSiCl_3$, and $CH_3CHClSiCl_3$. The chlorinated solvent is a polar solvent. The chemically modified silicon nanowire surfaces are also polar due to the group with a C—Cl bond thereon. Thus, the silicon nanowires can be stably dispersed in the dispersion liquid for extended time periods.

The substrate with the first region and the second region can be fabricated according to this method. The substrate can then be used to accurately position and orient the pillar-like member in the first region of the substrate.

In this embodiment, the first region is rectangular in shape. However, the shape of the first region is not just limited to this example, and the first region may be, for example, an ellipsoid or rectangle with round corners. When the first region has such a shape, assuming a rectangle of the smallest area circumscribed about the first region, the shape of the first region desirably should be decided so that the length of the shorter side of the rectangle is shorter than the length of the long axis of the member. With such a shape of the first region, the pillar-like member can be disposed in a uniaxial direction more accurately.

Tenth Embodiment

In the Tenth Embodiment, one embodiment of a mounting apparatus of the present invention is described. A mounting apparatus of the present invention is particularly suitable when the member mounted on the substrate is a micro pillar-like member.

Figure 27:
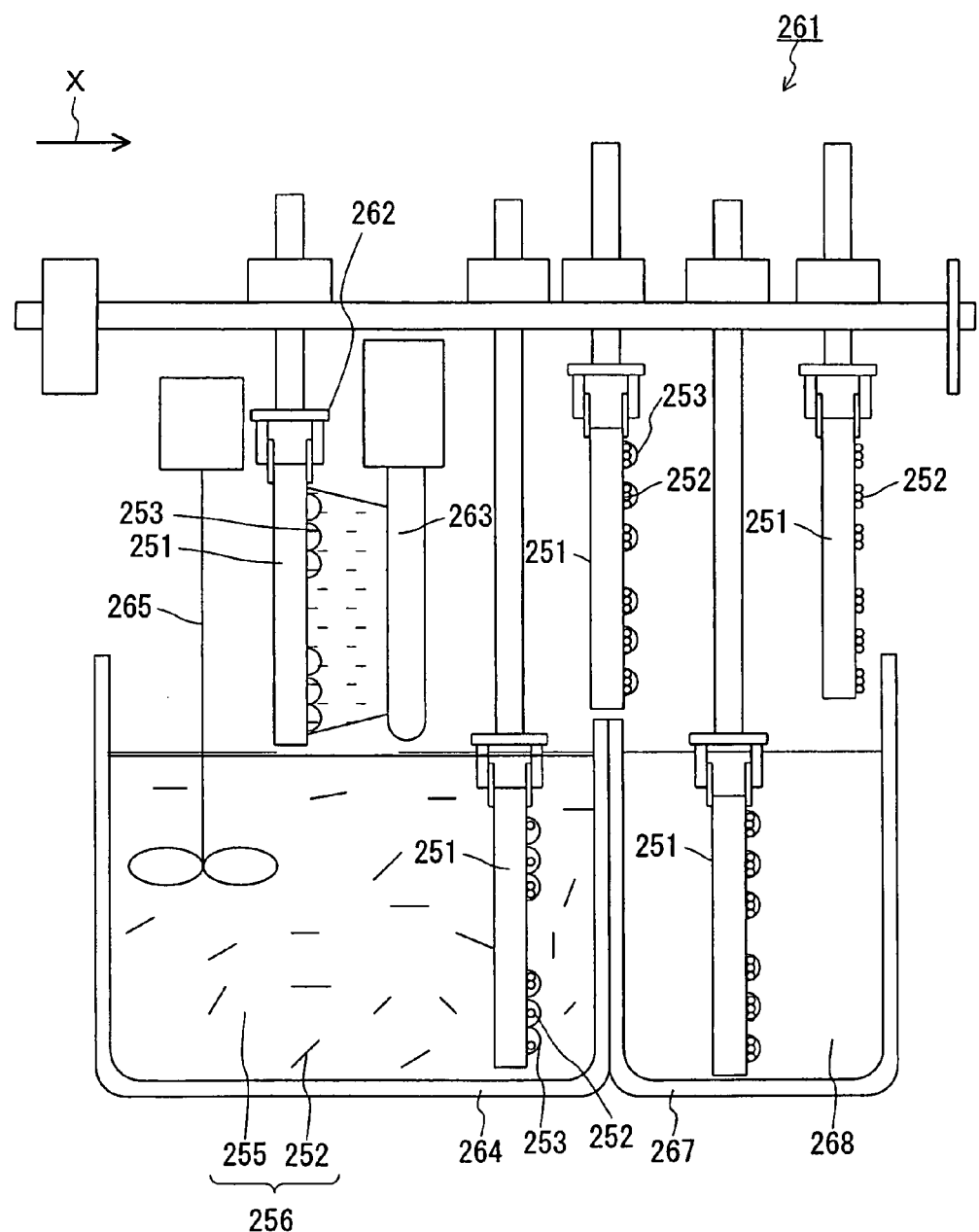
FIG. 27 is a schematic diagram showing one embodiment of a mounting apparatus of the present invention.

FIG. 27 is a schematic diagram illustrating a configuration of a mounting apparatus of the present embodiment. A mounting apparatus 261 shown in FIG. 27 is an example of an apparatus that is used to dispose and orient a pillar-like member such as a nanowire on the substrate 251 on which the liquid-attracting first region and the liquid-repelling second region have been formed as described in the Ninth Embodiment.

The mounting apparatus 261 includes a liquid disposing section for disposing the first liquid in the first region provided on one principal surface of the substrate 251, and a member contacting section for bringing the member-containing liquid into contact with the first liquid disposed in the first region. More specifically, the mounting apparatus 261 includes: a hold-and-carry mechanism 262 that holds an end of the substrate 251 and carries the substrate 251 to places where the substrate 251 is operated upon; an atomizer 263 for spraying a mist of the first liquid onto the substrate 251 held by the hold-and-carry mechanism 262; a member-containing liquid tank 264 containing the member-containing liquid 256 in which the members 252 are dispersed in the second liquid 255; a stirrer 265 for stirring the member-containing liquid 256 to disperse the members 252; and a washing liquid tank 267 containing a third liquid 268 used to wash the substrate 251. Note that, the hold-and-carry mechanism 262 and the atomizer 263 are components of the liquid disposing section. The hold-and-carry mechanism 262, the member-containing liquid tank 264, and the stirrer 265 are components of the member contacting section. The following describes operations of the mounting apparatus 261. The mounting apparatus 261 operates by carrying the substrate 251 in the direction of arrow X shown in the figure.

First, one end of the substrate 251 with the first regions formed thereon is held by the hold-and-carry mechanism 262, and the atomizer 263 sprays a mist of the first liquid onto the surface of the substrate 251 where the first regions are formed. As a result, micro liquid droplets of the first liquid 253 are disposed uniformly over each first region. Instead of the atomizer 263, a device may be used that sprays a gaseous first liquid onto the substrate. In this case, the temperature of the substrate is set at or below the dew point of the sprayed gas so that the gas turns into a liquid on the substrate.

Next, the substrate 251 with the first liquid 253 disposed thereon is immediately placed in the member-containing liquid tank 264. The member-containing liquid tank 264 contains the member-containing liquid 256 in which the members 252 are dispersed in the second liquid 255. The member-containing liquid 256 is stirred with the stirrer 265 at all times. The substrate 251 placed in the member-containing liquid tank 264 contacts the large numbers of the members 252 that are moving by the convection of the liquid being stirred. At this time, a plurality of members 252 moves into the region of the first liquid 253 disposed in each first region.

After a predetermined time period, the substrate 251 is pulled out to the atmosphere and immediately placed in the washing liquid tank 267 containing the third liquid 268 as the washing liquid, so as to wash the substrate surface. Desirably, the third liquid 268 is a liquid in which the first liquid is substantially undissolvable, and in which the second liquid is dissolvable. After washing, the substrate 251 is pulled out to the atmosphere to evaporate the first liquid 253 disposed in each first region. Here, the first liquid 253 contains a plurality of members 252. As the first liquid 253 evaporates, the pillar-like members 252 are oriented according to the shape of the first region. The relationship between the pillar-like members 252 and the shape of the first region is described in the Ninth Embodiment.

FIG. 27 illustrates the case where the first liquid is removed from the substrate 251 by evaporating after the third liquid 268 is removed from the substrate 251. However, in some cases, the first liquid may be removed in the second liquid or the third liquid. The pillar-like members also can be disposed and oriented in this manner.

With the apparatus described above, even micro members, for example, such as nanowires can be mounted on the substrate by forming micro first regions on the substrate in advance and disposing and orienting the members in each first region.

Note that, the same first and second liquids used in a mounting method of the present invention may be used in the foregoing apparatus. The first liquid may be an organic solvent, water, or a mixture of organic solvent and water. Some of the examples are alcohols such as methanol, ethanol, ethylene glycol, and glycerine; water; and a mixture of such alcohol and water. In this case, examples of the second liquid include: alkanes such as hexane, octane, nonane, decane, undecane, dodecane, tridecane, tetradecane, pentadecane, hexadecane, toluene, and xylene; chlorinated solvents such as chloromethane, dichloromethane, chloroform, carbon tetrachloride, monochlorobutane, dichlorobutane, monochloropentane, and dichloropentane; diethyl ether; petroleum ether; ethyl acetate; benzene; silicone oil; perfluorooctane; perfluorononane; and a mixture of these. When the first liquid is water, there will be a large surface tension compared with using other organic solvents. This enables the member to be fastened to the substrate efficiently and firmly.

The first liquid may be an organic solvent including hydrocarbon chains, and the second liquid may be an organic solvent including fluorocarbon chains. In this case, alkanes such as hexane, octane, nonane, decane, undecane, dodecane, tridecane, tetradecane, pentadecane, hexadecane, toluene, and xylene may be used as the first liquid. In this case, perfluorooctane, perfluorononane, and the like may be used as the second liquid.

When the first liquid is an organic solvent including hydrocarbon chains, an organic solvent including fluorocarbon chains, having a lower surface tension than the organic solvent used for the first liquid, may be used as the second liquid. When this combination of liquids is used, the interface tension that draws and anchors the member in the first liquid can be increased, making it possible to efficiently and reliably dispose the member on the substrate.

In the mounting apparatus of the present embodiment, the first liquid and the third liquid are removed by natural drying. However, the apparatus optionally may include a dryer or the like as a mechanism (liquid removing section) for removing the liquids.

Eleventh Embodiment

In the Eleventh Embodiment, one embodiment of a fabrication method of an electronic device of the present invention is described. The description of the present embodiment will be given through the case where the electronic device is a transistor.

Figure 28A:
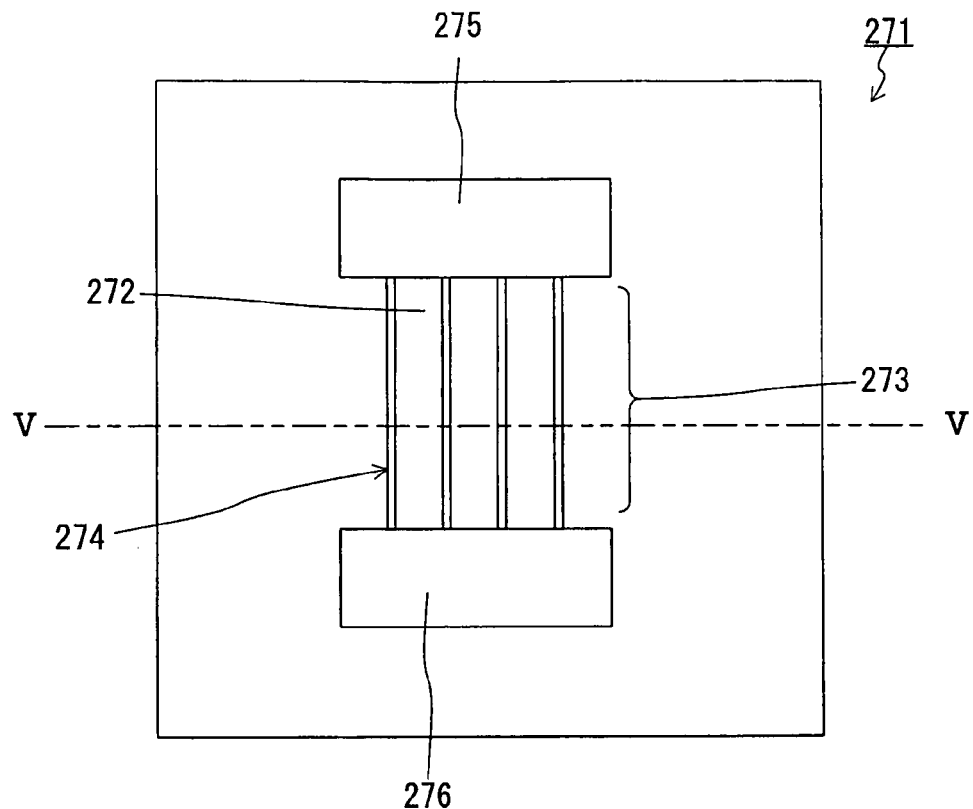
FIG. 28A is a plan view schematically showing a configuration of a back-gate field-effect transistor.
Figure 28B:
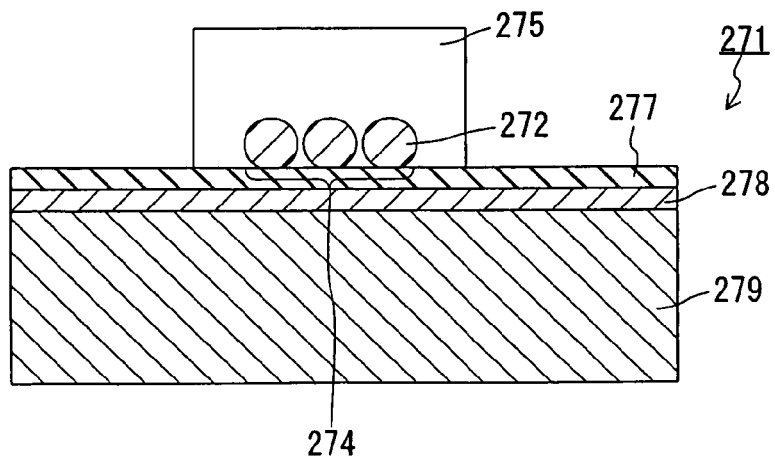
FIG. 28B is a cross sectional view of the back-gate field-effect transistor shown in FIG. 28A.

FIG. 28A is a schematic plan view of a back-gate field-effect transistor fabricated by a fabrication method of the present embodiment. FIG. 28B is a cross sectional view taken along the line V-V of FIG. 28A and perpendicular to the substrate. A field-effect transistor 271 of the present embodiment is a device prepared by mounting the pillar-like members on a substrate according to the method described in the Ninth Embodiment. Here, silicon nanowires having semiconductor characteristics are used as the pillar-like members.

As shown in FIGS. 28A and 28B, the field-effect transistor 271 of the present embodiment includes a channel region 273 having a bundle of silicon nanowires 272 through which carriers (electrons or holes) propagate. The silicon nanowires 272 are disposed in a first region 274, and are connected to a source electrode 275 and a drain electrode 276 (a first electrode and a second electrode, respectively). The source electrode 275 and the drain electrode 276 are provided on a gate insulating film 277, beneath which is disposed a gate electrode 278. The gate electrode 278 is formed on a silicon substrate 279. In the field-effect transistor 271 having such a configuration, the transistor can be operated by controlling the conductivity of the channel region 273, which is achieved by raising and lowering the potential of the gate electrode 278 using a driving circuit (not shown).

Figure 29A:
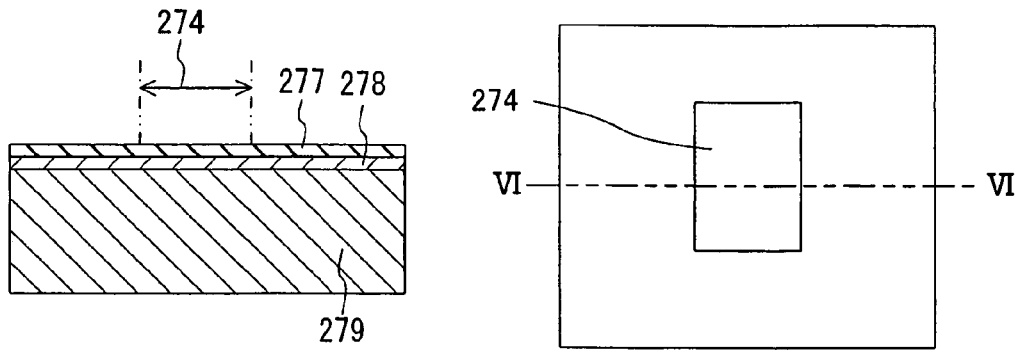
FIG. 29A to FIG. 29C are cross sectional views and plan views showing fabrication steps of the back-gate field-effect transistor shown in FIG. 28.
Figure 29B:
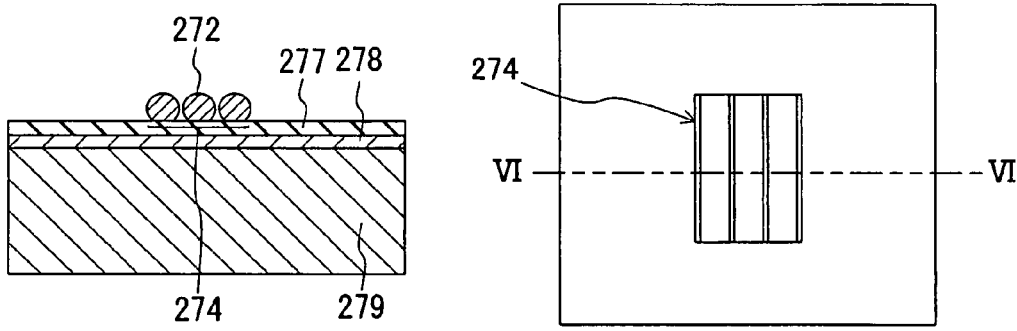
Figure 29C:
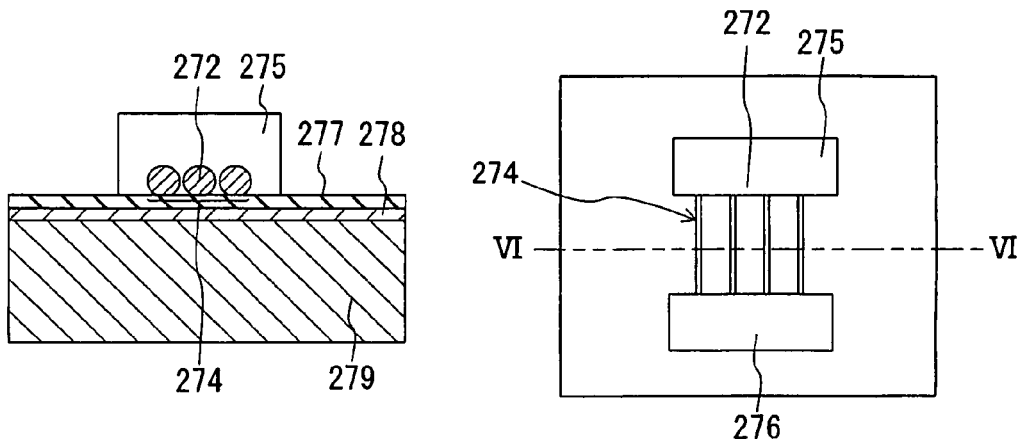

Next, a fabrication method of the back-gate field-effect transistor 271 is described with reference to FIG. 29A to FIG. 29C. FIG. 29A to FIG. 29C are plan views, and cross sectional views taken along the line VI-VI, depicting steps in the fabrication method of the present embodiment. The substrate used to form the transistor is 20 mm×20 mm in size and 500 μm in thickness. FIG. 29 shows fabrication of only one transistor. However, in actual practice, large numbers of transistors having the foregoing configuration are formed on the substrate.

As shown in FIG. 29A, a gate insulating film 277 made of silicon oxide is deposited on a silicon film (gate electrode 278) that has been formed by doping the surface of the silicon substrate 279 with p-type impurities. On the gate insulating film 277, the liquid-attracting first region 274 and a second region surrounding the first region 274 are formed. These regions can be formed according to the method described in the Ninth Embodiment. The first region 274 is rectangular in shape, and its size is determined according to the shape of the silicon nanowires mounted on the substrate. For example, when the silicon nanowire has a diameter of 0.2 μm and a length of 10 μm, a liquid-attracting first region measuring 2×10 μm$^2$ is formed. The liquid-attracting region is surrounded by the liquid-repelling second region that has been surface-treated with $CF_3(CF_2)_7C_2H_4SiCl_3$. A liquid-repelling monomolecular film, as shown in FIG. 13A, is formed on the surface of the second region.

The silicon nanowires can be fabricated by known methods. For example, the silicon nanowires may be formed on a silicon substrate to which a catalyst such as gold has adhered, by growing the catalyst according to the Vapor-Liquid-Solid growth mechanism using a CVD method. Nanowires of a uniform diameter and a uniform length can be formed by controlling the particle diameter of the catalyst metal or the growth time of the nanowires. The silicon substrate with the nanowires is immersed in a chloroform solution, and an ultrasonic wave is applied to the solution. As a result, the nanowires are detached from the silicon substrate and are dispersed in the chloroform solution. The concentration of the nanowires in the chloroform is preferably 0.01 to 0.1 wt %. About 80 ml of the chloroform solution with the nanowires dispersed therein is placed in a 100 ml beaker. Then, the substrate with the liquid-attracting region formed thereon is exposed to a water vapor at 100% humidity. As a result, the purified water condenses to the first liquid in the liquid-attracting region. Immediately after the substrate is exposed to the water vapor, the substrate is immersed in a chloroform solution in which the nanowires are dispersed. The substrate is oscillated in the solution. As a result of taking out the substrate from the solution, the nanowires are disposed and oriented in the liquid-attracting region. The number of nanowires disposed in the liquid-attracting region may be increased by repeating this procedure.

The substrate is then irradiated with UV rays for 5 minutes in a 100° C. ozone atmosphere to remove the liquid-repelling monomolecular film formed in the second region.

Thereafter, as shown in FIG. 29C, the source electrode 275 and the drain electrode 276 are formed on the gate insulating film 277. The source electrode and the drain electrode are formed on the gate insulating film 277 such that these electrodes are separated from each other by a distance of 5 μm, and that the nanowires on the substrate are connected to these electrodes. The material of these electrodes is preferably silicide that has been prepared from metals, for example, such as titanium, gold, platinum, cobalt, and nickel.

Figure 30A:
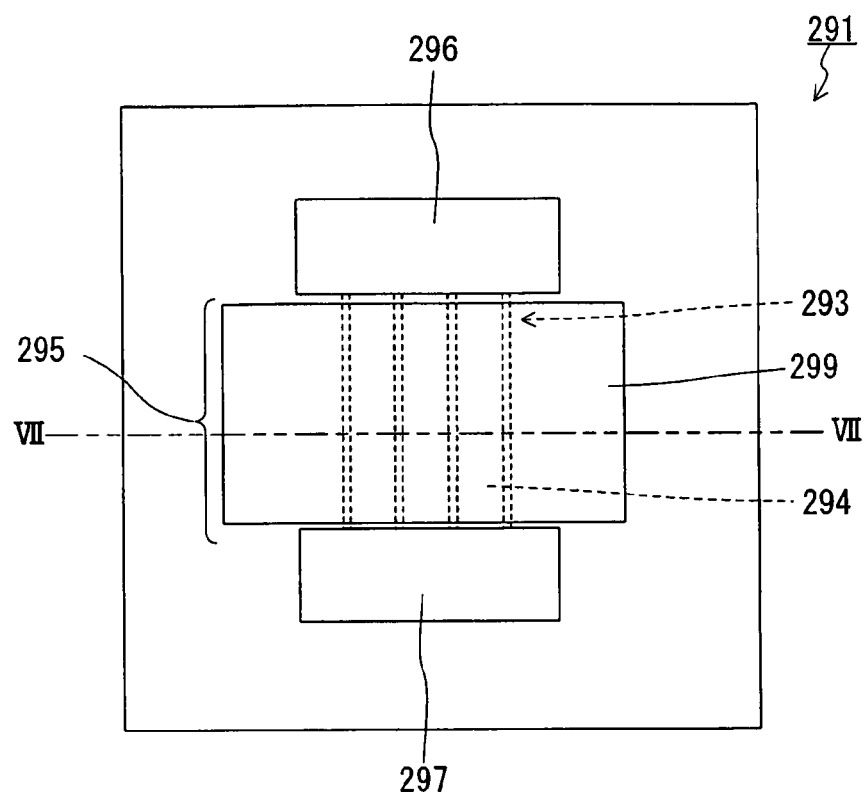
FIG. 30A is a plan view schematically showing a configuration of a top-gate field-effect transistor.
Figure 30B:
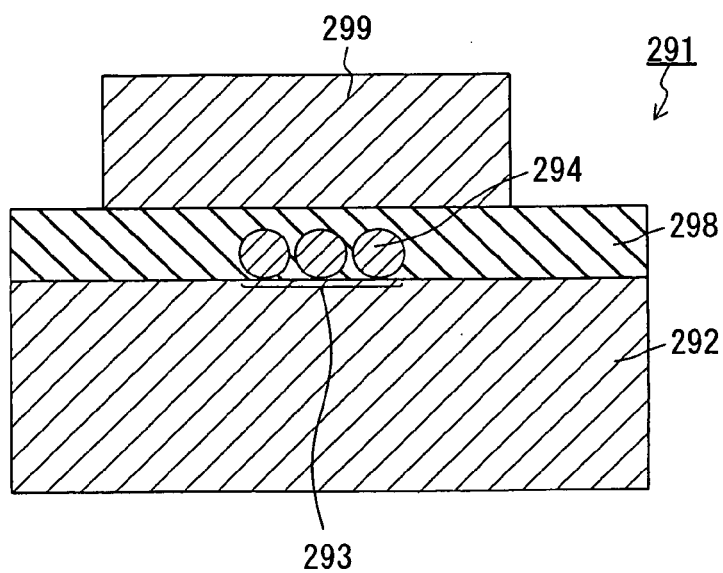
FIG. 30B is a cross sectional view of the top-gate field-effect transistor shown in FIG. 30A.

The electronic device fabricated in the present embodiment may be a top-gate field-effect transistor described below. FIG. 30A is a schematic plan view of a top-gate field-effect transistor 291. FIG. 30B is a cross sectional view taken along the line VII-VII of FIG. 30A and perpendicular to the substrate. In the top-gate field-effect transistor 291, a bundle of silicon nanowires 294 is disposed in a liquid-attracting first region 293 that has been provided on the silicon substrate 292, and this bundle of silicon nanowires 294 constitutes a channel region 295. A source electrode 296 and a drain electrode 297 are connected electrically to the silicon nanowires 294. A gate insulating film 298 is provided on the silicon nanowires 294, and a gate electrode 299 is provided on the gate insulating film 298. In the field-effect transistor 291 having this configuration, as in the field-effect transistor shown in FIGS. 28A and 28B, the transistor can be operated by controlling the conductivity of the channel region 295, which can be achieved by raising and lowering the potential of the gate electrode 299 using a driving circuit (not shown).

A fabrication method of the top-gate field-effect transistor 291 is described below with reference to FIG. 31A to FIG. 31E. FIGS. 31A to 31E are plan views, and cross sectional views taken along the line VIII-VIII, depicting steps in the fabrication method of the present embodiment.

First, as shown in FIG. 31A, the liquid-attracting first region 293, rectangular in shape and surrounded by the liquid-repelling second region is formed on the surface of the silicon substrate 292. These regions can be formed in the shape and by the method described in conjunction with the back-gate field-effect transistor.

Next, as shown in FIG. 31B, the silicon nanowires 294 are disposed in the first region 293. The silicon nanowires 294 can be disposed by the same method used in the back-gate field-effect transistor.

Then, as shown in FIG. 31C, the source electrode 296 and the drain electrode 297 (a first electrode and a second electrode, respectively) are formed that are connected electrically to the silicon nanowires 294.

Next, as shown in FIG. 31D, the gate insulating film 298 is formed on the surface other than the regions where the electrodes 296 and 297 have been provided.

Then, as shown in FIG. 31E, the gate electrode 299 is formed on the gate insulating film 298.

The top-gate field-effect transistor 291 can be fabricated by the method described above. The materials of the source electrode 296, the drain electrode 297, and the gate electrode 299, as in the case of the back-gate field-effect transistor, are preferably silicide that has been prepared from metals, for example, such as titanium, gold, platinum, cobalt, and nickel.

Twelfth Embodiment

The Twelfth Embodiment describes an example in which a field-effect transistor is fabricated according to the method of the Eleventh Embodiment except that a dispersion liquid of chemically surface-modified silicon nanowires is used.

In the following, a preparation method of a dispersion liquid of chemically surface-modified nanowires is described. A silicon substrate with the nanowires formed thereon is immersed for 3 hours in a mixed solution of n-hexadecane and chloroform (volume ratio of 4:1), dissolving 1 vol % $CH_2ClCH_2SiCl_3$ therein. The substrate then is taken out of the solution and washed with a chloroform solution. These procedures are performed in a dry nitrogen atmosphere. Then, the substrate is washed with purified water, and dried in a 110° C. atmosphere for about 30 minutes. As a result, the nanowire surface is modified chemically with $CH_2ClCH_2SiCl_3$. The silicon substrate then is immersed in 1,4-dichlorobutane and an ultrasonic wave is applied thereto to disperse the chemically-modified nanowires in 1,4-dichlorobutane.

Thereafter, the nanowires are disposed in the liquid-attracting region of the substrate according to the method of the Eleventh Embodiment. The substrate with the nanowires is irradiated with ultraviolet light for 5 minutes in a 110° C. ozone atmosphere to remove the modifier on the nanowire surface and the liquid-repelling film formed in the second region.

By chemically modifying the nanowire surface as in the present embodiment, dispersibility in the second liquid can be improved while maintaining wettability to the first liquid. Therefore, the nanowires can remain dispersed stably in 1,4-dichlorobutane for extended time periods without depositing.

Thirteenth Embodiment

Figure 32:
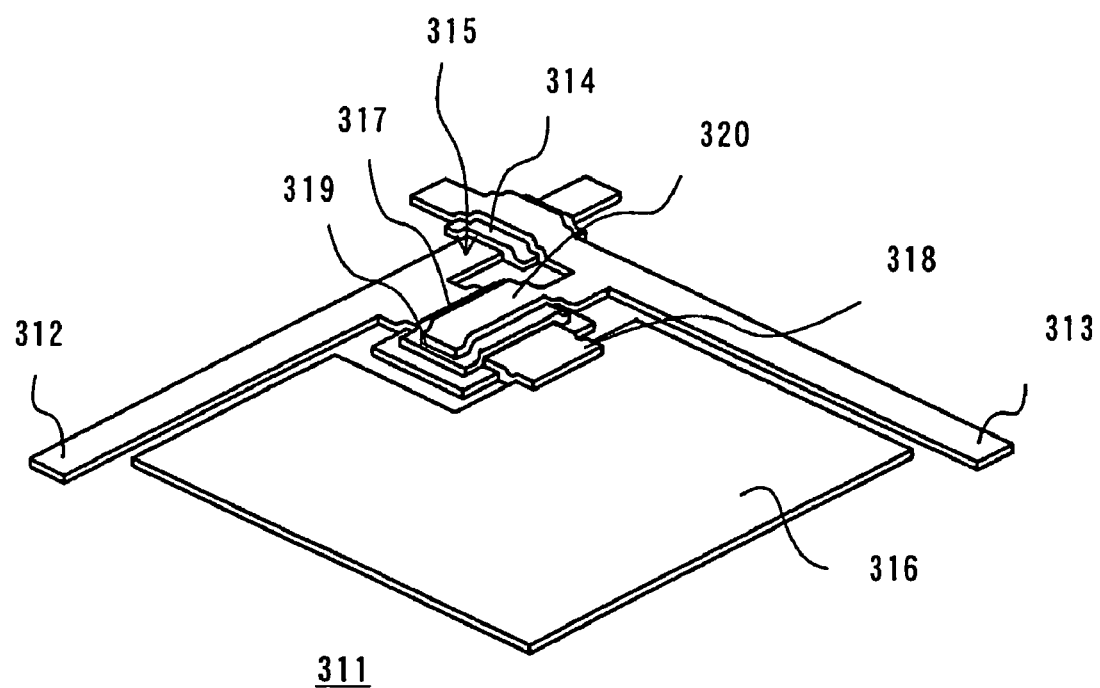
FIG. 32 is a perspective view showing a circuit structure for driving TFTs.

The transistor described in the Eleventh Embodiment can be used as a thin film transistor (TFT) used in display devices and the like. FIG. 32 is a diagram depicting a circuit structure for driving a TFT of a display device, when the TFT is a transistor using the pillar-like members that have been disposed and oriented. In the circuit structure shown in FIG. 32, a source electrode line 312 and a gate electrode line 313 are provided on a substrate 311, orthogonally intersecting with each other via a gate insulating film 314. In each region compartmentalized by the source electrode line 312 and the gate electrode line 313, a TFT 315 and a pixel electrode 316 are provided. The TFT 315 includes a source electrode 317 connected to the source electrode line 312, a drain electrode 318 connected to the pixel electrode 316, a gate insulating film 319 provided between the source electrode 317 and the drain electrode 318, and a gate electrode 320 provided on the gate insulating film 319 and connected to the gate electrode line 313. Though not shown in FIG. 32, the nanowires are provided beneath or inside the gate insulating film 319, connecting the source electrode 317 and the drain electrode 318.

When a mounting method of the present invention is used to mount the pillar-like members on the substrate, a flexible substrate may be used as the substrate. Thus, a mounting method of the present invention advantageously can be used for the fabrication of the TFT as shown in FIG. 32. The TFT shown in FIG. 32 can be used for a display panel as shown in FIG. 33.

Figure 33:
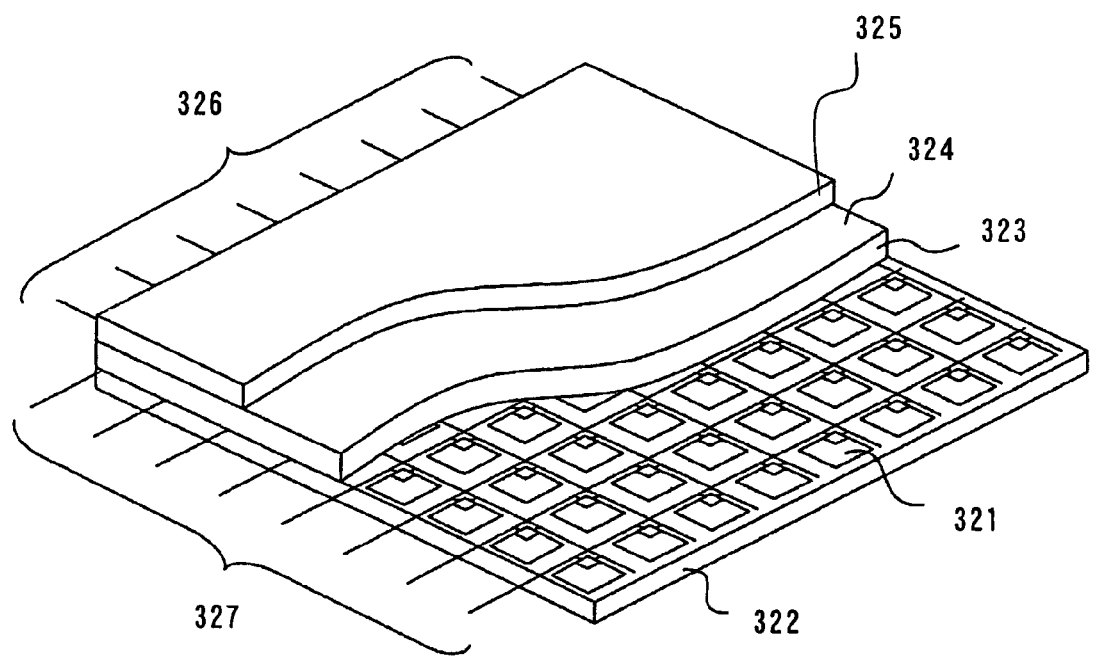
FIG. 33 is a perspective view showing a configuration of an organic EL display as one embodiment of a display device of the present invention.

FIG. 33 is a perspective view illustrating a panel configuration of an organic EL display using the TFT shown in FIG. 32. In the configuration shown in FIG. 33, there are provided a plastic substrate 322 on which TFTs 321 are disposed in a matrix, an organic EL layer 323 provided on the plastic substrate 322, a transparent electrode 324 provided on the organic EL layer 323, and a protective film 325 provided on the transparent electrode 324. The TFTs 321 are connected to gate electrode lines 326 and source electrode lines 327.

Fourteenth Embodiment

In the Fourteenth Embodiment, one embodiment of a mounting method and mounting apparatus of the present invention is described. A mounting method and mounting apparatus of the present invention suitably can be used particularly when the members mounted on the substrate are micro pillar-like members such as silicon nanowires.

FIG. 34A to FIG. 34D are schematic diagram illustrating a configuration and operations (steps of disposing the members) of the mounting apparatus. The mounting apparatus is an example of an apparatus used to dispose and orient the pillar-like members such as silicon nanowires on the substrate 251 on which the liquid-attracting first regions 2511 and the liquid-repelling second region 2512 have been formed, as described in the Ninth Embodiment for example.

Figure 34A:
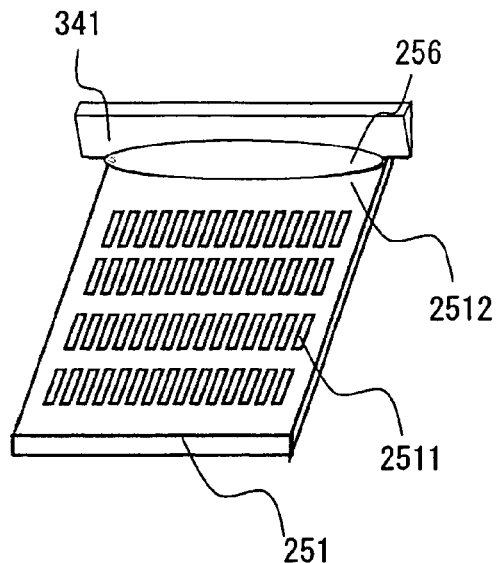
FIG. 34A to FIG. 34D are schematic diagrams showing another embodiment of a mounting method and mounting apparatus of the present invention.

As shown in FIG. 34A, the mounting apparatus includes a squeegee 341 for exposing the member-dispersed second liquid (member-containing liquid 256) to the substrate 251, and a device (not shown) for spraying a high-humid, first liquid vapor onto the surface of the substrate 251. A means for adjusting the relative positions of the squeegee 341 and the substrate 251, and a device for spraying a vapor, though not shown, may be realized by known devices. The squeegee 341 is, for example, knife-like in shape, and is disposed so that its edge portion is parallel to the substrate surface. The squeegee 341 is moved above the substrate 251 by sweeping over it with certain spacing. The squeegee 341 and the substrate 251 move relative to each other, so that the substrate 251 may be fixed and the squeegee 341 may be moved, and vice versa, or the both may be moved. The member-containing liquid 256 is disposed in front of the squeegee 341 in the path of the movement, in contact with the squeegee 341.

Figure 34B:
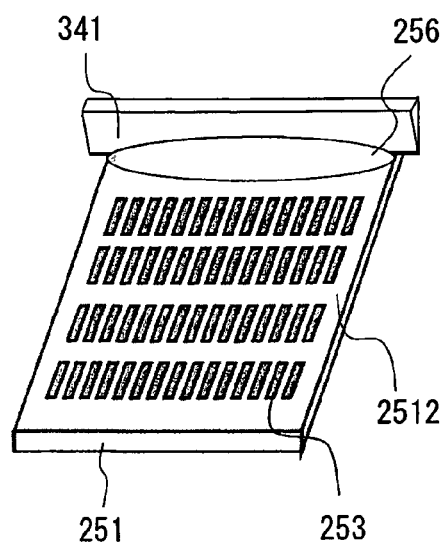
Figure 34C:
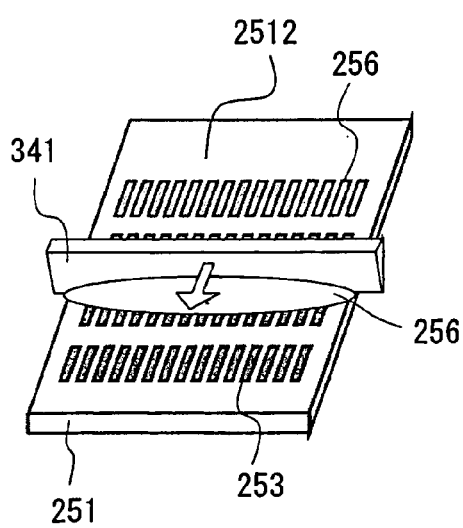
Figure 34D:
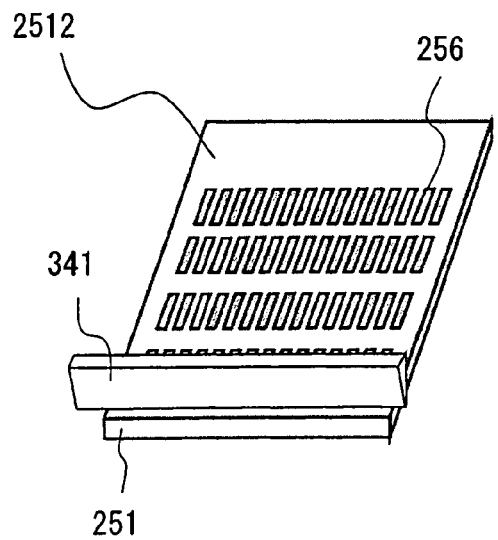

Prior to applying the member-containing liquid 256 with the squeegee 341, the substrate 251 is exposed to a high-humid vapor. Specifically, a first liquid vapor with 100% humidity may be sprayed onto the substrate 251, or the temperature of the substrate 251 may be lowered below the dew point of the vapor sprayed onto the substrate 251. As a result, as shown in FIG. 34B, the first liquid 253 is disposed in the liquid-attracting first regions 2511. Then, as shown in FIG. 34C and FIG. 34D, the squeegee 341 is moved relative to the substrate 251 so that the member-containing liquid 256 moves along with the squeegee 341, in contact with the substrate 251. As the member-containing liquid 256 contacts the substrate 251, the members move into the first liquid 253 disposed in the first regions 2511. By the movement of the squeegee 341, some of the member-containing liquid 256 is disposed in the first regions 2511. The first liquid 253 and the second liquid in the first regions 2511 evaporate and the members are disposed on the substrate 251. To dispose the members more densely, the steps of FIGS. 34A to 34D may be repeated. Note that, the arrow in the figure indicates the direction of squeegee movement.

Figure 35:
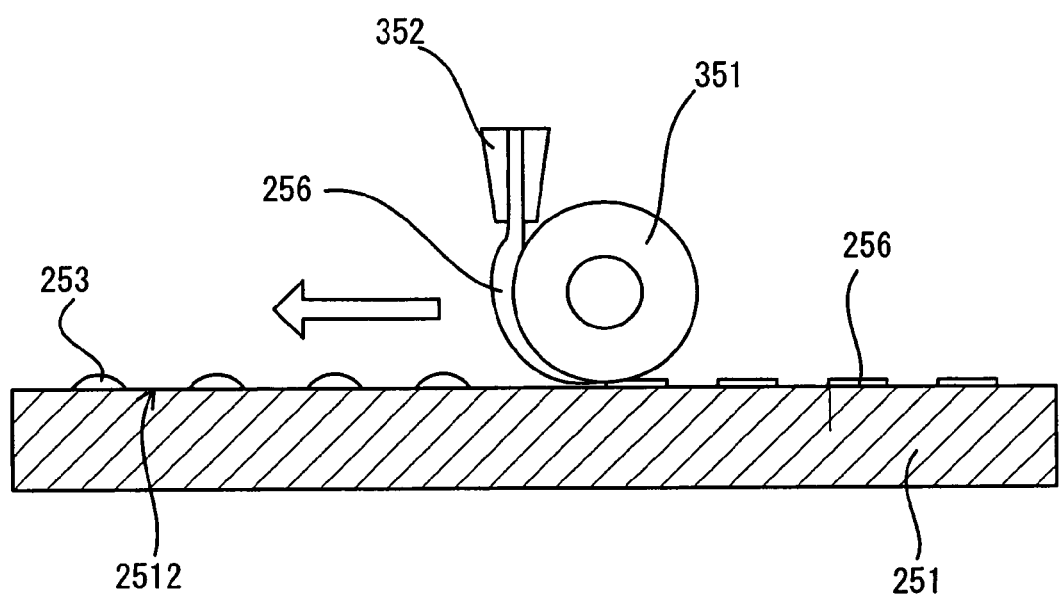
FIG. 35 is a cross sectional view schematically showing yet another embodiment of a mounting method and mounting apparatus of the present invention.

FIG. 35 is a schematic cross sectional view illustrating how the members are disposed on the substrate using another example of the mounting apparatus. This mounting apparatus differs from the apparatus shown in FIG. 34 only in the shape of the squeegee. In this mounting apparatus, the squeegee 351 has the shape of a roller (hereinafter, the squeegee 351 may be referred to as a "roller 351"). With the member-containing liquid 256 being dropped down from a dispenser 352, the substrate 251 and the roller 351 are moved relative to each other so as to expose the substrate 251 to the member-containing liquid 256. As a result, the member-containing liquid 256 is in contact with the first liquid 253 disposed in the first regions of the substrate 251. Note that, the arrow in the figure indicates the direction of squeegee movement.

When the members are pillar-like members such as silicon nanowires, the first regions are rectangular in shape, for example. In this case, in the apparatuses shown in FIGS. 34 and 35, the pillar-like members efficiently can be disposed in the first regions when the direction of squeegee movement is parallel to the longitudinal direction of the first regions. In this way, the long axis of the pillar-like members would be oriented substantially along the direction of squeegee movement, which conceivably increases the probability of the members entering the first regions.

The second liquid in the member-containing liquid 256 used in this apparatus may be the same kind of liquid usable in a mounting method of the present invention. The members can be disposed on the substrate with better reproducibility when the first liquid is water and the second liquid is a chlorinated organic solvent.

In the mounting apparatus of the present embodiment, the first liquid and the second liquid are removed by natural drying. However, the apparatus optionally may include a dryer or the like as a mechanism (liquid removing section) for removing the liquids.

Fifteenth Embodiment

In the Fifteenth Embodiment, another embodiment of a mounting method and mounting apparatus of the present invention is described.

FIG. 36A to FIG. 36C are schematic diagrams illustrating a configuration and operations (steps of disposing the members) of the mounting apparatus. The mounting apparatus shown in FIG. 36 includes an additional squeegee for disposing the first liquid in the first regions, instead of the device for spraying a high-humidity first liquid vapor onto the substrate in the mounting apparatus of the Fourteenth Embodiment. The mounting apparatus of the present embodiment is an example of an apparatus used to dispose and orient the pillar-like members such as silicon nanowires on the substrate 251 on which the liquid-attracting first regions 2511 and the liquid-repelling second region 2512 have been formed, as described in the Ninth Embodiment for example.

FIG. 36A illustrates the substrate 251 on which the liquid-attracting first region and the liquid-repelling second region have been formed. As shown in FIG. 36B and FIG. 36C, the apparatus is configured to include a first squeegee 361 and a second squeegee 362 for respectively exposing the first liquid and the second liquid containing the members dispersed therein (member-containing liquid 256) to the substrate 251. The first squeegee 361 and the second squeegee 362 are separated from each other by a predetermined distance and are moved by maintaining the predetermined distance (fixing means and moving means for the squeegees are not shown). As shown in FIG. 36B, the substrate 251 contacts the first liquid 253 by the movement of the squeegee 361, and the first liquid 253 is disposed only in the first regions. Then, as shown in FIG. 36C, the substrate 251 is exposed to the member-containing liquid 256 by the movement of the squeegee 362, during which process the members move into the first liquid 253 that was disposed in the first regions. By the movement of the second squeegee 362, some of the member-containing liquid 256 is disposed in the first regions. The first liquid 253 and the second liquid as a dispersion medium of the member-containing liquid 256 in the first regions vaporize and the members are disposed in the first regions. Note that the arrow in the figure indicates the direction of squeegee movement.

Figure 37:
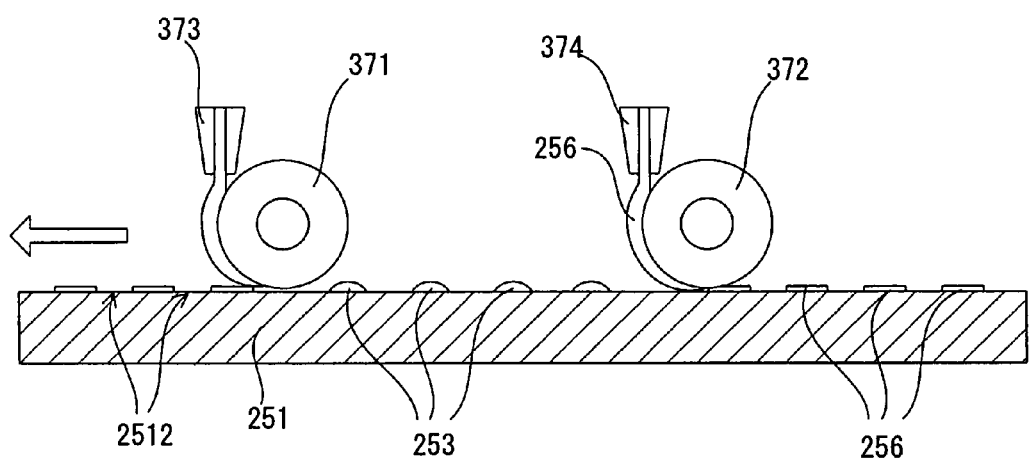
FIG. 37 is a cross sectional view schematically showing yet another embodiment of a mounting method and mounting apparatus of the present invention.

As in the Fourteenth Embodiment, the two squeegees may be, for example, rollers that expose the first liquid 253 and the member-containing liquid 256 to the substrate 251, as shown in FIG. 37. In the vicinity of rollers 371 and 372, dispensers 373 and 374 drop an appropriate amount of first liquid 253 and member-containing liquid 256, respectively, so that along with the relative movement of the substrate 251 and the rollers 371 and 372, the first liquid 253 is disposed first in the first regions and the member-containing liquid 256 is then disposed on the substrate 251. With the member-containing liquid 256 in contact with the first liquid 253, the members (not shown) move into the first liquid 253. The first liquid and the second liquid in the first regions eventually vaporize and the members are disposed in the first region. Note that, the arrow in the figure indicates the direction of squeegee movement.

The second liquid in the member-containing liquid 256 used in this apparatus may be the same kind of liquid usable in a mounting method of the present invention. The members can be disposed on the substrate with better reproducibility when the first liquid is water and the second liquid is a chlorinated organic solvent.

In the mounting apparatus of the present embodiment, the first liquid and the second liquid are removed by natural drying. However, the apparatus optionally may include a dryer or the like as a mechanism (liquid removing section) for removing the liquids.

EXAMPLES

Example 1

The following will describe a mounting method of the present invention in detail based on Examples.

In this Example, a mounting method of the present invention was used to mount silicon nanowires on a substrate. Specifically, according to the method described in the Ninth Embodiment, a pattern of hydrophilic regions surrounded by a water-repelling region was formed on a silicon substrate. The pattern of hydrophilic regions was made up of rectangular regions, each measuring 10 μm in length and 2 μm in width, which were arranged in a grid pattern over the entire substrate with an interval of 5 μm in the width direction and 200 μm in the lengthwise direction. The substrate on which the silicon nanowires were to be disposed had a size of 5 mm×10 mm. The surfaces of the silicon nanowires used as mounted members had been modified chemically by the method described in the Twelfth Embodiment. These silicon nanowires were dispersed in 1,4-dichlorobutane according to the method of the Twelfth Embodiment. The substrate surface then was exposed to a 100% water vapor, and immediately immersed in a beaker which contained 50 ml of a dispersion liquid of the silicon nanowires. In the dispersion liquid, the substrate was oscillated 50 times. The substrate was taken out of the dispersion liquid, and this cycle was repeated as required.

Separately, as a comparative example, a mounting method of the present invention was performed without the step of disposing the first liquid in the first regions. That is, the silicon nanowires were mounted on the substrate according the foregoing method of this example except that the substrate surface was not exposed to the water vapor.

These methods of the example and comparative example were evaluated by confirming the placement conditions of the silicon nanowires on the substrate. Specifically, it was confirmed whether the silicon nanowires had been 100 disposed in arbitrarily selected hydrophilic regions on the substrate.

When a method of the present invention was used, the silicon nanowires were found to be disposed in about 90 of the 100 hydrophilic regions in the first cycle, whereas, when the method of the comparative example was used, the silicon nanowires were disposed in only about 5 of the 100 hydrophilic regions in the first cycle.

When a method of the present invention was repeated 3 times, the silicon nanowires were disposed in almost all of the 100 hydrophilic regions, whereas in the method of the comparative example, the silicon nanowires were disposed in only about 10 of the hydrophilic regions even in the third cycle.

These results show that a mounting method of the present invention is far superior to the method of the comparative example in terms of the efficiency of disposing the members on the substrate.

Example 2

In Example 2, the silicon nanowires were disposed on the substrate using a squeegee as shown in FIG. 34.

Figure 38:
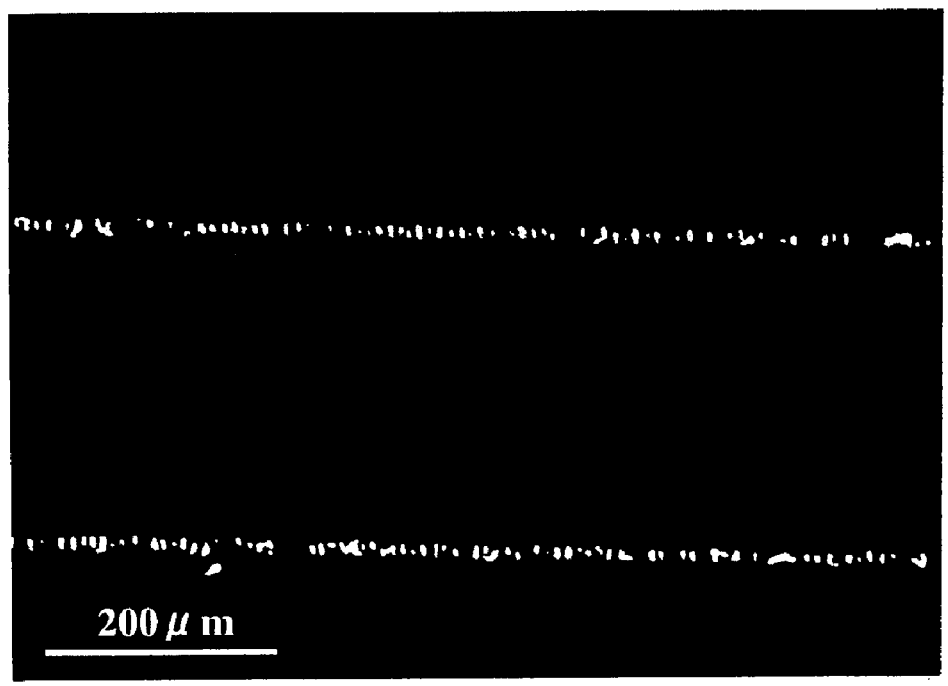
FIG. 38 shows a micrograph of nanowires that have been disposed on a substrate in Example 2 using a method of the present invention.
Figure 39:
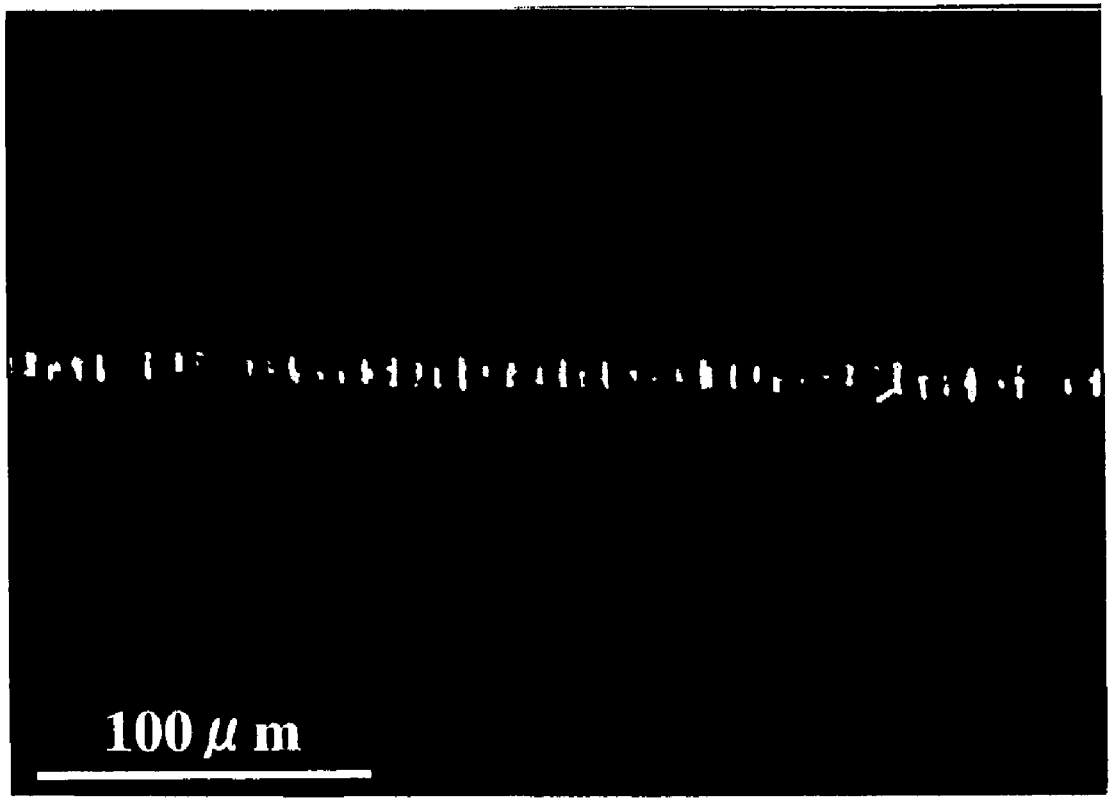
FIG. 39 shows a micrograph of nanowires that have been disposed on a substrate in Example 2 using a method of the present invention.

The substrate used to mount the silicon nanowires, and the dispersion liquid of the silicon nanowires were prepared according to the method of Example 1. The substrate had a size of 10 mm×30 mm, and was fabricated so that the longitudinal direction of the substrate coincided with the longitudinal direction of the hydrophilic regions (first regions). The squeegee was made of polyethylene and had a shape of a knife. The squeegee was disposed so that it was able to move above the substrate with a clearance of about 1 mm relative to the edge face of the squeegee situated parallel to the width direction of the substrate. Then, the dispersion liquid of silicon nanowires was disposed in an amount of about 0.3 ml in the path of the squeegee, and the squeegee was moved immediately after the whole substrate had been exposed to a high-humid water vapor. This was repeated 10 times. FIGS. 38 and 39 are micrographs taken after this procedure. The portions seen in white are silicon nanowires disposed in the hydrophilic regions, and the background black portion is the water-repelling region (second region). It can be seen that the silicon nanowires were disposed on the substrate in a particular orientation. The result therefore showed that a method of the present invention indeed can be used to dispose the silicon nanowires on the substrate in a particular orientation.

INDUSTRIAL APPLICABILITY

A method and apparatus for mounting an electronic circuit-constituting member according to the present invention can be used to mount component chips including electronic devices as the constituting members. Micro pillar-like members also can be mounted. The method and apparatus are applicable to fabrication methods of electronic instruments and electronic devices. For example, the method and apparatus can be used for the fabrication methods of a circuit substrate and an electronic instrument including the circuit substrate, and repair methods of a circuit substrate and an electronic instrument including the circuit substrate. When the mounted members are pillar-like nanomembers, the method and apparatus can be used for the fabrication of electronic devices such as transistors. When metal is used for the pillar-like members, the method and apparatus are applicable to the fabrication of all-purpose electric wirings.

The invention claimed is:

1. A method for mounting electronic circuit-constituting members on a substrate, comprising the steps of:
   (A) disposing a first liquid in a first region provided on one principal surface of the substrate;
   (B) bringing a member-containing liquid including a second liquid and at least one of the electronic circuit-constituting members into contact with the first liquid disposed in the first region; and
   (C) removing the first liquid and the second liquid from the one principal surface so as to dispose the at least one of the electronic circuit-constituting members in the first region,
   wherein the first liquid is substantially undissolvable in the second liquid, and has better wettability than the second liquid with respect to surfaces of the electronic circuit-constituting members,
   the first liquid is water, and the second liquid is a liquid containing no water, and
   the second liquid is a chlorinated solvent.

2. A method for mounting electronic circuit-constituting members on a substrate, comprising the steps of:
   (A) disposing a first liquid in a first region provided on one principal surface of the substrate;
   (B) bringing a member-containing liquid including a second liquid and at least one of the electronic circuit-constituting members into contact with the first liquid disposed in the first region; and
   (C) removing the first liquid and the second liquid from the one principal surface so as to dispose the at least one of the electronic circuit-constituting members in the first region,
   wherein the first liquid is substantially undissolvable in the second liquid, and has better wettability than the second liquid with respect to surfaces of the electronic circuit-constituting members, and
   the first liquid includes an organic solvent containing a hydrocarbon chain, and the second liquid includes an organic solvent containing a fluorocarbon chain.

3. The method according to claim 1, wherein a length of the longest side of the electronic circuit-constituting members is no more than 100 µm.

4. The method according to claim 2, wherein a length of the longest side of the electronic circuit-constituting members is no more than 100 µm.

* * * * *

UNITED STATES PATENT AND TRADEMARK OFFICE
CERTIFICATE OF CORRECTION

PATENT NO. : 7,730,610 B2                                Page 1 of 1
APPLICATION NO. : 12/088194
DATED : June 8, 2010
INVENTOR(S) : Nakagawa et al.

It is certified that error appears in the above-identified patent and that said Letters Patent is hereby corrected as shown below:

On the Title page

(87) PCT Publication Date is incorrect should read --April 05, 2007--.

Signed and Sealed this

Twenty-first Day of December, 2010

David J. Kappos
*Director of the United States Patent and Trademark Office*